(12) United States Patent
Sharangpani et al.

(10) Patent No.: US 9,806,089 B2
(45) Date of Patent: *Oct. 31, 2017

(54) METHOD OF MAKING SELF-ASSEMBLING FLOATING GATE ELECTRODES FOR A THREE-DIMENSIONAL MEMORY DEVICE

(71) Applicant: SANDISK TECHNOLOGIES LLC, Plano, TX (US)

(72) Inventors: Rahul Sharangpani, Fremont, CA (US); Somesh Peri, San Jose, CA (US); Raghuveer S. Makala, Campbell, CA (US); Yanli Zhang, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/056,465

(22) Filed: Feb. 29, 2016

(65) Prior Publication Data
US 2017/0084623 A1 Mar. 23, 2017

Related U.S. Application Data

(63) Continuation-in-part of application No. 14/859,710, filed on Sep. 21, 2015, now Pat. No. 9,576,966.

(51) Int. Cl.
*H01L 27/115* (2017.01)
*H01L 27/11556* (2017.01)
(Continued)

(52) U.S. Cl.
CPC ...... *H01L 27/11556* (2013.01); *H01L 21/283* (2013.01); *H01L 21/28273* (2013.01);
(Continued)

(58) Field of Classification Search
CPC .......... H01L 27/11556; H01L 27/0207; H01L 27/115
See application file for complete search history.

(56) References Cited

U.S. PATENT DOCUMENTS 5,084,417 A   1/1992   Joshi et al.
5,583,360 A   12/1996  Roth et al.
(Continued)

FOREIGN PATENT DOCUMENTS

WO   WO02/15277 A2   2/2002

OTHER PUBLICATIONS

The International Searching Report and Written Opinion of the International Searching Authority for International Patent Application No. PCT/US2016/036578, dated Nov. 21, 2016, 18 pages.
(Continued)

*Primary Examiner* — Matthew Reames
(74) *Attorney, Agent, or Firm* — The Marbury Law Group PLLC

(57) ABSTRACT

Metal floating gate electrodes can be formed for a three-dimensional memory device by forming a memory opening having lateral recesses at levels of spacer material layers between insulating layers, depositing a continuous metal layer, and inducing diffusion and agglomeration of the metal into the lateral recesses to form discrete metal portions employing an anneal process. The metallic material can migrate and form the discrete metal portions due to surface tension, which operates to minimize the surface area of the metallic material. Optionally, two or more continuous metal layers can be employed to form discrete metal portions including at least two metals. Optionally, a selective metal deposition process can be performed to deposit additional metal portions including a different metallic material on the discrete metal portions. The metal floating gate electrodes can be formed without employing an etch process. A tunneling dielectric layer and a semiconductor channel can be subsequently formed.

14 Claims, 43 Drawing Sheets

(51) Int. Cl.
  *H01L 29/423* (2006.01)
  *H01L 21/28* (2006.01)
  *H01L 21/283* (2006.01)
  *H01L 27/02* (2006.01)
  *H01L 27/1157* (2017.01)
  *H01L 27/11582* (2017.01)
(52) U.S. Cl.
  CPC ........ *H01L 27/0207* (2013.01); *H01L 27/115* (2013.01); *H01L 27/1157* (2013.01); *H01L 27/11582* (2013.01); *H01L 29/42328* (2013.01)

(56) References Cited

U.S. PATENT DOCUMENTS

| | | | |
|---|---|---|---|
| 5,807,788 | A | 9/1998 | Brodsky et al. |
| 5,897,354 | A | 4/1999 | Kachelmeier |
| 5,915,167 | A | 6/1999 | Leedy |
| 6,238,978 | B1 | 5/2001 | Huster |
| 6,759,343 | B2 | 7/2004 | Lee et al. |
| 6,953,697 | B1 | 10/2005 | Castle et al. |
| 7,005,350 | B2 | 2/2006 | Walker et al. |
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,691,442 | B2 | 4/2010 | Gandikota et al. |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi et al. |
| 8,008,722 | B2 | 8/2011 | Kim et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,237,213 | B2 | 8/2012 | Liu |
| 8,283,228 | B2 | 10/2012 | Alsmeier |
| 8,349,681 | B2 | 1/2013 | Alsmeier et al. |
| 8,445,347 | B2 | 5/2013 | Alsmeier |
| 8,461,000 | B2 | 6/2013 | Alsmeier et al. |
| 8,569,827 | B2 * | 10/2013 | Lee ............... H01L 27/11582 257/315 |
| 8,580,639 | B2 | 11/2013 | Alsmeier et al. |
| 8,765,543 | B2 | 7/2014 | Alsmeier et al. |
| 8,829,591 | B2 | 9/2014 | Alsmeier |
| 8,847,302 | B2 | 9/2014 | Alsmeier et al. |
| 8,928,061 | B2 | 1/2015 | Chien et al. |
| 8,946,810 | B2 | 2/2015 | Alsmeier |
| 2007/0210338 | A1 | 9/2007 | Orlowski |
| 2007/0252201 | A1 | 11/2007 | Kito et al. |
| 2008/0173928 | A1 | 7/2008 | Arai et al. |
| 2009/0283819 | A1 | 11/2009 | Ishikawa et al. |
| 2009/0294828 | A1 | 12/2009 | Ozawa et al. |
| 2010/0044778 | A1 | 2/2010 | Seol et al. |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho et al. |
| 2010/0181610 | A1 | 7/2010 | Kim et al. |
| 2010/0207195 | A1 | 8/2010 | Fukuzumi et al. |
| 2010/0213527 | A1 | 8/2010 | Shim et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0147824 | A1 | 6/2011 | Son et al. |
| 2011/0266606 | A1 | 11/2011 | Park et al. |
| 2012/0001247 | A1 | 1/2012 | Alsmeier et al. |
| 2012/0012921 | A1 | 1/2012 | Liu |
| 2012/0184078 | A1 | 7/2012 | Kiyotoshi |
| 2012/0217564 | A1 | 8/2012 | Tang et al. |
| 2013/0009235 | A1 | 1/2013 | Yoo |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |
| 2014/0225181 | A1 | 8/2014 | Makala et al. |
| 2014/0353738 | A1 | 12/2014 | Makala et al. |
| 2014/0361360 | A1 | 12/2014 | Alsmeier et al. |
| 2015/0072488 | A1 | 3/2015 | Chien et al. |
| 2015/0171099 | A1 | 6/2015 | Alsmeier |
| 2015/0179662 | A1 | 6/2015 | Makala et al. |
| 2015/0249093 | A1 | 9/2015 | Lee et al. |

OTHER PUBLICATIONS

U.S. Non Final Office Action for a corresponding U.S. Appl. No. 14/859,710, dated Jul. 1, 2016, 15 pages.
Tanaka et al., "Bit-Cost Scalable Technology for Low-Cost and Ultrahigh-Density Flash Memory," Toshiba Review, vol. 63, No. 2, 2008, pp. 28-31.
Kimura, "3D Cells Make Terabit Nand Flash Possible," Nikkei Electronics Asia, Sep. 17, 2009, 6pgs.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.ip/english/NEWS_EN/20090619/171977/ Nikkei Microdevices, Tech-On, Jun. 19, 2009.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.
International Search Report & Written Opinion, PCT/US2011/042566, dated Jan. 17, 2012.
Invitation to Pay Additional Fees and Partial International Search Report, PCT/US2011/042566, dated Sep. 28, 2011.
Endoh et al., "Novel Ultra High Density Memory with a Stacked-Surrounding Gate Transistor (S-SGT) Structured Cell," IEDM Proc., (2001), 33-36.
Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-shaped BiCS Flash Memory," 2009 Symposium on VLSI Technology Digest of Technical Papers, pp. 22-23.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Au et al., "Filling Narrow Trenches by Iodine-Catalyzed CVD of Copper and Manganese on Manganese Nitride Barrier/Adhesion Layers," Journal of the Electrochemical Society, 158(5) (2011).
Kim et al., "Direct Copper Electroless Deposition on a Tungsten Barrier Layer for Ultralarge Scale Integration," Journal of the Electrochemical Society, vol. 152, Issue 2, 2005.
European Patent Office Communication Article 94(3), EP Application No. 11745848.9, dated May 12, 2015.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/264,262, filed Apr. 29, 2014, SanDisk Technologies Inc.
U.S. Appl. No. 14/264,312, filed Apr. 29, 2014, SanDisk Technologies Inc.
U.S. Appl. No. 14/264,407, filed Apr. 29, 2014, SanDisk Technologies Inc.

(56) References Cited

OTHER PUBLICATIONS

U.S. Appl. No. 14/282,567, filed May 20, 2014, SanDisk Technologies Inc.
U.S. Appl. No. 14/520,084, filed Oct. 21, 2014, SanDisk Technologies Inc.
U.S. Appl. No. 14/687,403, filed Apr. 15, 2015, SanDisk Technologies Inc.
U.S. Appl. No. 14/734,254, filed Jun. 9, 2015, SanDisk Technologies Inc.
U.S. Appl. No. 14/859,710, filed Sep. 21, 2015, SanDisk Technologies Inc.
The International Searching Authority, Invitation to Pay Additional Fees for International Application No. PCT/US2016/036578, dated Sep. 22, 2016, 9 pages.

* cited by examiner

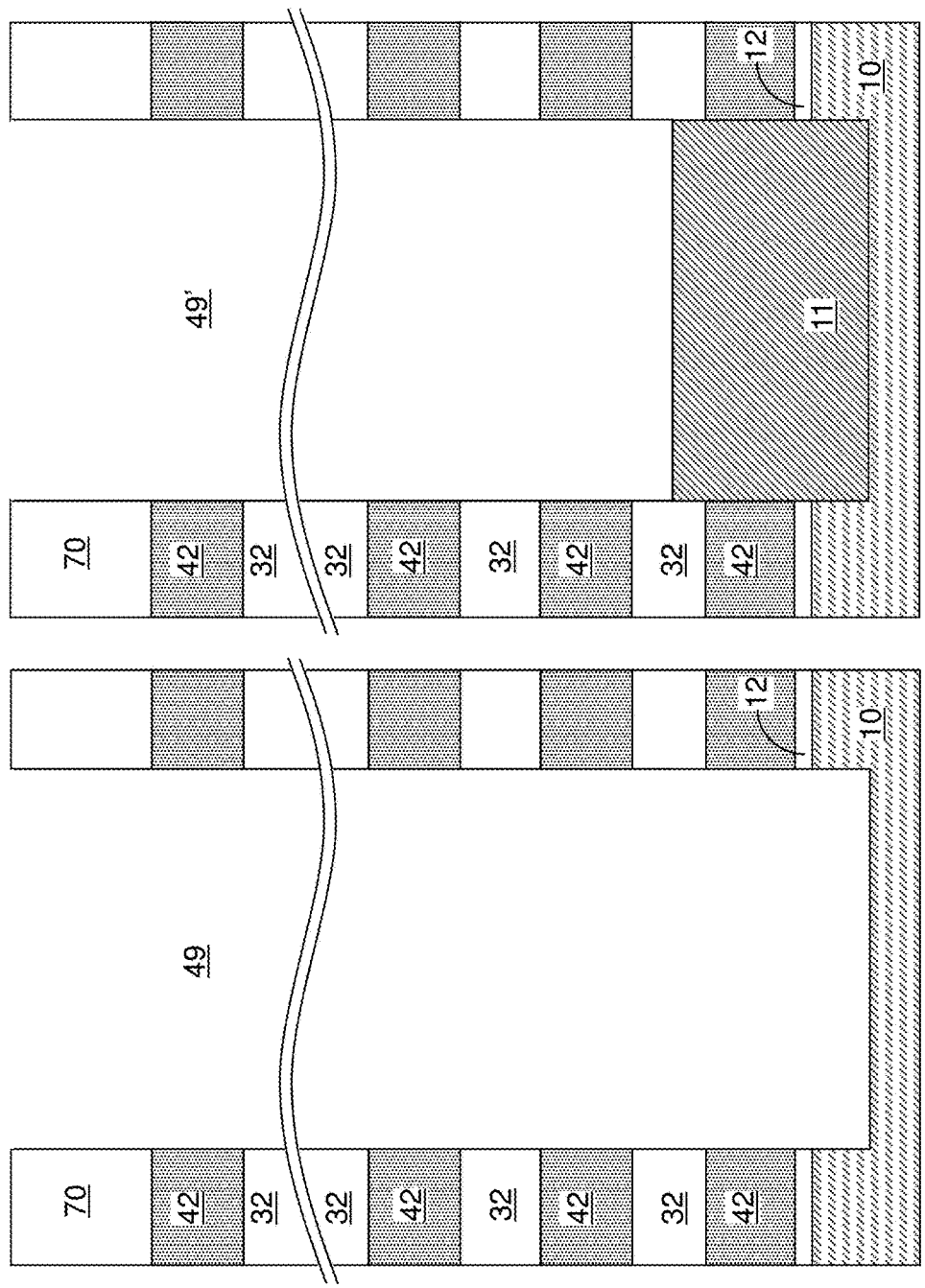

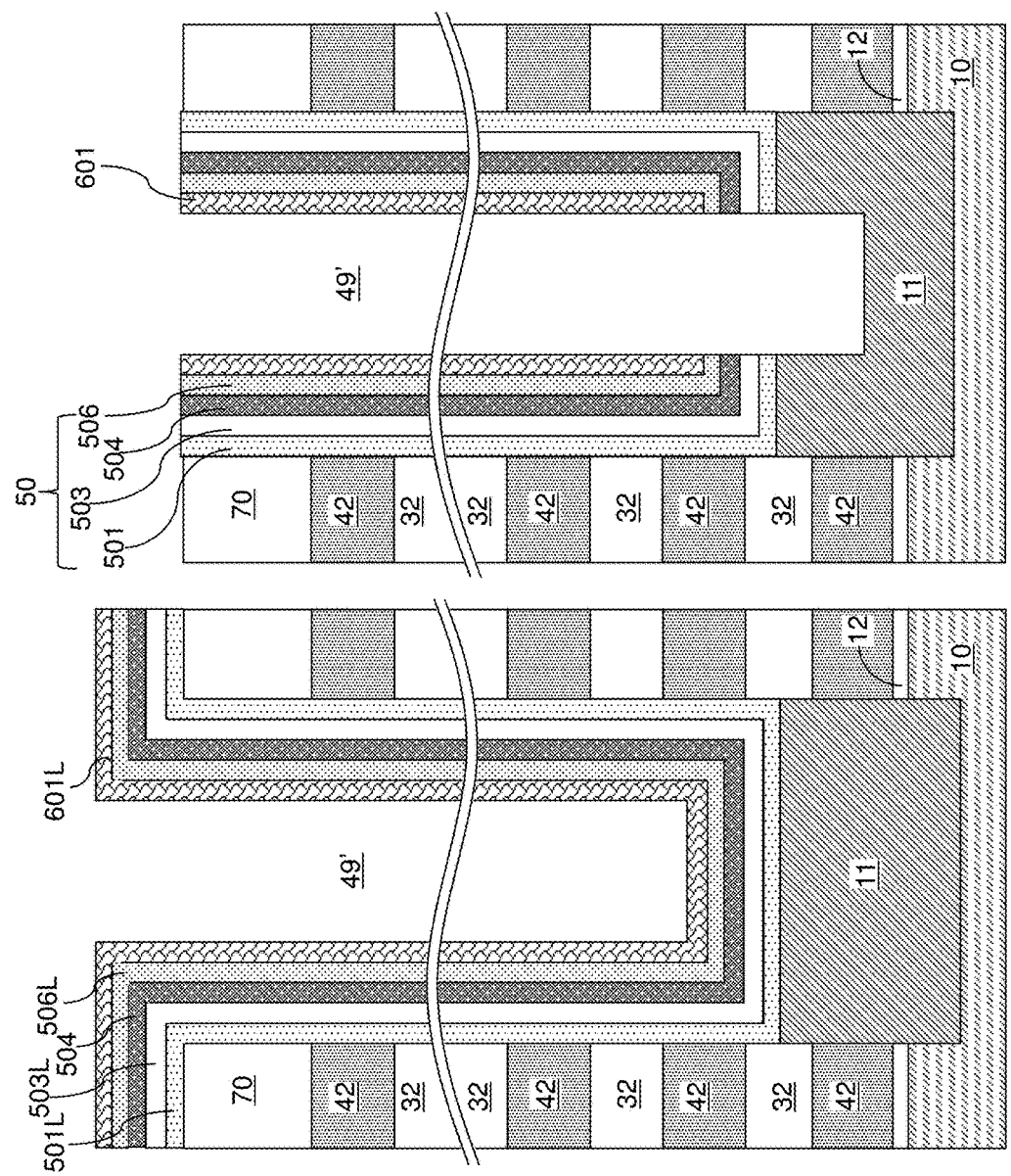

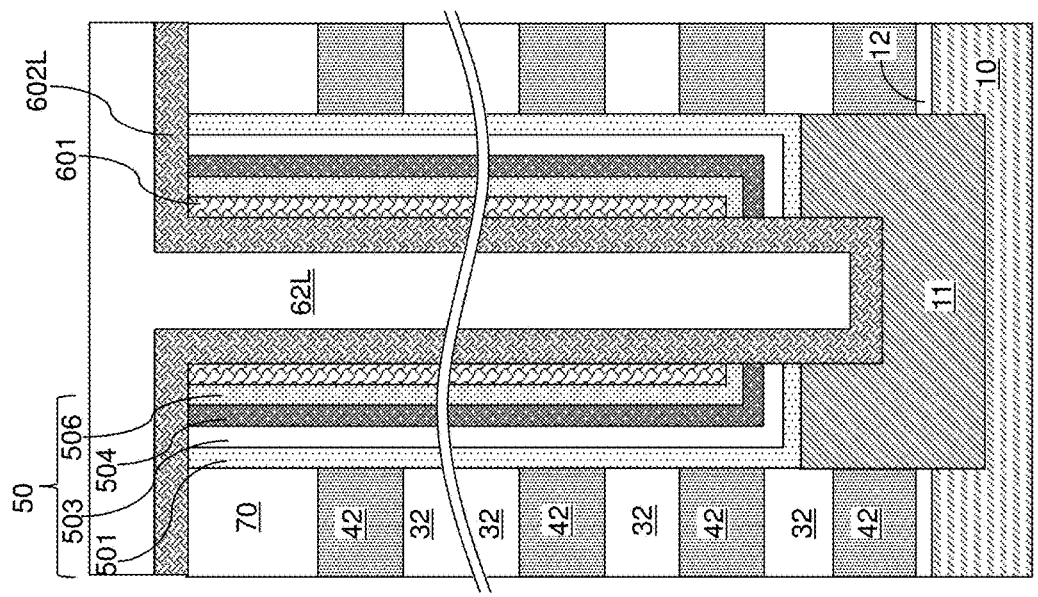
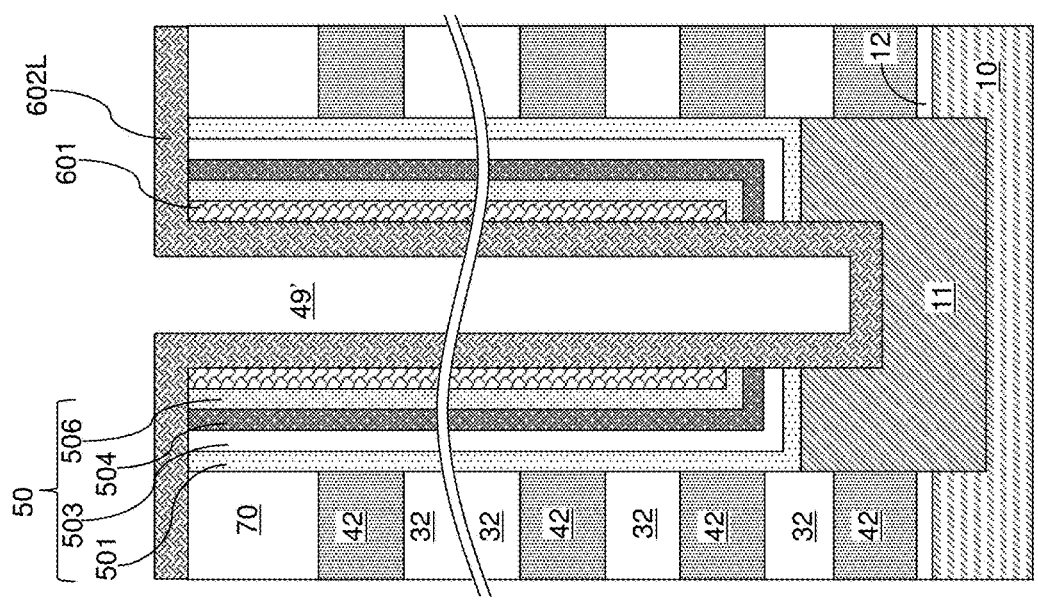
FIG. 2F
FIG. 2E

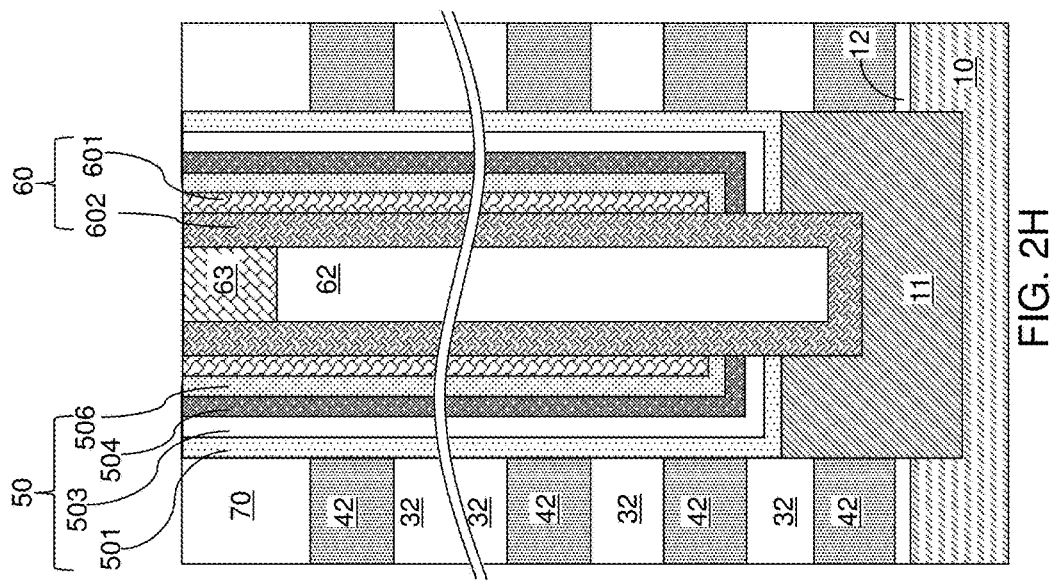
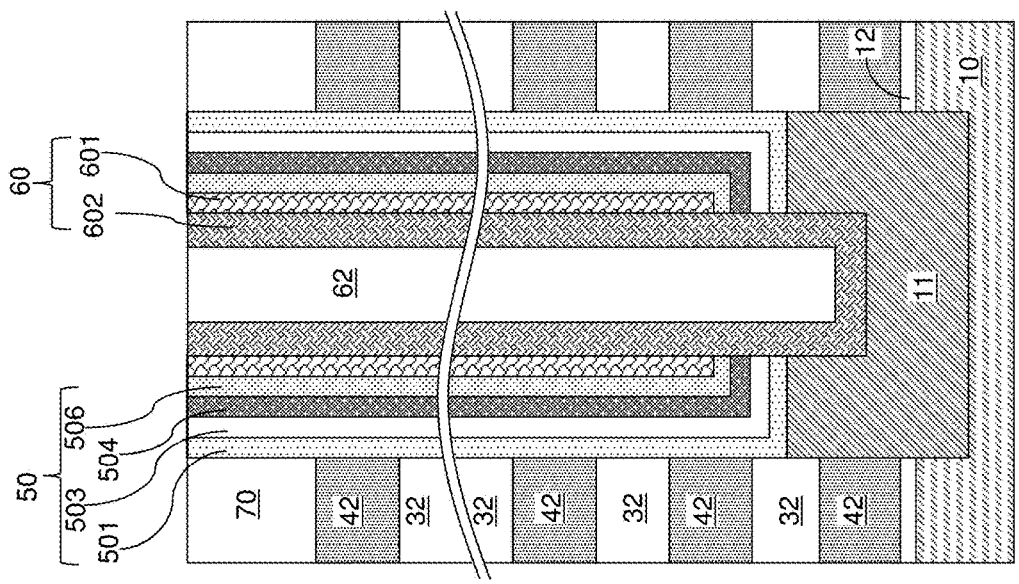

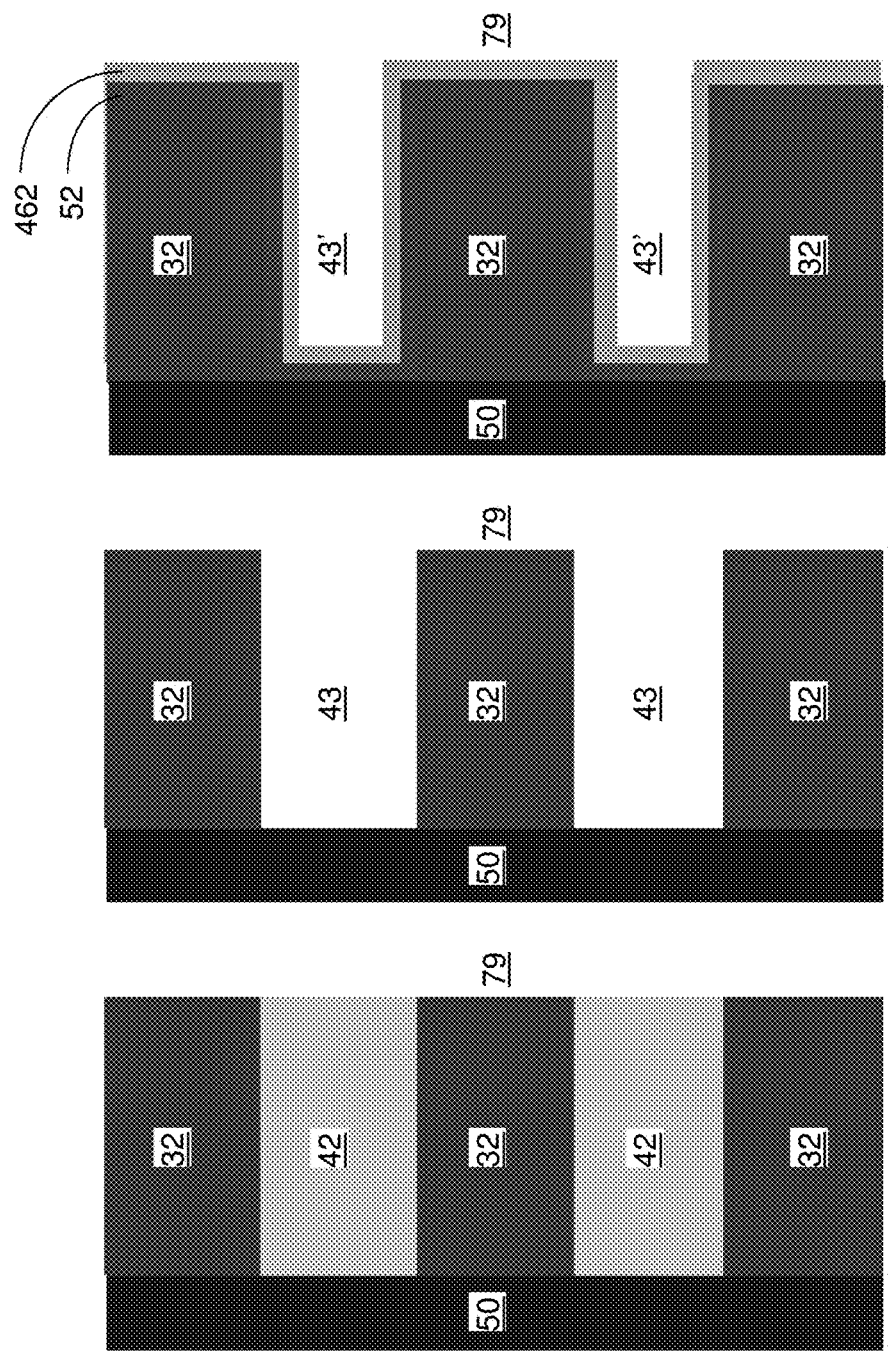

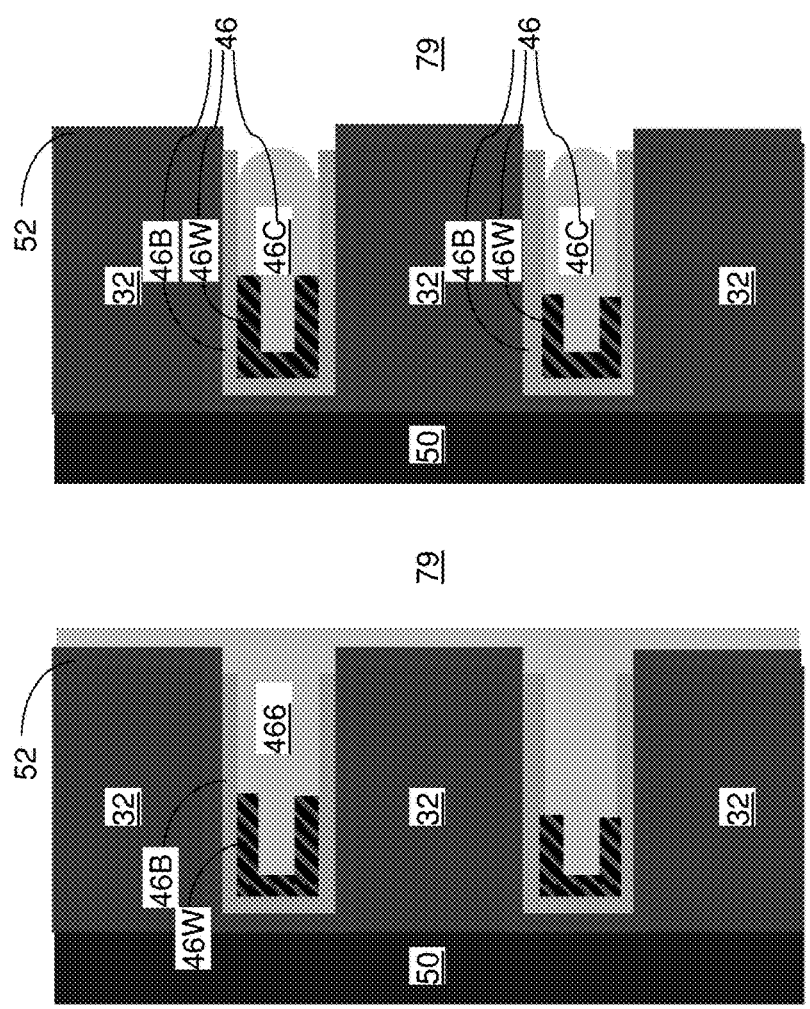

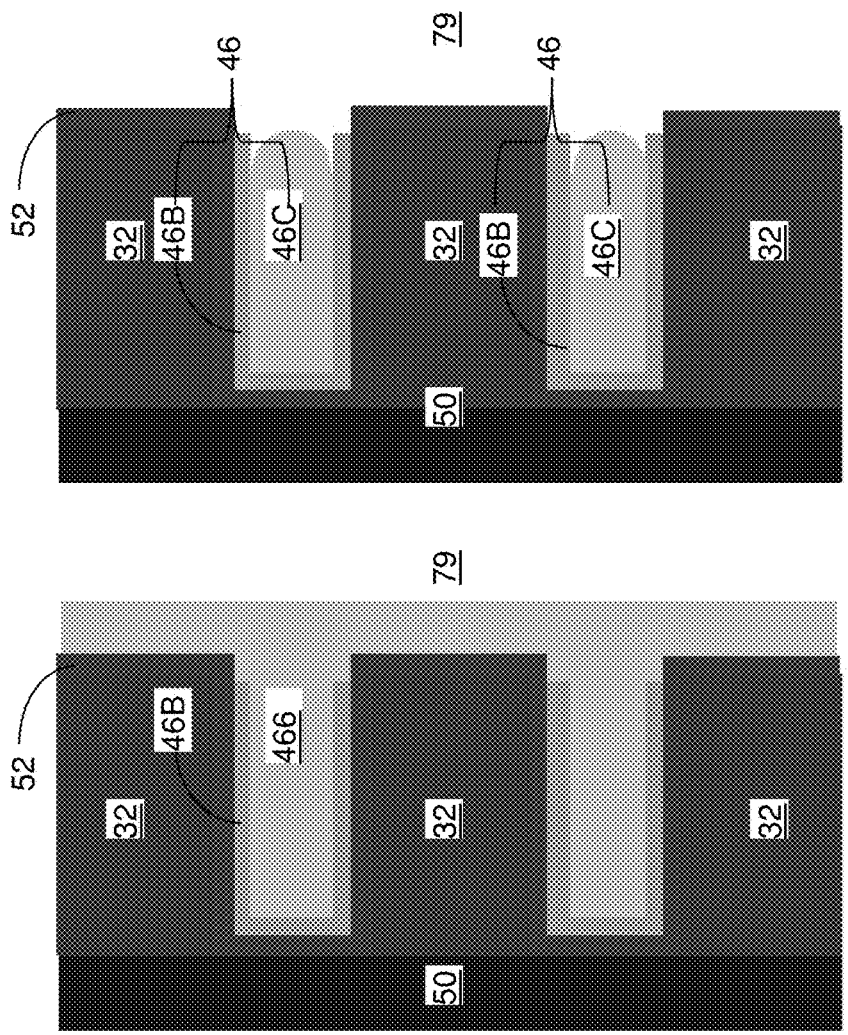

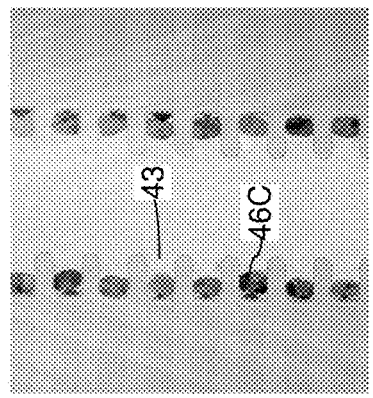
FIG. 14D
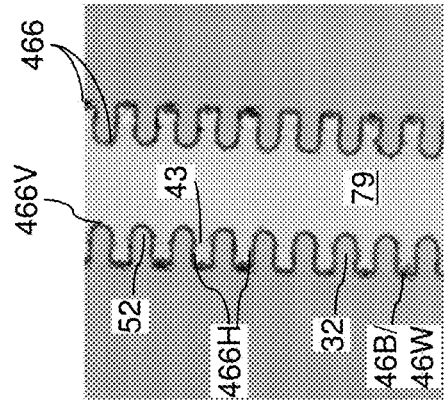
FIG. 14C
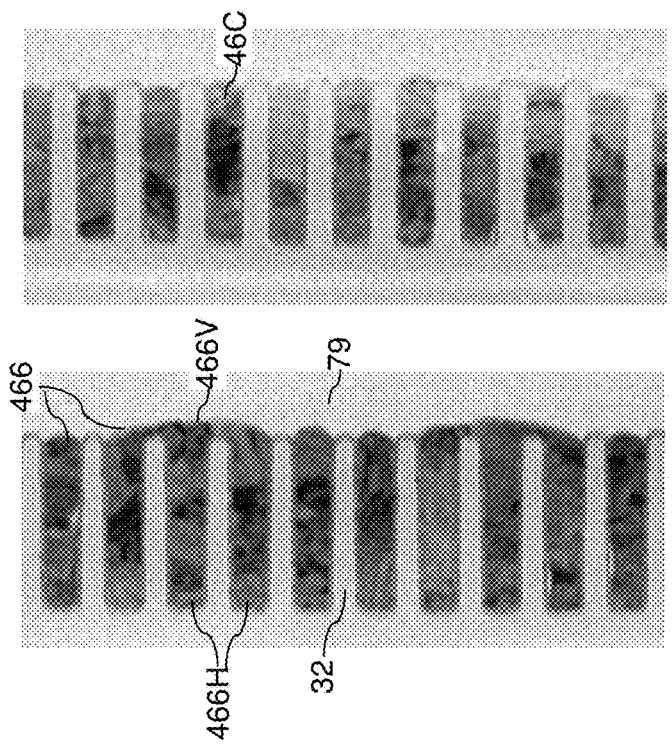
FIG. 14B
FIG. 14A

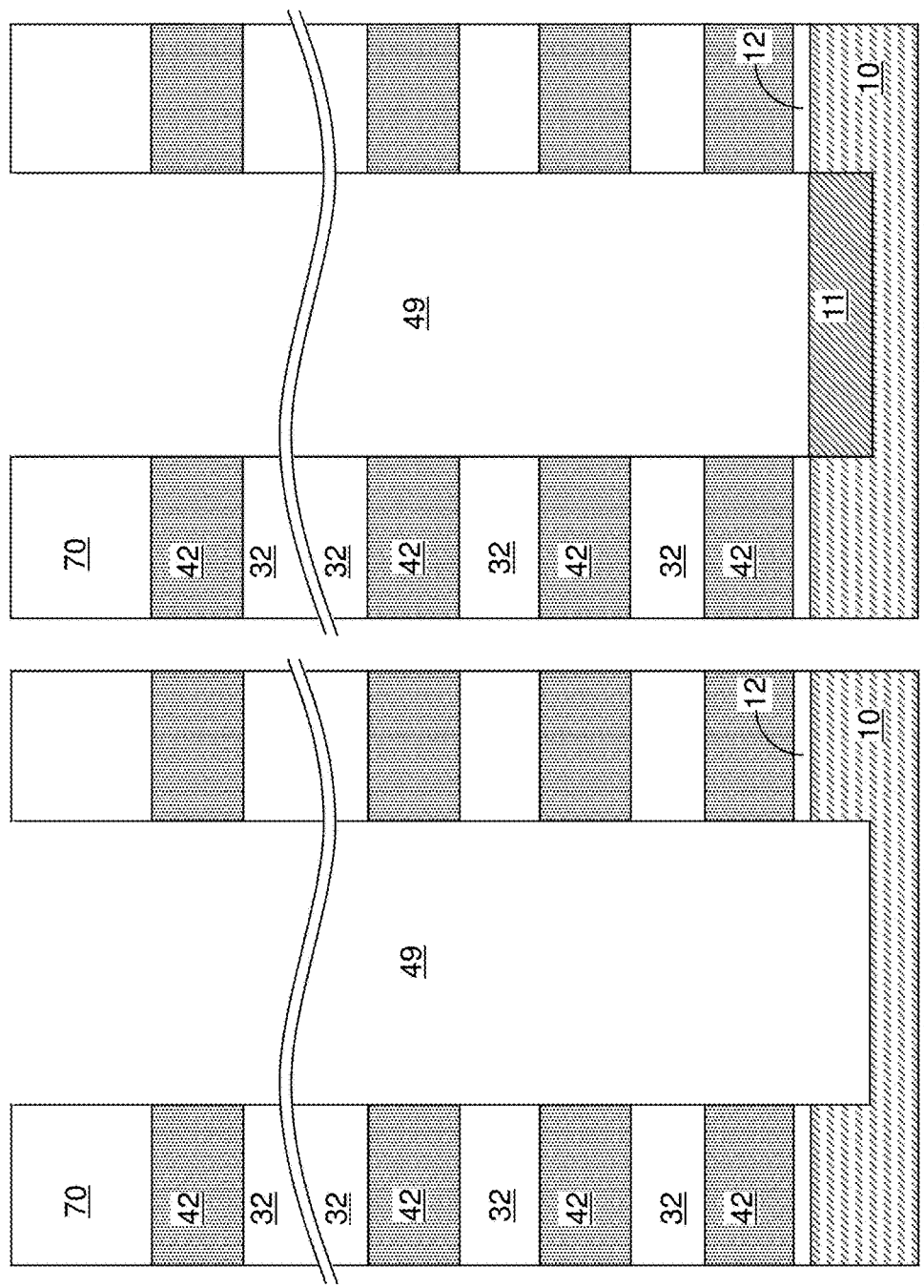

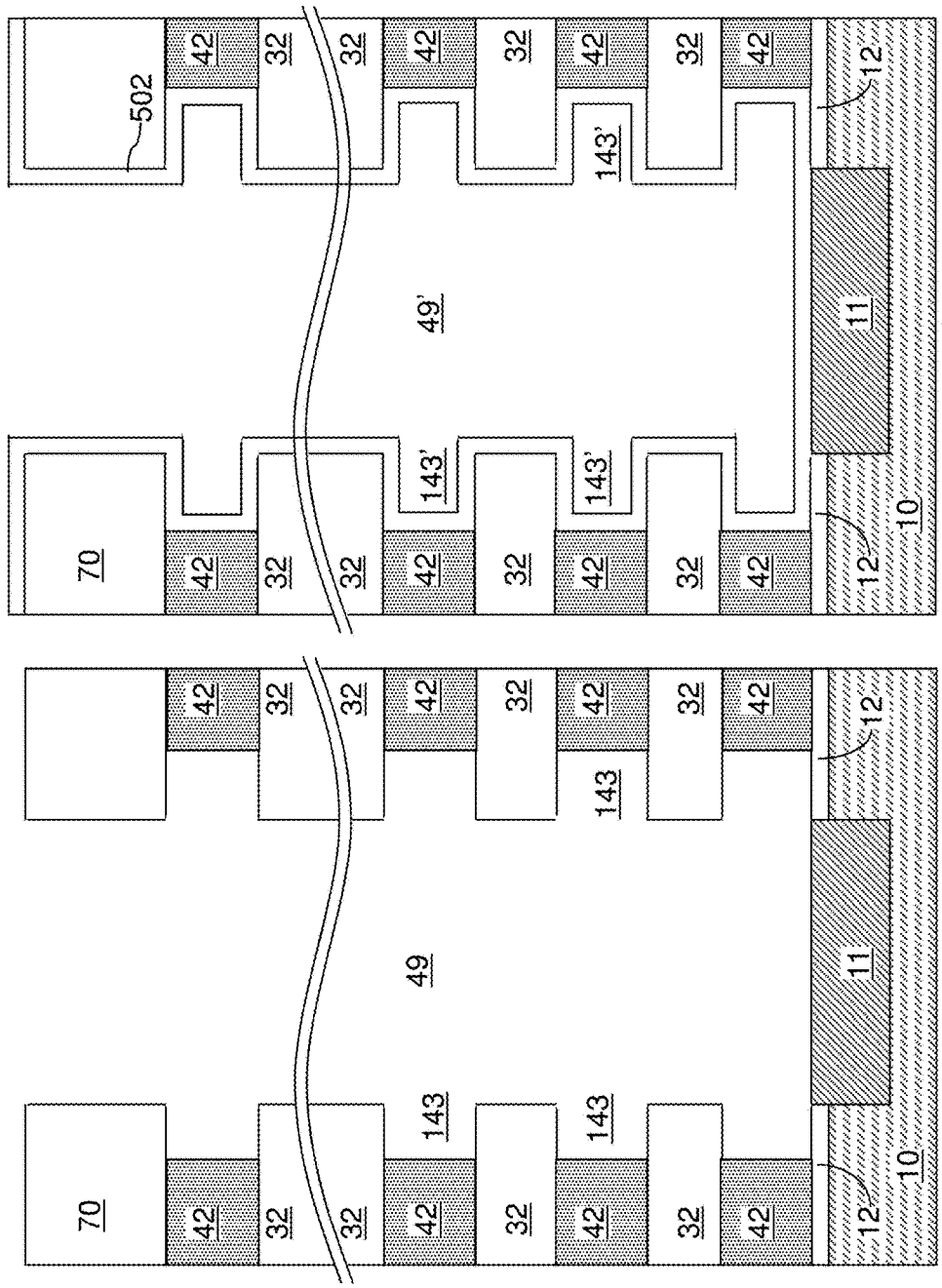

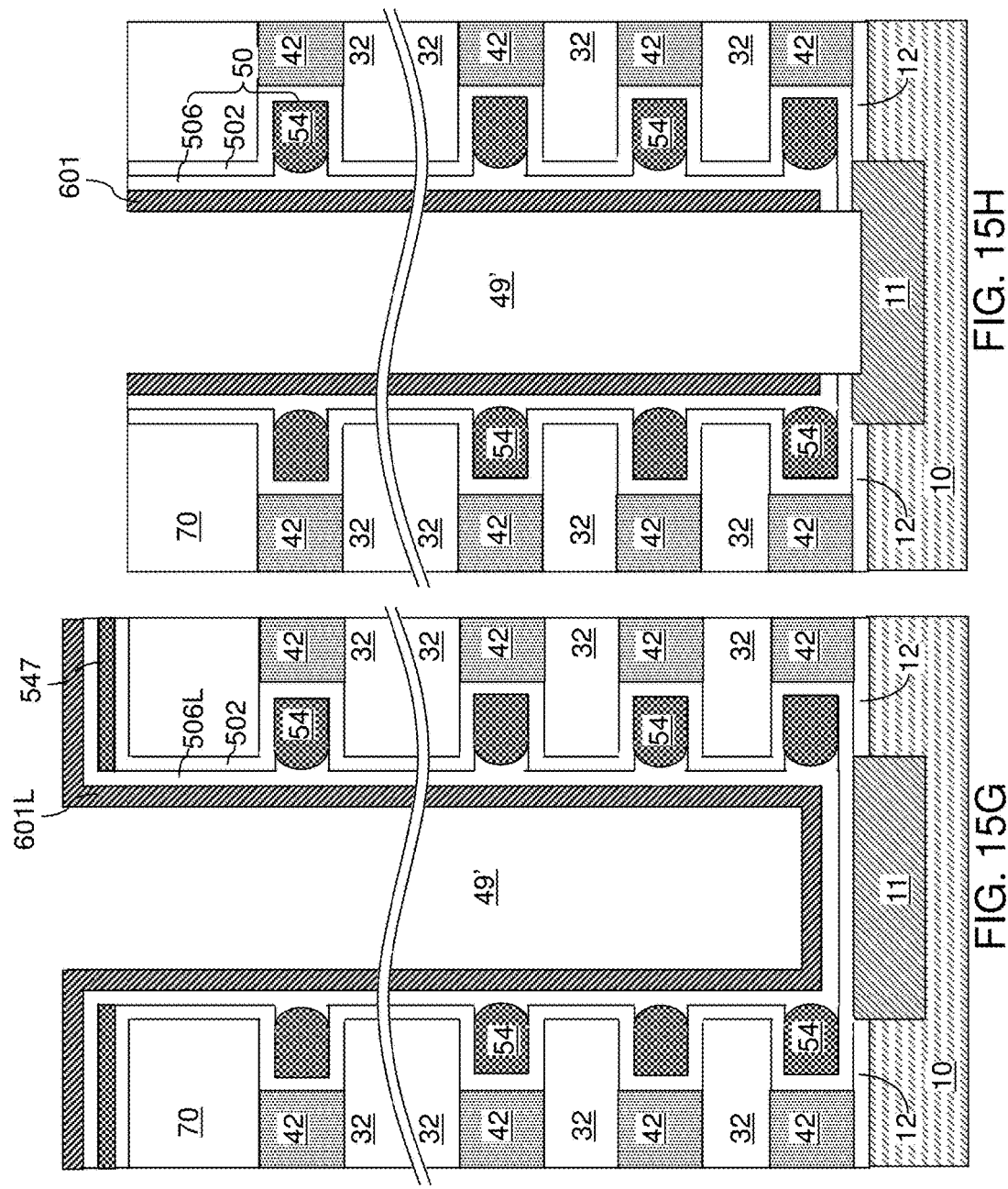

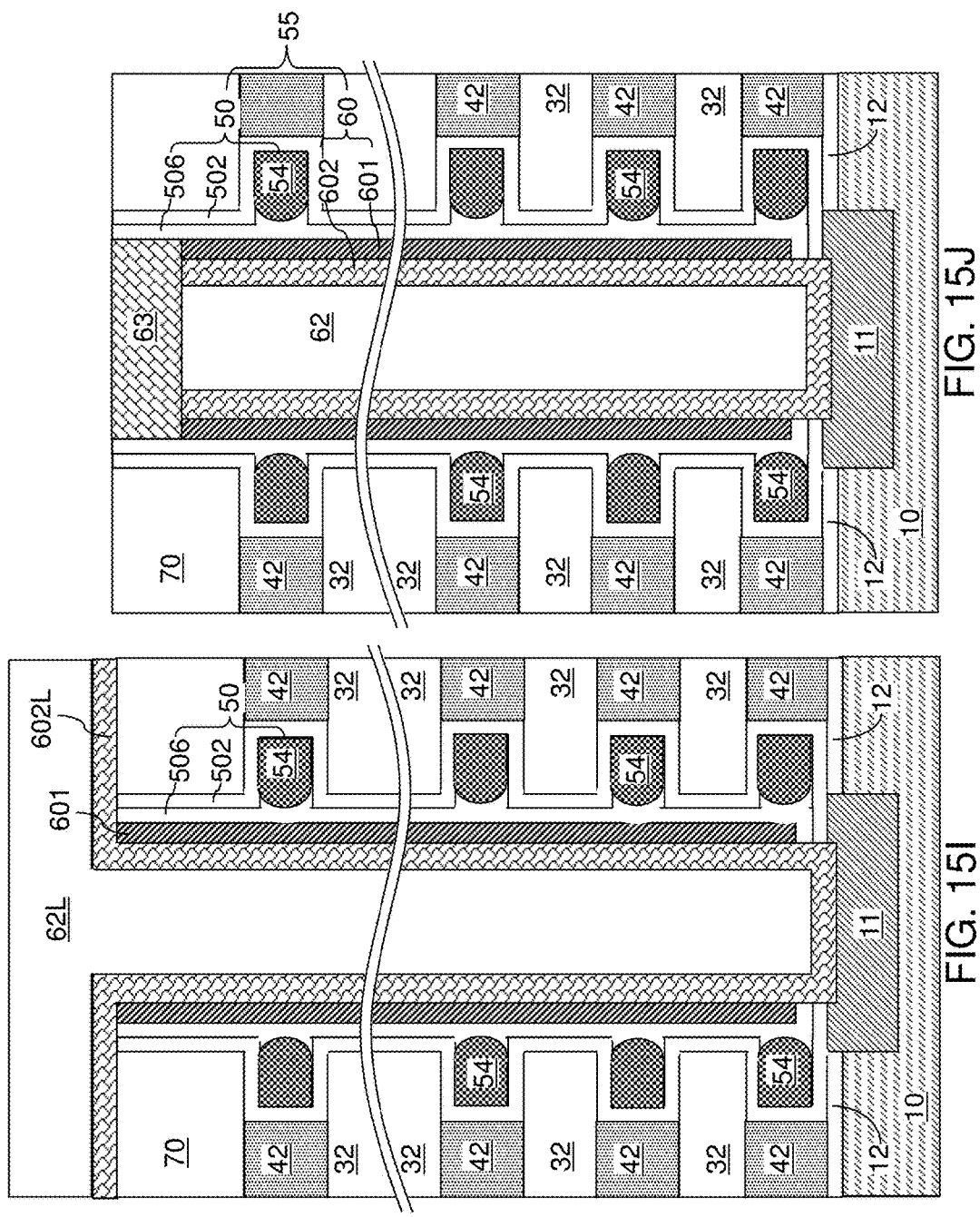

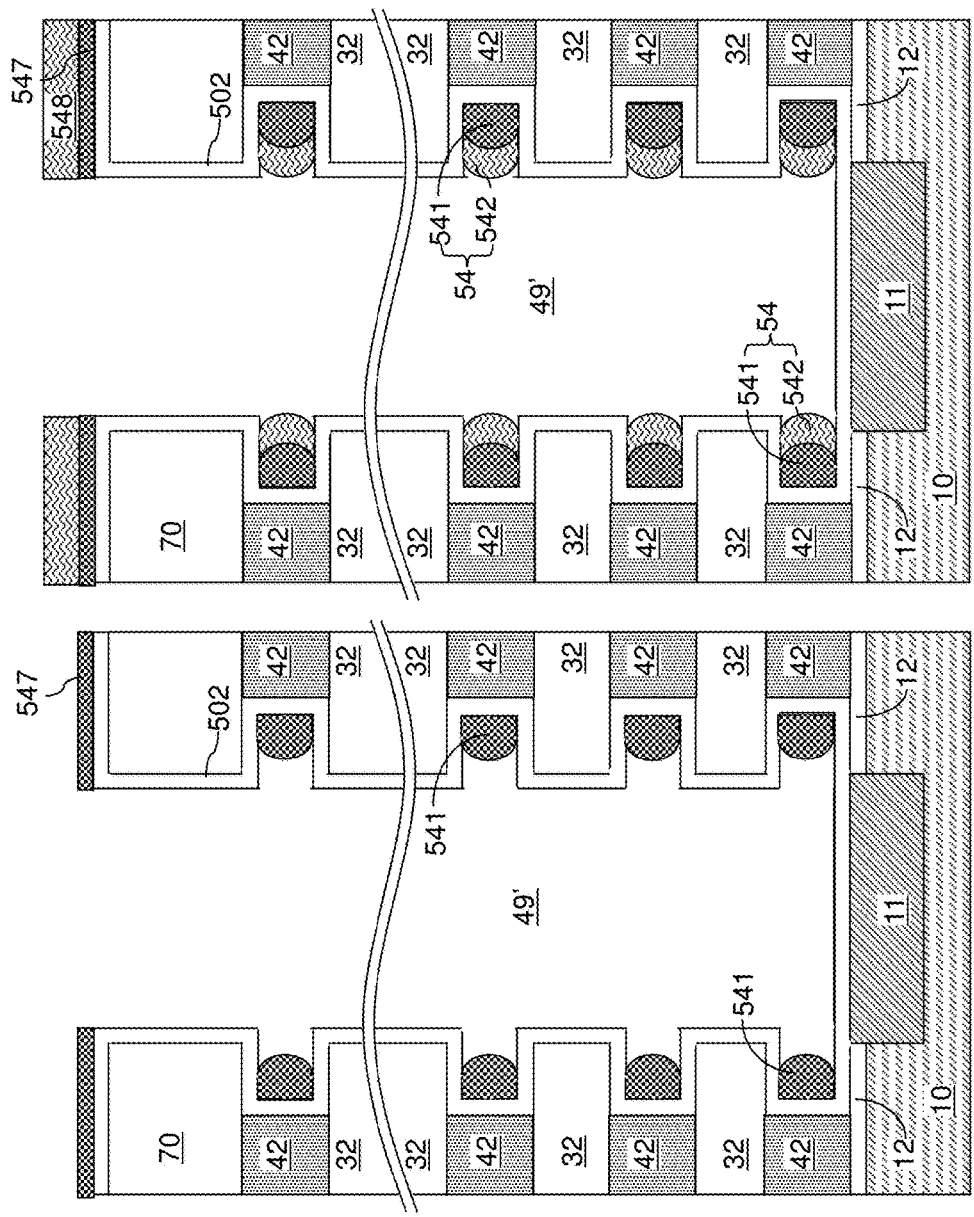

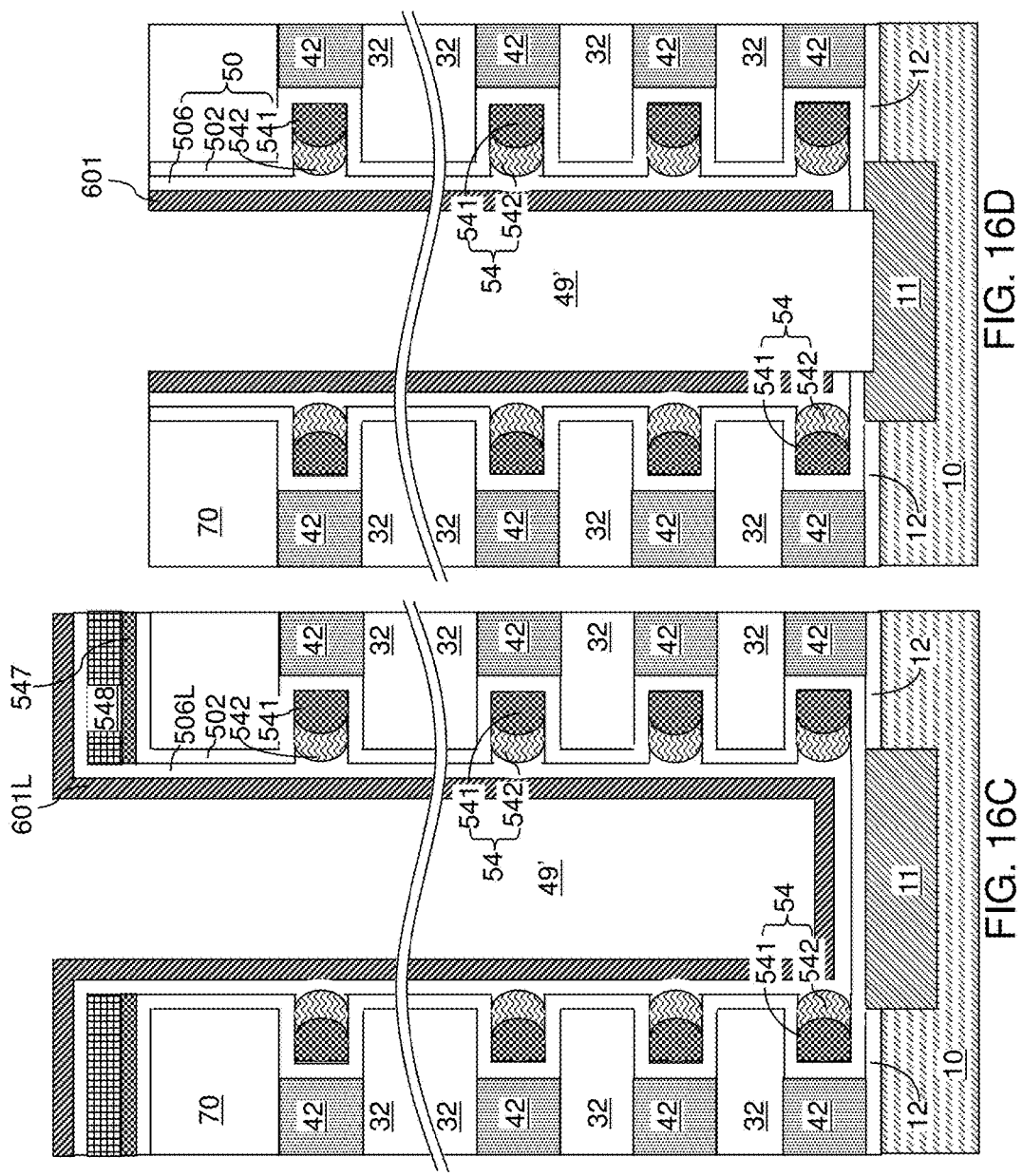

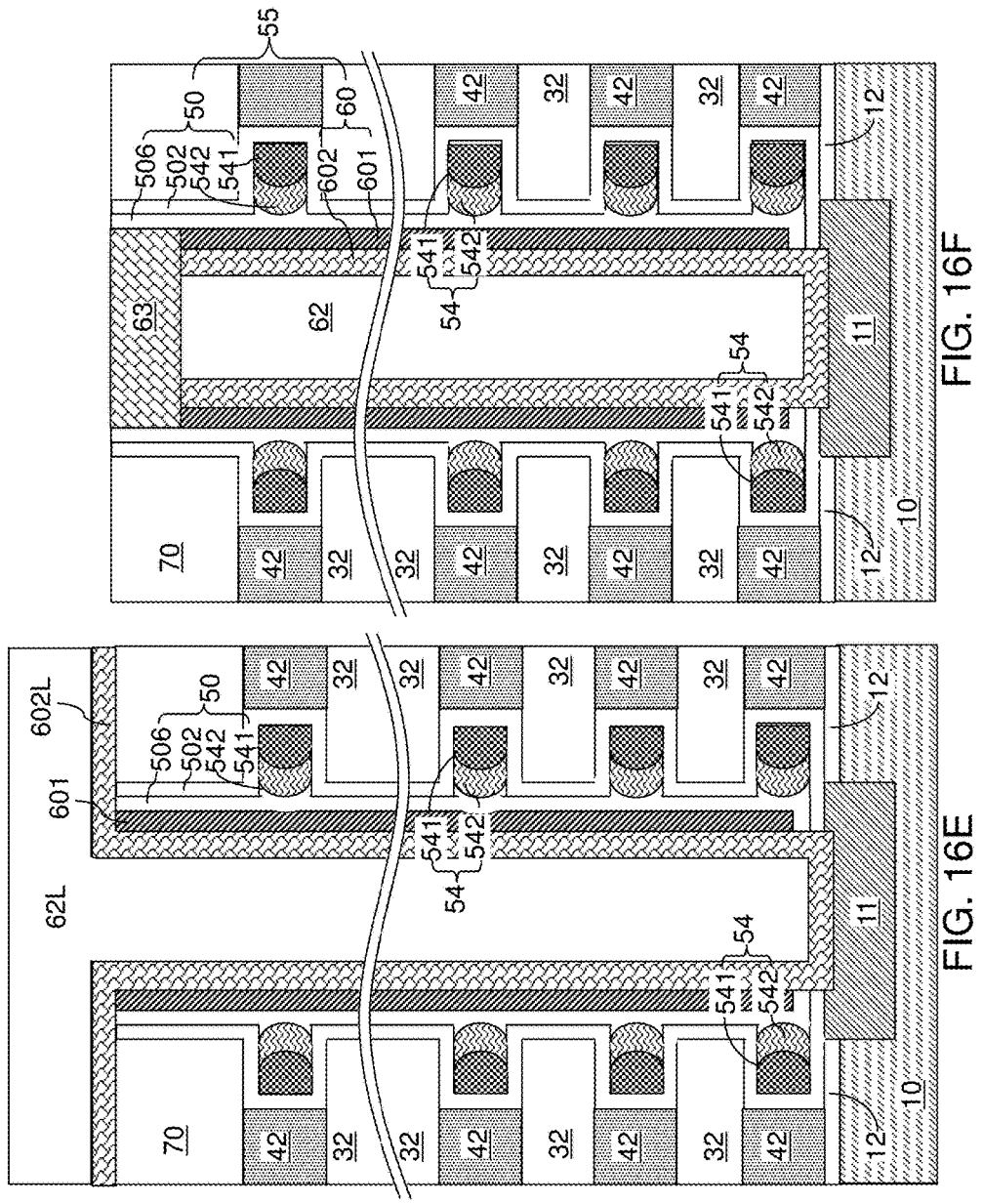

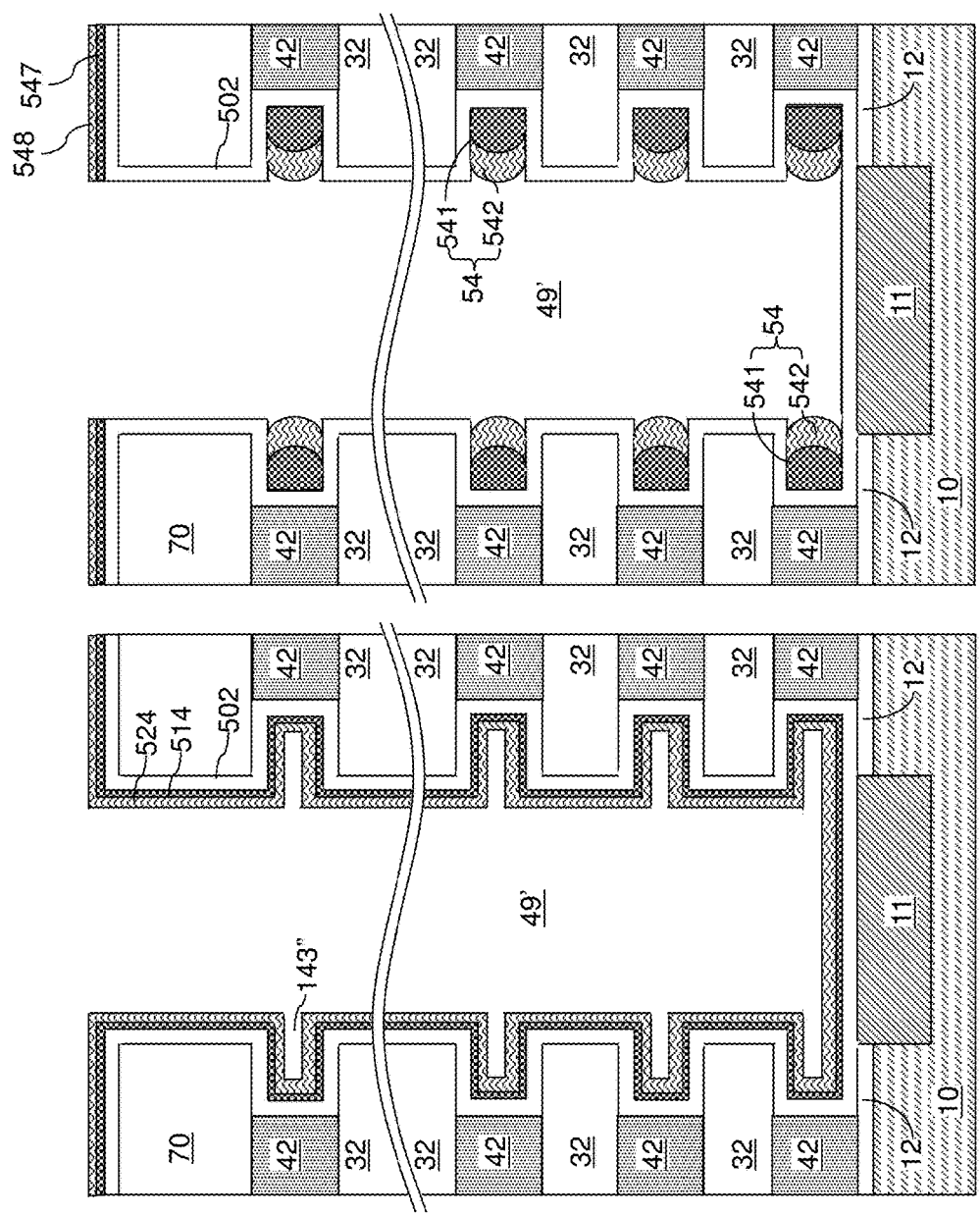

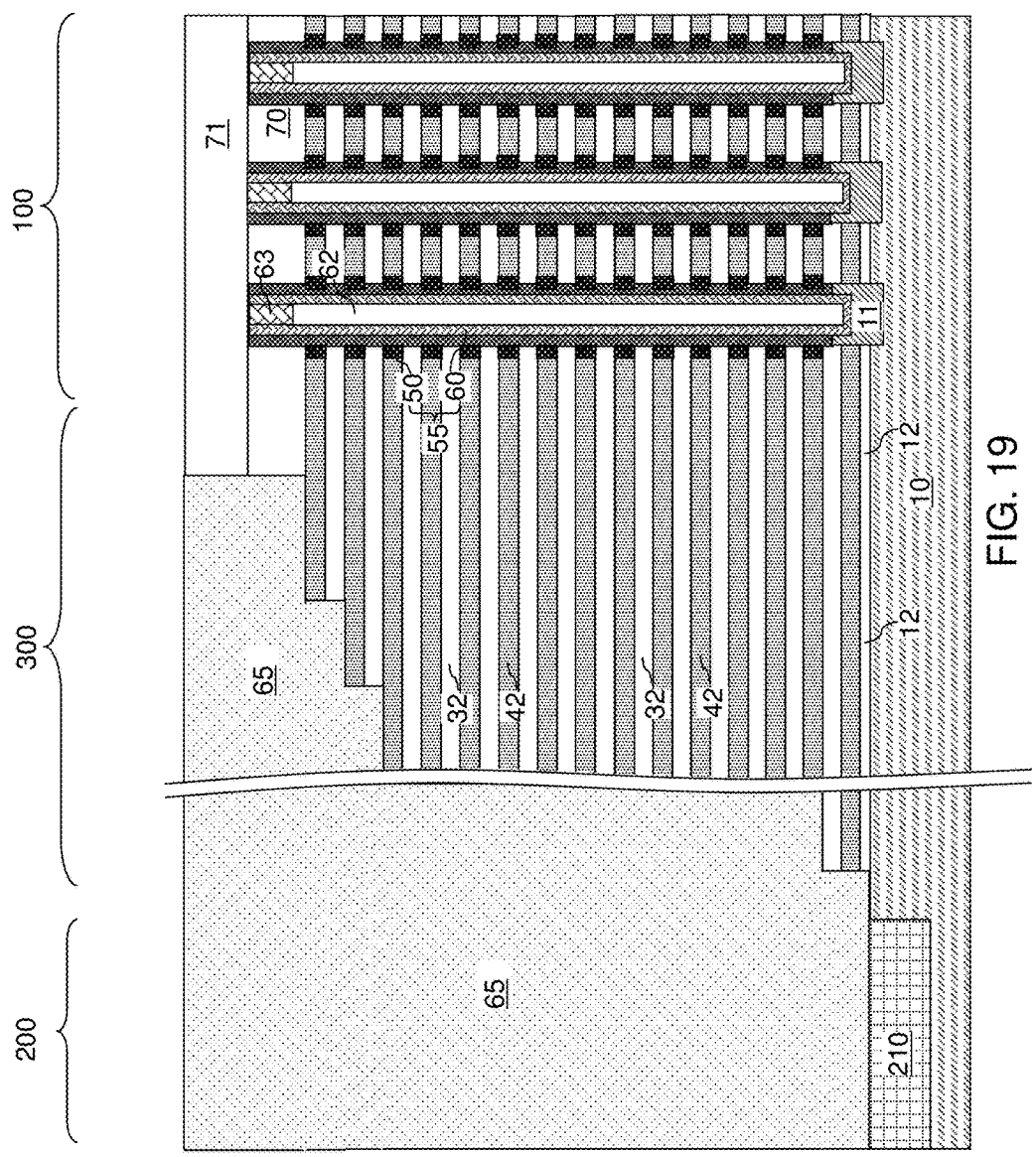

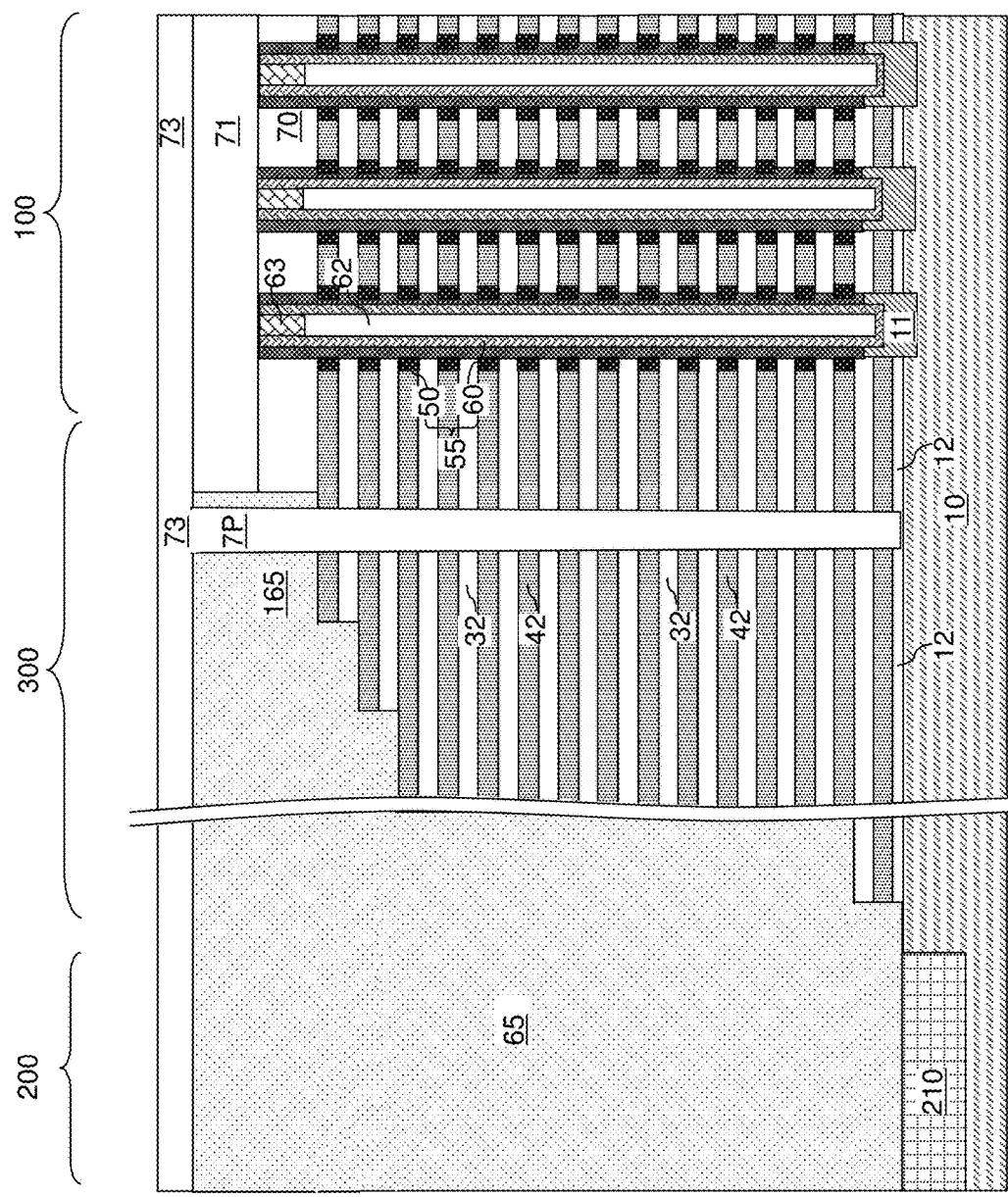

METHOD OF MAKING SELF-ASSEMBLING FLOATING GATE ELECTRODES FOR A THREE-DIMENSIONAL MEMORY DEVICE

RELATED APPLICATIONS

This application is a continuation-in-part application of U.S. patent application Ser. No. 14/859,710 filed on Sep. 21, 2015, the entire content of which is incorporated herein by reference.

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to aspect of the present disclosure a three-dimensional memory device comprises an alternating stack of insulating layers and electrically conductive layers located over a substrate, a memory opening vertically extending through the alternating stack and comprising lateral protrusions at levels of the electrically conductive layers, a blocking dielectric layer contacting a sidewall of the memory opening, metal floating gate structures located inside the blocking dielectric layer within volumes of the lateral protrusions of the memory opening and including a respective convex inner sidewall, a tunneling dielectric layer contacting vertical inner sidewall portions of the blocking dielectric layer and located inside the metal floating gate structures, and a vertical semiconductor channel contacting an inner sidewall of the tunneling dielectric layer.

According to another aspect of the present disclosure, a method of forming a three-dimensional memory device comprises forming an alternating stack of insulating layers and spacer material layers over a substrate, forming an opening extending through the alternating stack, forming recesses by removing the spacer material layers with respect the insulating layers, depositing a continuous metal layer in the backside recesses and the opening, wherein a vertically-extending portion of deposited continuous metal layer covers a portion of a sidewall of the opening between a vertically neighboring pair of the recesses, performing an anneal to separate the continuous metal layer into discrete metal portions, and forming a tunneling dielectric and a vertical semiconductor channel extending through the alternating stack.

BRIEF DESCRIPTION OF THE DRAWINGS

FIGS. 2A-2H are sequential vertical cross-sectional views of a memory opening within the first exemplary structure during various processing steps employed to form a memory stack structure according to an embodiment of the present disclosure.

FIGS. 8A-8G are sequential vertical cross-sectional views of a magnified region M in FIG. 7 during formation of first exemplary electrically conductive layers according to a first embodiment of the present disclosure.

FIGS. 9A-9D are sequential vertical cross-sectional views of a magnified region M in FIG. 7 during formation of second exemplary electrically conductive layers according to a second embodiment of the present disclosure.

FIGS. 14A and 14C are electron microscope micrographs of first exemplary structures of embodiments of the present disclosure. FIGS. 14B and 14D are electron microscope micrographs of structures of FIGS. 14A and 14C, respectively, after a five minute anneal at 500° C.

FIGS. 15A-15J are sequential vertical cross-sectional views of a memory opening during formation of a first exemplary memory stack structure employed in a second exemplary structure according to an embodiment of the present disclosure.

FIGS. 16A-16F are sequential vertical cross-sectional views of a memory opening during formation of a second exemplary memory stack structure employed in the second exemplary structure according to an embodiment of the present disclosure.

FIGS. 17A and 17B are sequential vertical cross-sectional views of a memory opening during formation of a third exemplary memory stack structure employed in the second exemplary structure according to an embodiment of the present disclosure.

FIG. 19 is a vertical cross-sectional view of the second exemplary structure after formation of stepped surfaces and a retro-stepped dielectric material portion in the contact region according to an embodiment of the present disclosure.

FIG. 20 is a vertical cross-sectional view of the second exemplary structure after formation of dielectric pillar structures and a second contact level dielectric layer according to an embodiment of the present disclosure.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

Figure 1:
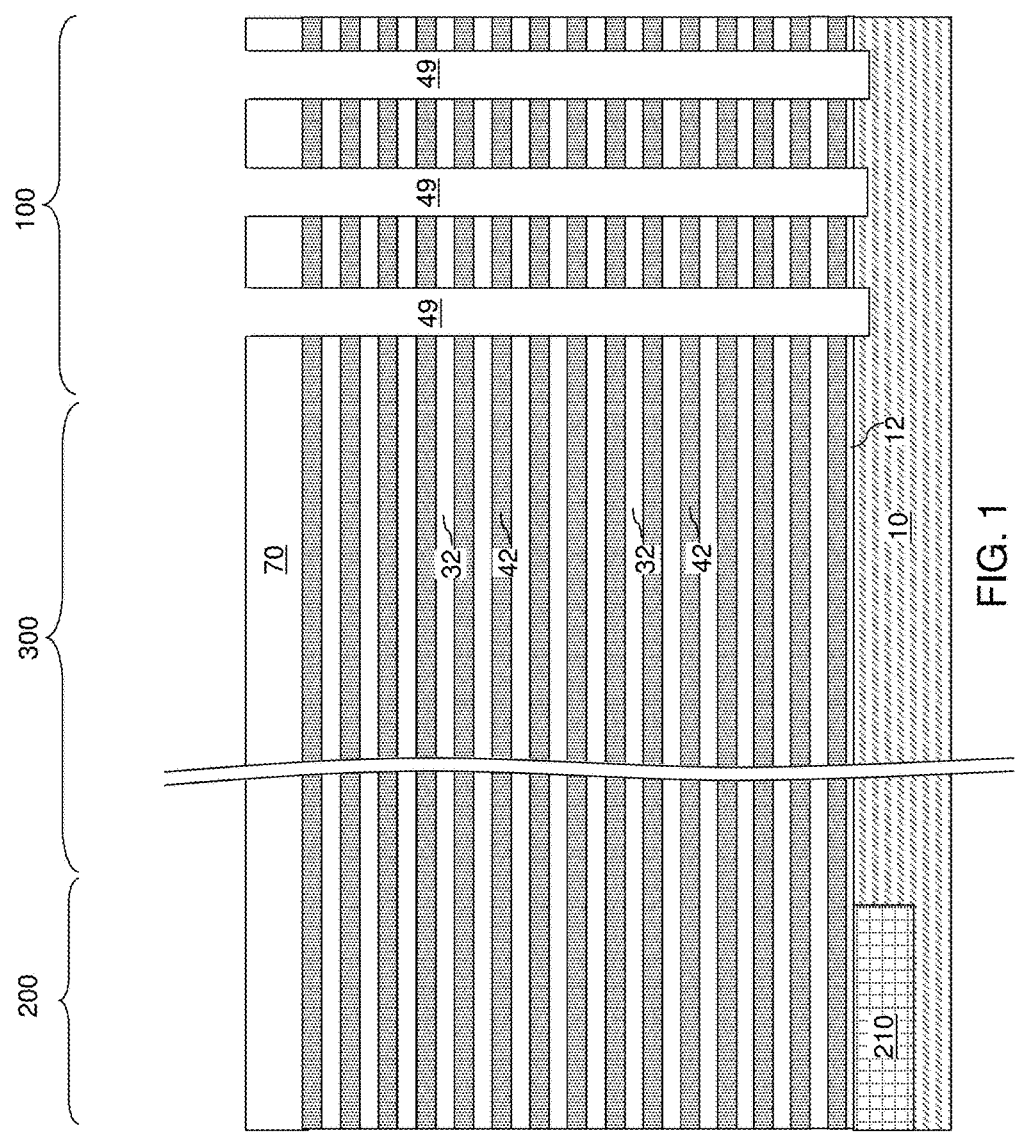
FIG. 1 is a vertical cross-sectional view of a first exemplary structure after formation of an alternating stack of insulating layers and sacrificial material layers and memory openings extending through the alternating stack according to an embodiment of the present disclosure.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein. Referring to FIG. 1, a first exemplary structure according to an embodiment of the present disclosure is illustrated, which can be employed, for example, to fabricate a device structure containing vertical NAND memory devices. The first exemplary structure includes a substrate, which can be a semiconductor substrate (e.g., a semiconductor substrate, such as a single crystalline silicon wafer). The substrate can include a semiconductor substrate layer 10. The semiconductor substrate layer 10 is a semiconductor material layer, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^5$ S/cm. As used herein, an "insulating material" or a "dielectric material" refers to a material having electrical conductivity less than $1.0\times10^{-6}$ S/cm. All measurements for electrical conductivities are made at the standard condition. The semiconductor substrate layer 10 can include at least one doped well (not expressly shown) having a substantially uniform dopant concentration therein.

The first exemplary structure can have multiple regions for building different types of devices. Such areas can include, for example, a device region 100, a contact region 300, and a peripheral device region 200. In one embodiment, the semiconductor substrate layer 10 can include at least one a doped well in the device region 100. As used herein, a "doped well" refers to a portion of a semiconductor material having a doping of a same conductivity type (which can be p-type or n-type) and a substantially same level of dopant concentration throughout. The doped well can be the same as the semiconductor substrate layer 10 or can be a portion of the semiconductor substrate layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0\times10^{15}$/cm$^3$ to $1.0\times10^{18}$/cm$^3$, although lesser and greater dopant concentration levels can also be employed. As used herein, a dopant concentration level refers to average dopant concentration for a given region.

Peripheral devices 210 can be formed in, or on, a portion of the semiconductor substrate layer 10 located within the peripheral device region 200. The peripheral devices can include various devices employed to operate the memory devices to be formed in the device region 100, and can include, for example, driver circuits for the various components of the memory devices. The peripheral devices 210 can include, for example, field effect transistors and/or passive components such as resistors, capacitors, inductors, diodes, etc.

Optionally, a gate dielectric layer 12 can be formed above the semiconductor substrate layer 10. The gate dielectric layer 12 can be employed as the gate dielectric for a first source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

An alternating stack of first material layers (which can be insulating layers 32) and second material layers (which are referred to spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form first memory openings 49. In other words, the transfer of the pattern in the patterned lithographic material stack through the alternating stack (32, 42) forms the first memory openings that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the first memory openings can be substantially vertical, or can be tapered. The patterned lithographic material stack can be subsequently removed, for example, by ashing.

A memory stack structure can be formed in each of the memory opening. FIGS. 2A-2H illustrate sequential vertical cross-sectional views of a memory opening during formation of an exemplary memory stack structure. Formation of the exemplary memory stack structure can be performed within each of the memory openings 49 in the first exemplary structure illustrated in FIG. 1.

Referring to FIG. 2A, a memory opening 49 is illustrated. The memory opening 49 extends through the insulating cap layer 70, the alternating stack (32, 42), and the gate dielectric layer 12, and optionally into an upper portion of the semiconductor substrate layer 10. The recess depth of the bottom surface of each memory opening 49 with respect to the top surface of the semiconductor substrate layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an epitaxial channel portion 11 can be optionally formed at the bottom of each memory opening 49 by selective epitaxy of a semiconductor material. During the selective epitaxy process, a reactant gas and an etchant gas can be simultaneously or alternatively flowed into a process chamber. Semiconductor surfaces and dielectric surfaces of the first exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the semiconductor substrate layer 10 at the bottom of each memory opening 49). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the semiconductor substrate layer 10. Each epitaxial channel portion 11 functions as a portion of a channel of a vertical field effect transistor. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each memory opening 49.

Referring to FIG. 2C, a series of layers including at least one blocking dielectric layer (501L, 503L), a continuous memory material layer 504, a continuous tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

In an illustrative example, the first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least one oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

The continuous memory material layer 504, the continuous tunneling dielectric layer 506L, and the optional first semiconductor channel layer 601L can be sequentially formed. In one embodiment, the continuous memory material layer 504 can be a charge trapping material including a dielectric charge trapping material, which can be, for example, silicon nitride. Alternatively, the continuous memory material layer 504 can include a conductive material such as doped polysilicon or a metallic material that is patterned into multiple electrically isolated portions (e.g., floating gates), for example, by being formed within lateral recesses into sacrificial material layers 42. In one embodiment, the continuous memory material layer 504 includes a silicon nitride layer.

The continuous memory material layer 504 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous memory material layer 504 may comprise an insulating charge trapping material, such as one or more silicon nitride segments. Alternatively, the continuous memory material layer 504 may comprise conductive nanoparticles such as metal nanoparticles, which can be, for example, ruthenium nanoparticles. The continuous memory material layer 504 can be formed, for example, by chemical vapor deposition (CVD), atomic layer deposition (ALD), physical vapor deposition (PVD), or any suitable deposition technique for storing electrical charges therein. The thickness of the continuous memory material layer 504 can be in a range from 2 nm to 20 nm, although lesser and greater thicknesses can also be employed.

The continuous tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The continuous tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the continuous tunneling dielectric layer 506L can include a stack of a first silicon oxide layer, a silicon oxynitride layer, and a second silicon oxide layer, which is commonly known as an ONO stack. In one embodiment, the continuous tunneling dielectric layer 506L can include a silicon oxide layer that is substantially free of carbon or a silicon oxynitride layer that is substantially free of carbon. The thickness of the continuous tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 506L, 601L).

Referring to FIG. 2D, the optional first semiconductor channel layer 601L, the continuous tunneling dielectric layer 506L, the continuous memory material layer 504, the at least one blocking dielectric layer (501L, 503L) are sequentially anisotropically etched employing at least one anisotropic etch process. The portions of the first semiconductor channel layer 601L, the continuous tunneling dielectric layer 506L, the continuous memory material layer 504, and the at least one blocking dielectric layer (501L, 503L) located above the top surface of the insulating cap layer 70 can be removed by the at least one anisotropic etch process. Further, the horizontal portions of the first semiconductor channel layer 601L, the continuous tunneling dielectric layer 506L, the continuous memory material layer 504, and the at least one blocking dielectric layer (501L, 503L) at a bottom of each cavity 49' can be removed to form openings in remaining portions thereof. Each of the first semiconductor channel layer 601L, the continuous tunneling dielectric layer 506L, the continuous memory material layer 504, and the at least one blocking dielectric layer (501L, 503L) can be etched by anisotropic etch process.

Each remaining portion of the first semiconductor channel layer 601L constitutes a first semiconductor channel portion 601. Each remaining portion of the continuous tunneling dielectric layer 506L constitutes a tunneling dielectric layer 506. Each remaining portion of the continuous memory material layer 504 is herein referred to as a memory material layer 504. The memory material layer 504 can comprise a charge trapping material or a floating gate material. In one embodiment, each memory material layer 504 can include a vertical stack of charge storage regions that store electrical charges upon programming. In one embodiment, the memory material layer 504 can be a charge storage layer in which each portion adjacent to the sacrificial material layers 42 constitutes a charge storage region. Each remaining portion of the second blocking dielectric layer 503L is herein referred to as a second blocking dielectric 503. Each remaining portion of the first blocking dielectric layer 501L is herein referred to as a first blocking dielectric 501.

A surface of the epitaxial channel portion 11 (or a surface of the semiconductor substrate layer 10 in case the epitaxial channel portions 11 are not employed) can be physically exposed underneath the opening through the first semiconductor channel portion 601, the tunneling dielectric layer 506, the memory material layer 504, and the at least one blocking dielectric (501, 503). Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 506 is located over the memory material layer 504. A set of at least one blocking dielectric (501, 503), a memory material layer 504, and a tunneling dielectric layer 506 in a memory opening 49 constitutes a memory film 50, which includes a plurality of charge storage regions (as embodied as the memory material layer 504) that are insulated from surrounding materials by the at least one blocking dielectric (501, 503) and the tunneling dielectric layer 506.

In one embodiment, the first semiconductor channel portion 601, the tunneling dielectric layer 506, the memory material layer 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2E, a second semiconductor channel layer 602L can be deposited directly on the semiconductor surface of the epitaxial channel portion 11 or the semiconductor substrate layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric layer 506 is embedded within a memory material layer 504, and laterally surrounds a portion of the semiconductor channel 60. Each adjoining set of a first blocking dielectric 501, a second blocking dielectric 503, a memory material layer 504, and a tunneling dielectric layer 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

Referring to FIG. 2H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
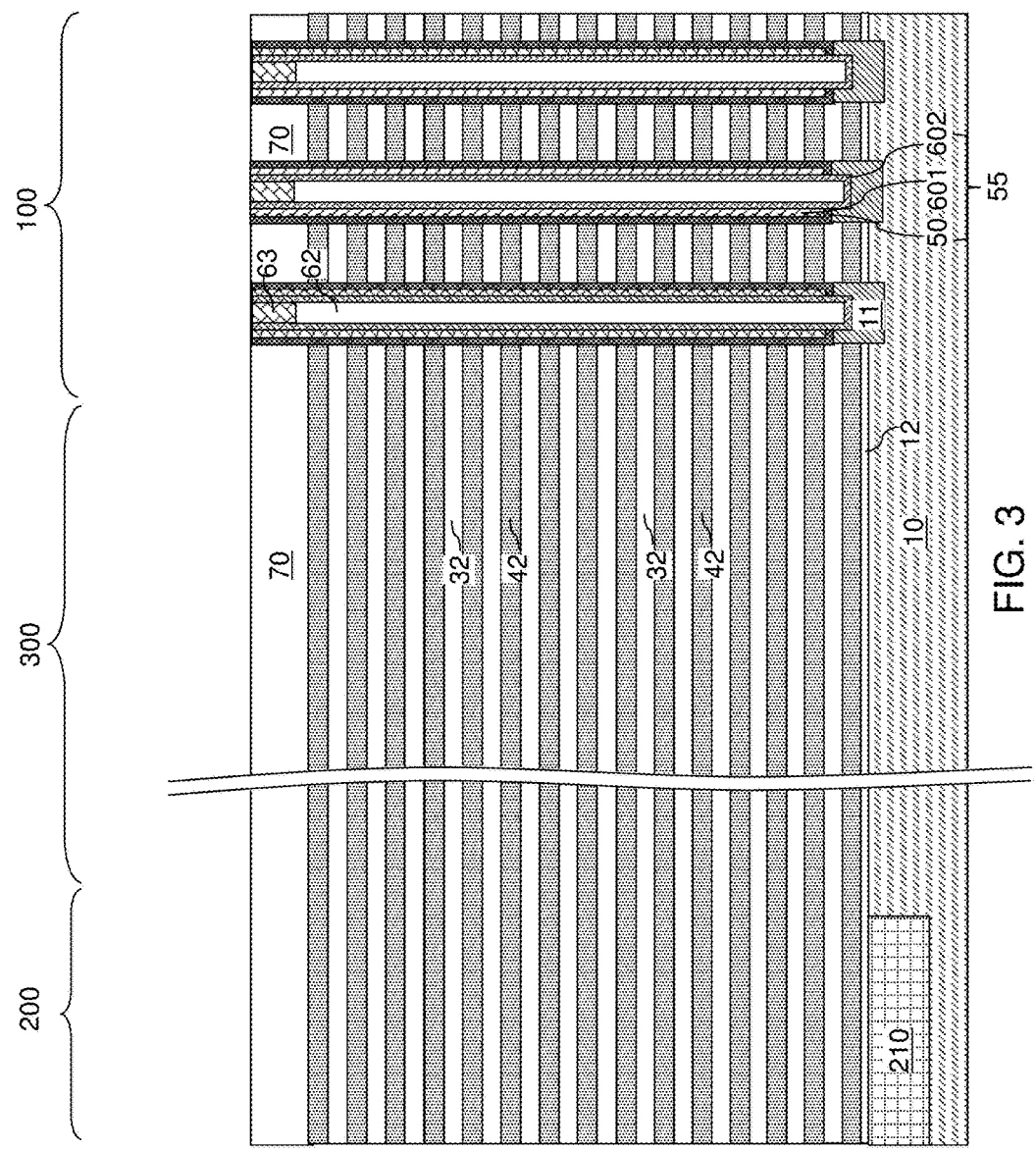
FIG. 3 is a vertical cross-sectional view of the first exemplary structure after formation of memory stack structures according to an embodiment of the present disclosure.

The exemplary memory stack structure 55 can be embedded into the first exemplary structure illustrated in FIG. 1. FIG. 3 illustrates the first exemplary structure that incorporates multiple instances of the exemplary memory stack structure of FIG. 2H. Each exemplary memory stack structure 55 includes a semiconductor channel (601, 602); a tunneling dielectric layer 506 laterally surrounding the semiconductor channel (601, 602); and a vertical stack of charge storage regions laterally surrounding the tunneling dielectric layer 506 (as embodied as a memory material layer 504). The first exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor substrate layer 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
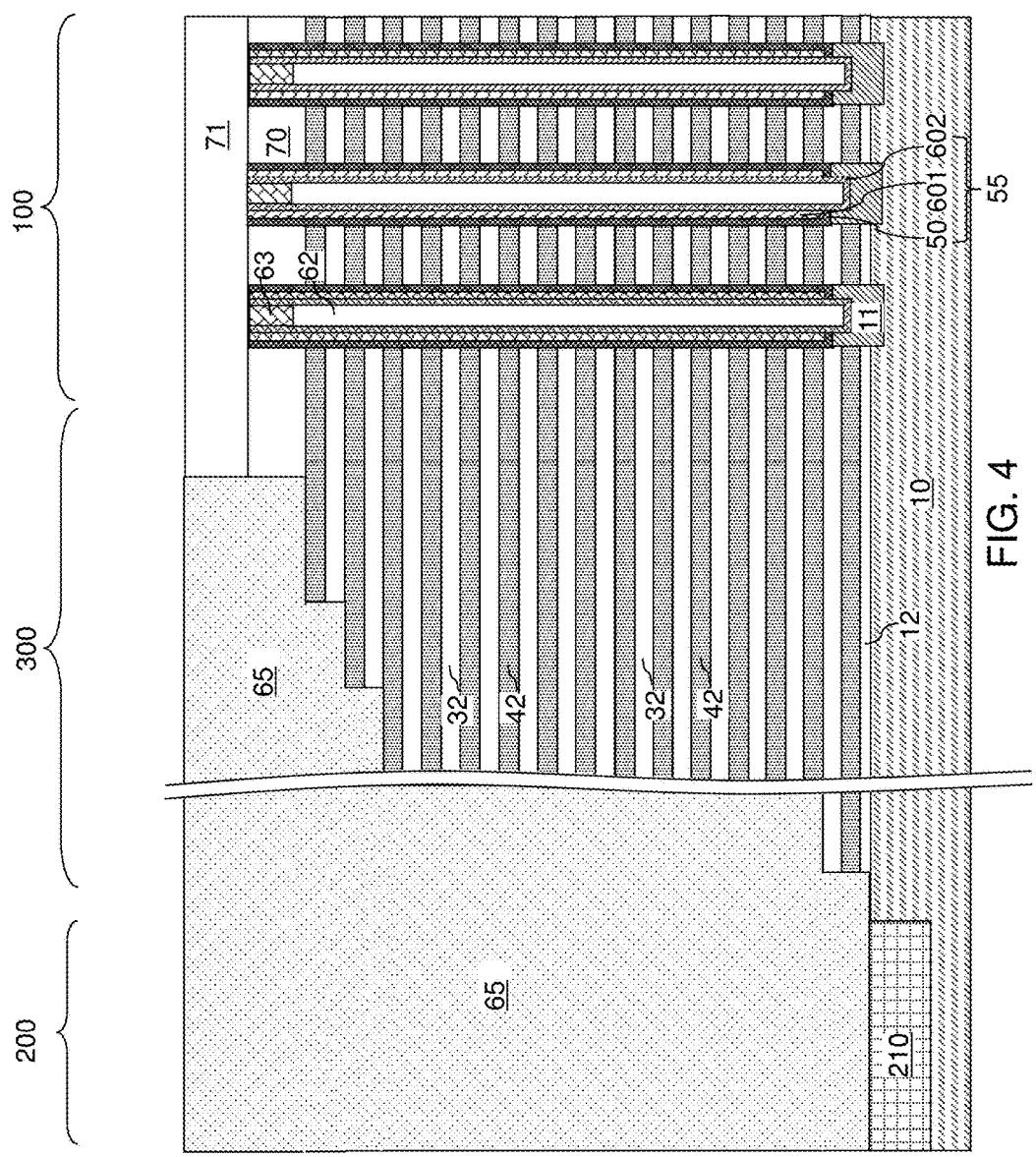
FIG. 4 is a vertical cross-sectional view of the first exemplary structure after formation of a set of stepped surfaces and a retro-stepped dielectric material portion according to an embodiment of the present disclosure.

Referring to FIG. 4, an optional first contact level dielectric layer 71 can be formed over the semiconductor substrate layer 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, and the alternating stack (32, 42) can be removed from the peripheral device region 200, for example, by a masked etch process. In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the semiconductor substrate layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the semiconductor substrate layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Figure 5:
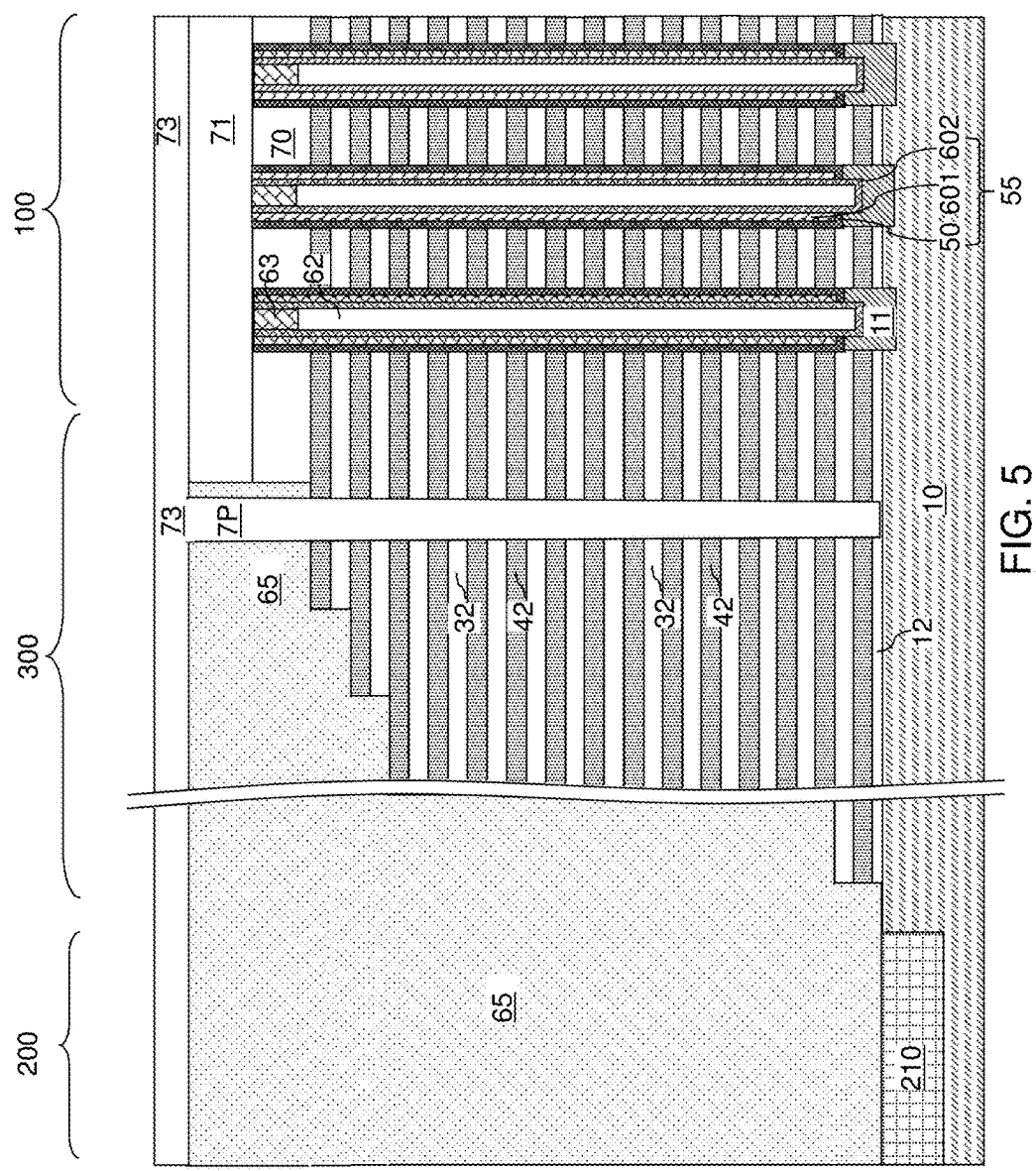
FIG. 5 is a vertical cross-sectional view of the first exemplary structure after formation of dielectric pillar structures according to an embodiment of the present disclosure.

Referring to FIG. 5, dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the device region 100. The dielectric support pillars 7P can be formed, for example, by forming an opening extending through the retro-stepped dielectric material portion 65 and/or through the alternating stack (32, 42) and at least to the top surface of the semiconductor substrate layer 10, and by filling the opening with a dielectric material that is resistant to the etch chemistry to be employed to remove the sacrificial material layers 42.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

Figure 6A:
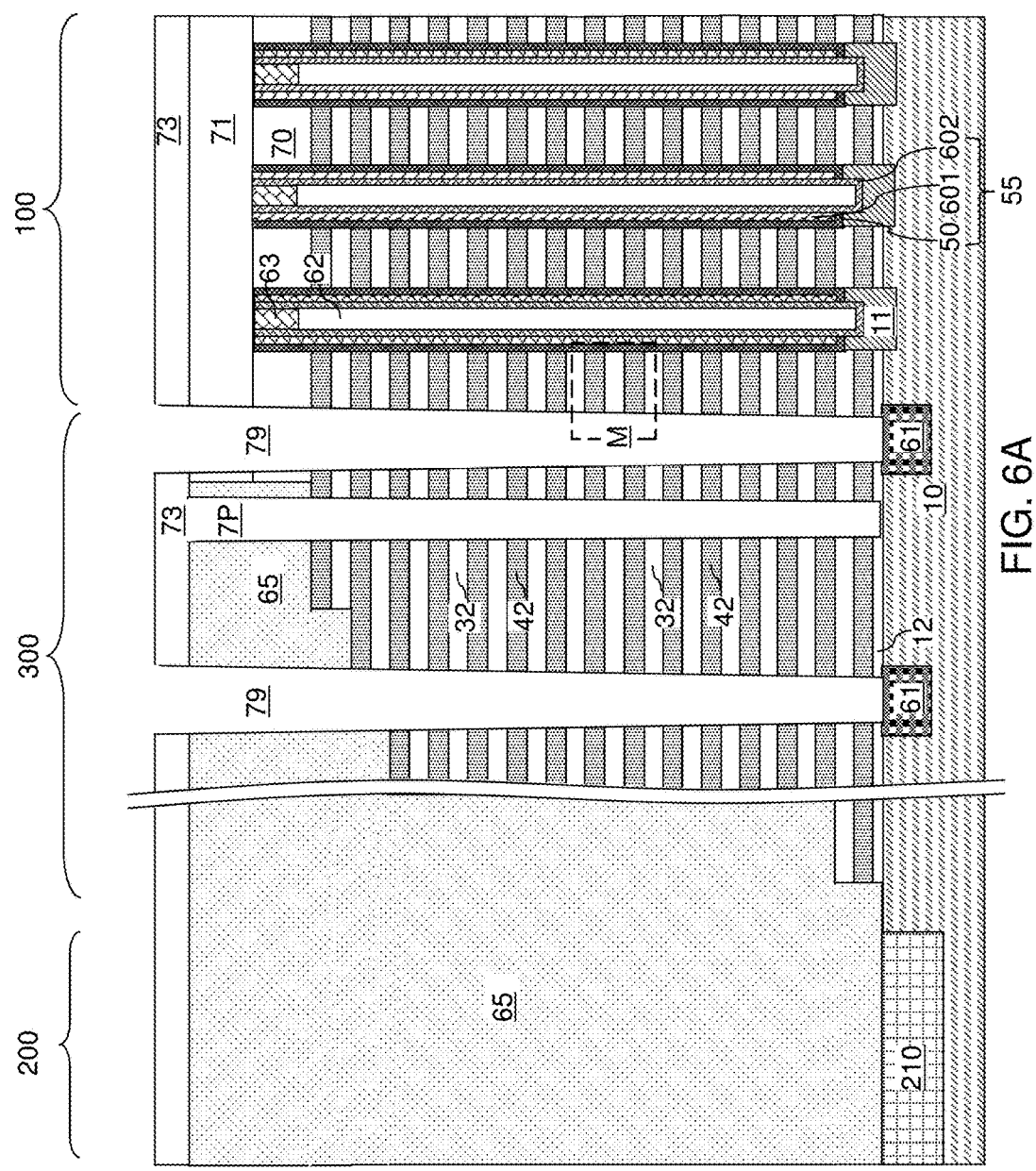
FIG. 6A is a vertical cross-sectional view of the first exemplary structure after formation of backside trenches according to an embodiment of the present disclosure.
Figure 6B:
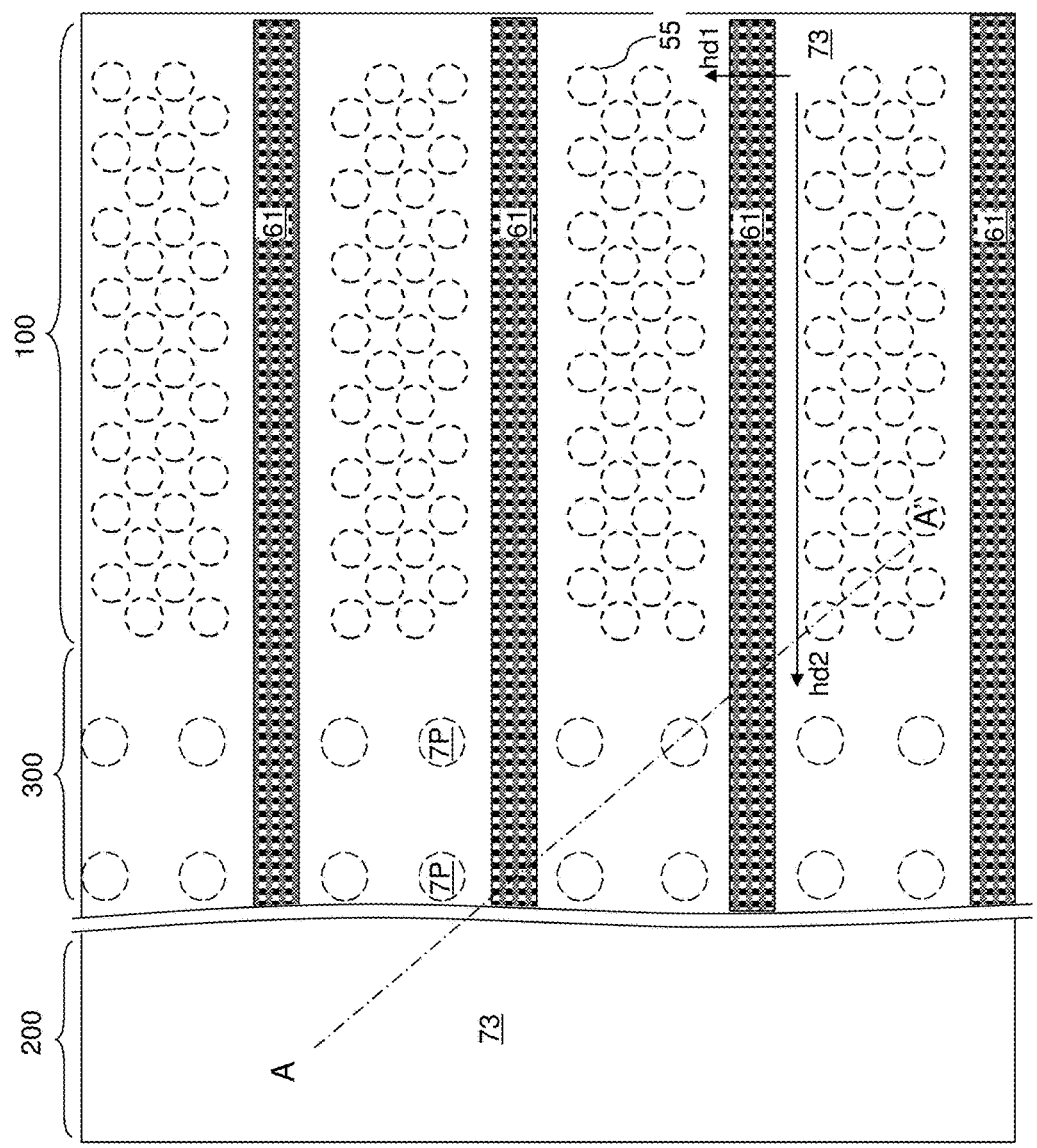
FIG. 6B is a see-through top-down view of the first exemplary structure of FIG. 6A. The vertical plane A-A' is the plane of the vertical cross-sectional view of FIG. 6A.

Referring to FIGS. 6A and 6B, a photoresist layer (not shown) can be applied over the at least one contact level dielectric layer (71, 73), and can be lithographically patterned to form openings within areas between the memory blocks. In one embodiment, the memory blocks can be laterally spaced from one another along a first horizontal direction hd1 (e.g., bit line direction), and the dimension of each opening in the photoresist layer along the first horizontal direction hd1 can be less than the spacing between neighboring clusters (i.e., sets) of the memory stack structures 55 along the second horizontal direction hd2 (e.g., word line direction). Further, the dimension of each opening in the photoresist layer along a second horizontal direction hd2 (which is parallel to the lengthwise direction of each cluster of memory stack structures 55) can be greater than the extent of each cluster of the memory stack structures 55 along the first horizontal direction hd1.

Backside trenches 79 can be formed between each neighboring pair of clusters of the memory stack structures 55 by transferring the pattern of the openings in the photoresist layer through the at least one contact level dielectric layer (71, 73), the retro-stepped dielectric material portion 65, and the alternating stack (32, 42). A top surface of the semiconductor substrate layer 10 can be physically exposed at the bottom of each backside trench 79. In one embodiment, each backside trench 79 can extend along the second horizontal direction hd2 so that clusters of the memory stack structures 55 are laterally spaced along the first horizontal direction hd1. Each cluster of memory stack structures 55 in conjunction with the portions of the alternating stack (32, 42) that surround the cluster constitutes a memory block. Each memory block is laterally spaced from one another by the backside trenches 79.

In one embodiment, source regions 61 can be formed in, or on, portions of the semiconductor substrate layer 10 underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa.

Figure 7:
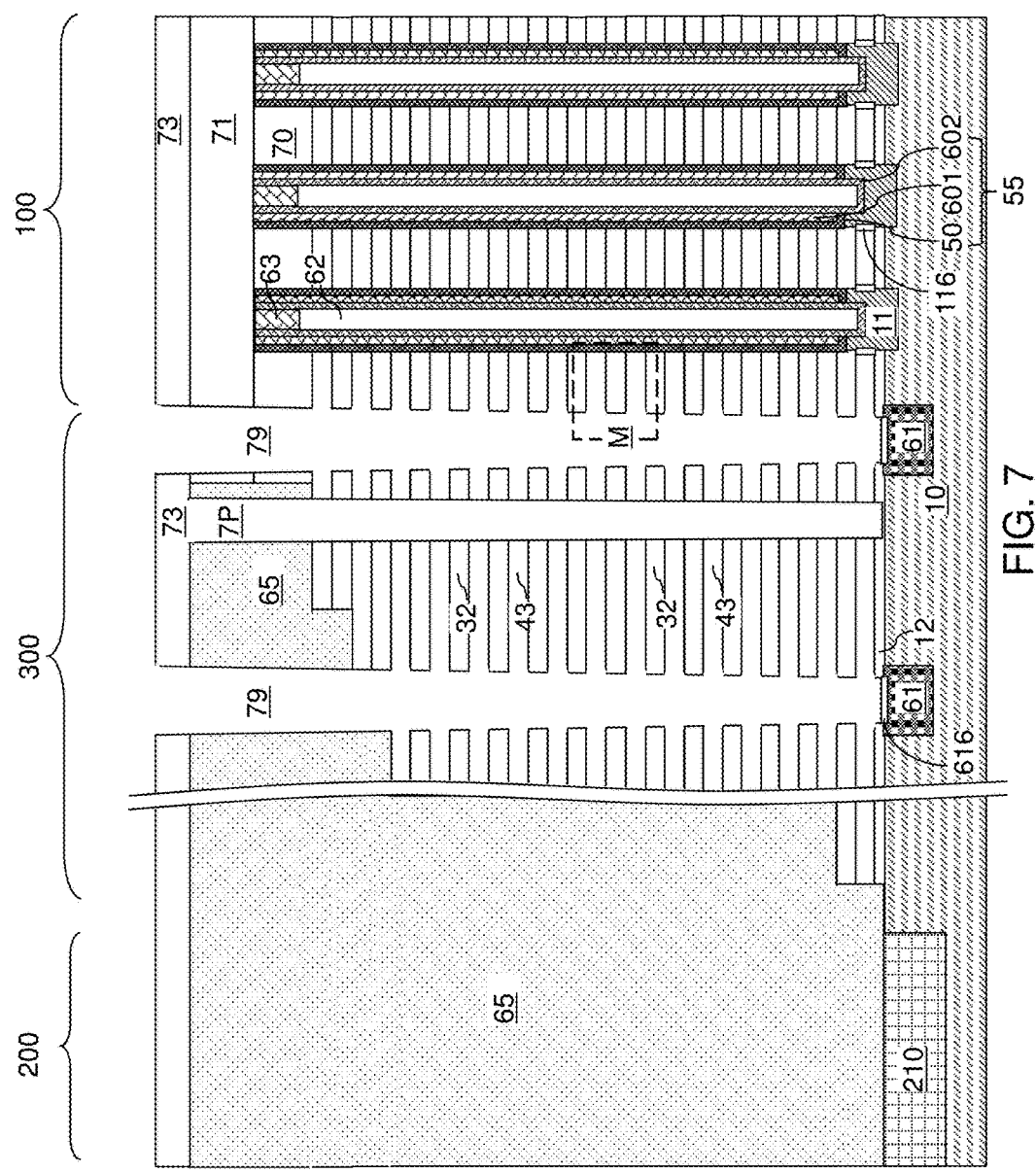
FIG. 7 is a vertical cross-sectional view of the first exemplary structure after formation of backside recesses according to an embodiment of the present disclosure.

Referring to FIG. 7, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the dielectric support pillars 7P, the material of the retro-stepped dielectric material portion 65, the semiconductor material of the semiconductor substrate layer 10, and the material of the outermost layer of the first memory films 50. In one embodiment, the sacrificial material layers 42 can include silicon nitride, and the materials of the insulating layers 32, the dielectric support pillars 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the dielectric support pillars 7P, and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the semiconductor substrate layer 10.

The etch process that removes the second material selective to the first material and the outermost layer of the first memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The dielectric support pillars 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The first memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (e.g., above the semiconductor substrate layer 10). In this case, each backside recess 43 can define a space for receiving a respective word line of the array of monolithic three-dimensional NAND strings.

Each of the plurality of backside recesses 43 can extend substantially parallel to the top surface of the semiconductor substrate layer 10. A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Subsequently, physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

A backside blocking dielectric layer (not shown) can be optionally formed. The backside blocking dielectric layer, if present, comprises a dielectric material that functions as a control gate dielectric for the control gates to be subsequently formed in the backside recesses 43. In case at least one blocking dielectric is present within each memory stack structure 55, the backside blocking dielectric layer is optional. In case a blocking dielectric is not present in the memory stack structures 55, the backside blocking dielectric layer is present.

Referring to FIG. 8A, a vertical cross-sectional view of a mirror image of a magnified region M of FIG. 6A is illustrated, which is prior to removal of the sacrificial material layers 42.

Referring to FIG. 8B, the sacrificial material layers 42 can be removed by the selective etch process of FIG. 7 to form the backside recesses 43.

Referring to FIG. 8C, a backside blocking dielectric layer 52 can be optionally deposited on the physically exposed surfaces of the insulating layers 32. The backside blocking dielectric layer 52 can include a dielectric metal oxide material, which can be a high-k dielectric material. In one embodiment, the backside blocking dielectric layer 52 can include aluminum oxide. The backside blocking dielectric layer 52 can be deposited by a conformal deposition process such as atomic layer deposition (ALD). The thickness of the backside blocking dielectric layer 52 can be in a range from 1 nm to 6 nm, although lesser and greater thicknesses can also be employed.

A conductive metallic compound layer 462 can be subsequently deposited in the backside recesses 43 and over the sidewall of the backside trench 79. In one embodiment, the conductive metallic compound layer 462 can be a conductive metal nitride layer including a conductive metal nitride such as TiN, TaN, or WN, or can be a conductive metal carbide layer including a conductive metal carbide such as TiC, TaC, or WC. The conductive metallic compound layer 462 can include a metallic material that functions as a barrier material layer, i.e., a material layer that functions as a diffusion barrier for impurity atoms or gases, and/or as an adhesion promoter layer, i.e., a material layer that promotes adhesion of subsequent layers to the backside blocking dielectric layer 52 or to the insulating layers 32 (in case a backside blocking dielectric layer 52 is not employed). The conductive metallic compound layer 462 can be deposited by a conformal deposition process such as chemical vapor deposition (CVD) or atomic layer deposition (ALD). The thickness of the conductive metallic compound layer 462 can be in a range from 1 nm to 6 nm, although lesser and greater thicknesses can also be employed. A backside cavity 43', i.e., an unfilled volume, is present within each backside recess 43.

Figure 8E:
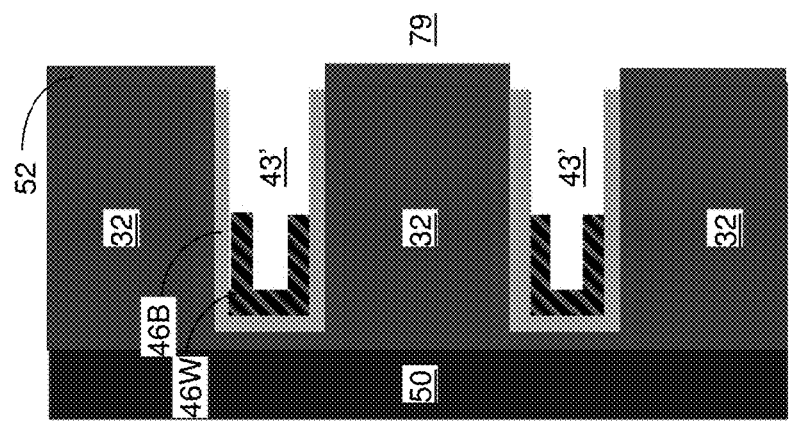
Figure 8D:
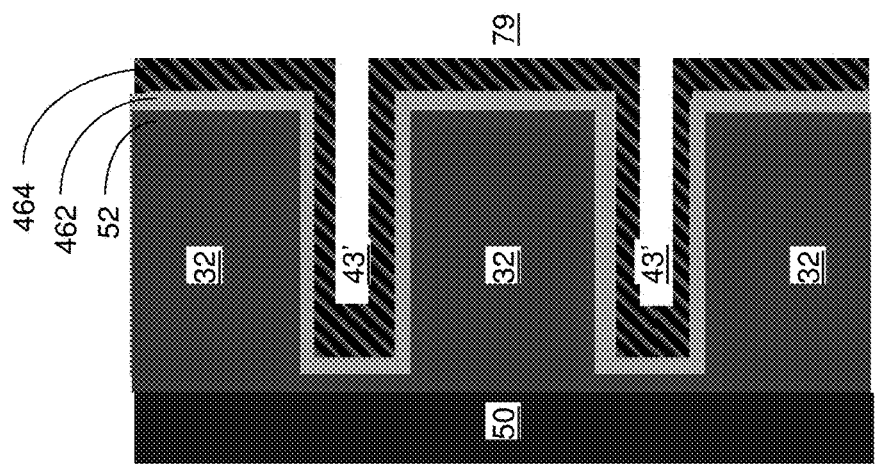

Referring to FIG. 8D, a metal layer 464 can be optionally formed on the surfaces of the conductive metallic compound layer 462. The metal layer 464 includes a conductive metal, which can be an elemental metal (such as W, Ru, Ti, or Ta) or an alloy of at least two elemental metals. The metal layer 464 preferably includes a metal other than cobalt. In one embodiment, the metal layer 464 can be a tungsten layer. The metal layer 464 can be formed by a conformal deposition process, such as chemical vapor deposition (CVD) or atomic layer deposition (ALD). The thickness of the metal layer 464 can be in a range from 1 nm to 20 nm, although lesser and greater thicknesses can also be employed. A backside cavity 43' may be present within each volume of the backside recess 43.

Referring to FIG. 8E, portions of the metal layer 464 can be anisotropically etched from sidewalls of the backside trench 79 and from regions of the backside recesses 43 that are proximal to the backside trench 79. The duration and the anisotropy of the anisotropic etch process can be selected such that a portion of the metal layer 464 remains in each backside recess 43 at an end proximal to the memory film 50. Each remaining portions of the metal layer 464 constitutes a metal portion 46W, which preferably includes at least one elemental metal other than cobalt. In one embodiment, the metal portions 46W can consist essentially of the at least one elemental metal. In one embodiment, the metal portions 46W can consist essentially of a single elemental metal such as W, Ru, Ti, or Ta.

The metal portion 46W is formed within each backside recess 43 and directly on a conductive metallic compound layer 462.

Subsequently or concurrently, the conductive metallic compound layer 462 is etched to be removed from the backside trench 79 while remaining in the backside recesses 43. In one embodiment, the anisotropic etching of the conductive metallic compound layer 462 can be performed after formation of the metal portions 46W employing an anisotropic etch process different from the anisotropic etch process that etches the metal layer 462. In this case, the anisotropic etch process that etches the conductive metallic compound layer 462 can be selective to the material of the metal portions 46W. In another embodiment, the anisotropic etching of the conductive metallic compound layer 462 can be performed concurrently with formation of the metal portions 46W by employing an etch chemistry that simultaneously etches the material of the metal layer 464 and the metallic compound layer 462.

In one embodiment, the anisotropic etch process that etches the material of the metal layer 464 can be selective to the dielectric material of the backside blocking dielectric layer 52. In one embodiment, horizontal surfaces of remaining portions of the conductive metallic compound layer 462 can be physically exposed in the backside recess 43. Each remaining portion of the conductive metallic compound layer 462 is herein referred to as a conductive metallic compound liner 46B. In one embodiment, the outermost portion of each conductive metallic compound liner 46B can be laterally recessed from the sidewalls of the backside blocking dielectric layer 52 in the backside trench 79, or from the sidewalls of the insulating layers 32 in the backside trench 79 in case a backside blocking dielectric layer 52 is not employed. Each conductive metallic compound liner 46B can extend further toward the backside trench 79 in the backside recess 43 than the metal portion 46W in the same recess 43 such that the conductive metallic compound liner 46B is exposed in the backside recess 43.

Referring to FIG. 8F, an electrically conductive material which can be separated into separate portions during a subsequent anneal process and which has a composition different from the composition of the liner 46B and metal portions 46W anneal is deposited in the backside recesses 43 and the backside trench 79. Preferably, the electrically conductive material is a cobalt-containing material. Alternatively, other electrically conductive materials may be used which exhibit a stronger cohesion than adhesion to the underlying material (e.g., in order for the conductive material to move/migrate and recrystallize during the anneal) and which begin movement/migration at about one third of its melting point temperature.

Specifically, the cobalt-containing material is deposited in the backside cavities 43' and over the sidewalls of the backside trench 79. In one embodiment, the cobalt-containing material can be deposited directly on the horizontal surfaces of the conductive metallic compound liners 46B, which are remaining portions of the conductive metallic compound layer 462 and metal portions 46W. The deposited cobalt-containing material forms a cobalt-containing material layer 466. Preferably, layer 466 is a continuous or partially continuous material layer. In other words, layer 466 may be continuous (i.e., lacking interruptions) for the entire height of the backside trench 79. Alternatively, layer 466 may be partially continuous in the backside trench 79 such that the vertical portion of layer 466 in trench 79 connects some (e.g., two or more) portions of layer 466 located in the recesses 43 even though the vertical portion of layer 466 in the trench 79 contains one or more interruptions (i.e., discontinuities). In other words, a vertically-extending portion of the deposited cobalt-containing material layer 466 in the trench 79 can be contiguously adjoined to two or more cobalt-containing material layer 466 portions located within each vertically neighboring pair of backside recesses 43. Layer 466 may have any suitable thickness. In one embodiment, layer 466 has a thickness less than 100 nm, such as 10 to 50 nm, including 30 to 40 nm.

In one embodiment, the cobalt-containing material can have a composition in which at least 20 atomic percent (at %) (and preferably over 50 at %, such as 75-100 at %, such as 80-99 at %) of the atoms are cobalt atoms. The cobalt-containing material can be elemental cobalt (i.e., a material consisting essentially of cobalt atoms, e.g., 100 at % Co) or a cobalt-containing metallic alloy in which the atomic concentration of cobalt is at least 20 at % (and preferably over 50 at %). The cobalt-containing material can be deposited by a chemical vapor deposition (CVD) process or an atomic layer deposition (ALD) process that employs a cobalt-containing precursor gas. In one embodiment, the cobalt-containing precursor gas can be free of fluorine, i.e., does not contain fluorine. Chemical vapor deposition or atomic layer deposition of cobalt employs a cobalt precursor that can be easily vaporized to leave high-purity cobalt on a surface without causing surface damage. In one embodiment, an organometallic compound with relatively high vapor pressures and good thermal stability can be employed as the cobalt precursor gas to deposit cobalt without requiring hydrogen. In a non-limiting example, bis(cyclopentadienyl)cobalt, bis(ethylcyclopentadienyl)cobalt, bis(ethylcyclopentadienyl)cobalt, or bis(pentamethylcyclopentadienyl)cobalt can be employed as a cobalt precursor gas in a CVD or ALD process. Alternatively, different precursor gases (such as $Co_2(CO)_8$) can also be employed for cobalt deposition.

The cobalt-containing material can be conformally deposited by the CVD process or the ALD process. Vertically-extending portions of deposited cobalt-containing material cover a predominant percentage (i.e., a percentage over 50%) of the sidewalls of the backside trench 79, and can cover the entirety of the sidewall of the backside trench 79. Particularly, a vertically-extending portion of the deposited cobalt-containing material can cover a portion of the sidewalls of the backside trench 79 between each vertically neighboring pair of backside recesses 43. As deposited, a vertically-extending portion of the deposited cobalt-containing material can be contiguously adjoined to cobalt-containing material portions located within each vertically neighboring pair of backside recesses 43. In one embodiment, the deposited cobalt-containing material can be amorphous or microcrystalline. The grain size of the deposited cobalt-containing material can be limited by the dimensions of the backside cavities 43' in the backside recesses 43. In one embodiment, the deposited cobalt-containing material as deposited can have an average grain size that is less than average height of the backside recesses 43.

Referring to FIG. 8G, the first exemplary structure, which has vertical dielectric surfaces (such as the sidewalls of the backside blocking dielectric layer 52 or the insulating layers 32) in physical contact with vertical surfaces of the deposited cobalt-containing material layer 466, is annealed at an elevated temperature to induce growth of grain size of the deposited cobalt-containing material. In one embodiment, the anneal can be performed in a temperature range from 450 degrees Celsius to 800 degrees Celsius. In one embodiment, the temperature of the anneal can be selected to maximize the grain size of the annealed cobalt-containing material and to separate the continuous layer 466 into discrete regions located in recesses 43. In one embodiment, the temperature of the anneal can be in a range from 475 degrees Celsius to 700 degrees Celsius, and/or can be in a range from 500 degrees Celsius to 600 degrees Celsius, and/or can be in a range from 500 degrees Celsius to 550 degrees Celsius, although lower and higher temperatures can also be employed. The anneal may be conducted for at least 3 minutes, such as 5 to 60 minutes, for example 5 to 10 minutes. Other durations may also be used.

The anneal is performed at an elevated temperature which is believed to cause the vertically-extending portions of the cobalt-containing material layer 466 to migrate into the backside recesses, thereby forming vertically separated cobalt-containing material portions confined within the backside recesses. Thus, the anneal causes the cobalt-containing material portions in the backside recesses 43 to become physically disjoined from each other during or after the anneal to form vertically separate control gates (e.g., word lines). A surface that is not covered by the cobalt-containing material becomes physically exposed in the backside trench during the anneal. Without wishing to be bound by a particular theory, the present inventors believe that the anneal causes the cobalt-containing material portions in the backside recesses 43 to become physically disjoined from each for one or more of the following reasons.

In one non-limiting theory, the conductive metallic compound liners 46B and the metal portions 46W are believed to provide greater adhesion to the cobalt-containing material layer 466 than the dielectric material of the backside blocking dielectric layer 52 (which can be a dielectric metal oxide layer such as an aluminum oxide layer) or the insulting layers 32 (which can be silicon oxide layers). It is believed that cobalt does not wet aluminum oxide very well due to the high contact angle which causes aluminum oxide to act like a hydrophobic surface. Due to the higher adhesion between cobalt and conductive materials (such as titanium nitride and/or tungsten) than between cobalt and aluminum oxide, and due to strong cohesive forces between adjacent cobalt atoms, the cobalt material is believed to pull inwards into the backside recesses 43 to gather into islands during the anneal. Portions of layer 466 are removed from sharp corners of layers 32 and/or 52 exposed in the backside trench 79. Therefore, it is believed that cobalt (or another suitable electrically conductive material with similar migration and adhesion properties) will be pulled away from the aluminum oxide layer 52 with poor wetting towards a surface with better wetting, such as a titanium nitride, tungsten or another suitable surface.

In one embodiment illustrated in FIG. 8F, layer 466 is deposited with a relatively low conformity and may completely fill the cavities 43' in the backside recesses 43. In this embodiment, according to one non-limiting theory, the as-deposited cobalt-containing material layer 466 may have lesser density than bulk cobalt due to nanoscale spaces (cavities) among the clusters or grains of the deposited material. The anneal may recrystallize the cobalt material and reduce the total volume of empty spaces between grains of the cobalt-containing material located in recesses 43. The anneal may thus induce an increase in density of the cobalt-containing material in the backside recesses and shrinkage of the apparent volume of the cobalt-containing material. The volume contraction (with resulting densification) of the cobalt-containing material during the anneal process, in combination with stronger adhesion of the cobalt-containing material to the metallic materials than to the dielectric materials, may cause the cobalt-containing material to move away from the sidewalls of the backside trench 79 (e.g., away from the sidewalls of the backside blocking dielectric layer 52) into the backside recesses 43 to increase the density of the cobalt material in the previously filled recesses 43.

In another embodiment illustrated in FIGS. 10D and 11D and described below, layer 466 is deposited as a thin conformal layer which does not completely fill the backside cavities 43'. This allows the vertical portions of layer 466 to migrate into and fill the cavities 43' in the backside recesses 43. It should be noted that layer 466 may also be deposited as a thin conformal layer in the first and second embodiments illustrated in FIGS. 8A-8G and 9A-9D. Optionally, the insulating layer 32 (i.e., insulating fin protruding toward the backside trench 79) curvature is increased to form a convex sidewall or surface facing away from the memory stack structures 55 (i.e., facing the trench 79) to facilitate cobalt capillary action during the anneal to take advantage of surface tension. Surface tension is increased at the convex portions of the insulating layer 32 fins, which is believed to pull the cobalt material inside the recesses 43 more readily. Cobalt recrystallizes during the anneal. However, it is believed that due to strong adhesion between cobalt and titanium nitride and due to low thickness of the thin conformal layer 466, cobalt is pulled inward to the recesses 43 and is agglomerated in the recesses to form separate control gates/word lines.

While layer 466 is preferably a cobalt-containing layer, in other embodiments, layer 466 may comprise another metal or metal alloy which exhibits the properties described above. The separation of the control gates/word lines by annealing eliminates the etching steps needed for control gate separation and isolation.

The vertically-extending portions of cobalt-containing material can be migrated into the backside recesses 43 by the anneal process performed at the elevated temperature. Each contiguous portion of the cobalt-containing material formed within a backside recess 43 is herein referred to as a cobalt-containing material portion 46C. A pair of cobalt-containing material portions 46C, which is located in a vertically neighboring pair of backside recesses 43 and physically adjoined to each other through a vertically-extending portion of the cobalt-containing material prior to the anneal, becomes physically disjoined from each other during the anneal. A surface that is not covered by the cobalt-containing material becomes physically exposed in the backside trench 79 during the anneal. The surface that is not covered by the cobalt-containing material can be, for example, a sidewall surface of the backside blocking dielectric layer 52, which can be a surface of aluminum oxide. In one embodiment, the cobalt-containing material does not wet dielectric surfaces such as the surfaces of the backside blocking dielectric layer 52. In this case, the cobalt-containing material can be pulled away from the surfaces of the backside blocking dielectric layer 52 to form convex surfaces facing the backside trench 79. In one embodiment, the cobalt-containing material portions 46C located within the backside recesses 43 can form convex sidewall surfaces during the anneal. Each first exemplary electrically conductive line 46 can include a conductive metallic compound liner 46B, an optional metal portion 46W, and a cobalt-containing material portion 46C. Each convex sidewall of the portions 46C can adjoin a respective overlying horizontal surface and a respective underlying horizontal surface (which can be surfaces of the conductive metallic compound liners 46B or surfaces of the backside blocking dielectric layer 52) at acute angles.

Figure 9B:
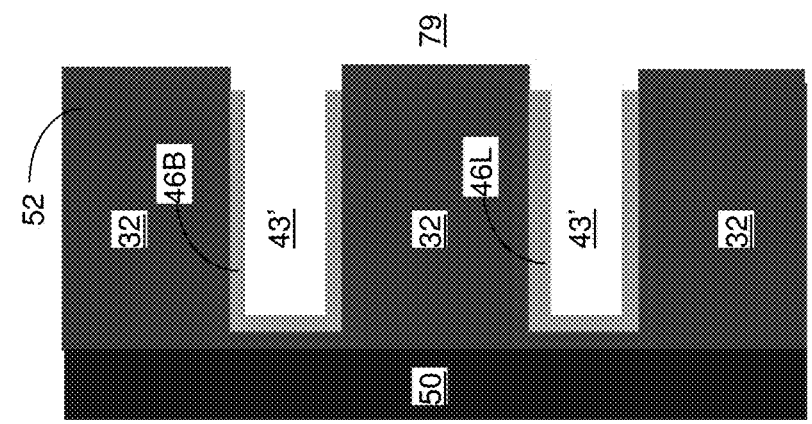
Figure 9A:
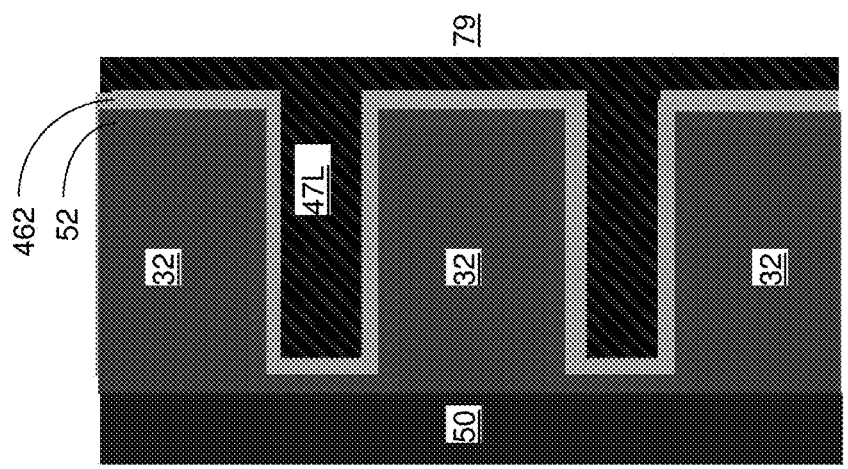

FIGS. 9A-9D illustrate processing steps employed to form second exemplary electrically conductive layers, which are alternative structures for the first exemplary conductive layers in which metal portions 46W are omitted. Referring to FIG. 9A, second exemplary electrically conductive layers can be formed from the structure of FIG. 8C by depositing a sacrificial material layer 47L in the backside recesses 43 and in peripheral portions of the backside trench 79. The sacrificial material layer 47L comprise a material that can be removed selective to the conductive metallic compound layer. For example, the sacrificial material layer 47L can include a semiconductor material (such as polysilicon) or a dielectric material (such as silicon oxide, silicon nitride, or organosilicate glass). The sacrificial material layer 47L can fill the backside cavities 43' within the backside recesses. The sacrificial material layer 47L does not completely fill the backside trench 79.

Referring to FIG. 9B, the sacrificial material layer 47L is partially etched by an etch, which can be an isotropic etch or an anisotropic etch. The etch process partially removes the sacrificial material layer 47L by laterally recessing the sacrificial material layer 47L, and leaves a portion of the sacrificial material layer 47L within each backside recess 43. In one embodiment, the duration of the etch can be selected such that sidewalls of the backside blocking dielectric layer 52 are physically exposed at each level of the insulating layers 32, and the sidewalls of the remaining portions of the sacrificial material layer 47L are laterally recessed from a vertical plane including the sidewalls of the backside blocking dielectric layer 52 by not more than an average height of the backside recesses 43. In one embodiment, the lateral recess distance between the sidewalls of the remaining portions of the sacrificial material layer 47L and the vertical plane including the outer sidewalls of the backside blocking dielectric layer 52 can be in a range from 1 nm to 60 nm, although lesser and greater lateral recess distances can also be employed.

The conductive metallic compound layer 462 is etched while portions of the sacrificial material layer 47L remain in the backside recesses 43. An isotropic etch process or an anisotropic etch process can be employed and physically exposed portions of the conductive metallic compound layer 462 can be etched by the isotropic etch or the anisotropic etch. The vertically-extending portions of the conductive metallic compound layer 462 are removed from above the vertical outer sidewalls of the backside blocking dielectric layer 52 by the etch process. In one embodiment, the etch process that etches the material of the conductive metallic compound layer 462 can be selective to the dielectric material of the backside blocking dielectric layer 52. Each remaining portion of the conductive metallic compound layer 462 constitutes a conductive metallic compound portion 46B. Each conductive metallic compound portion 46B can be spatially confined within a volume of a backside recess 43, exposing layer 52 in the trench 79. Subsequently, the remaining portion of the sacrificial material layer 47L can be removed selective to the conductive metallic compound portions 46B and the backside blocking dielectric layer 52 from the backside recesses 43. In an illustrative example, if the sacrificial material layer 47L includes polysilicon, a reactive ion etch employing at least one fluorocarbon gas and/or at least one hydrofluorocarbon gas can be employed to etch polysilicon selective to metallic materials and dielectric materials. A backside cavity 43' is present within each backside recess after removal of the entirety of the sacrificial material layer 47L. In one embodiment, the outermost portion of each conductive metallic compound liner 46B can be laterally recessed from the sidewalls of the backside blocking dielectric layer 52, or from the sidewalls of the insulating layers 32 in case a backside blocking dielectric layer is not employed.

Referring to FIG. 9C, the processing steps of FIG. 8F can be performed to deposit a cobalt-containing material in the backside recesses 43 and the backside trench 79. A cobalt-containing material layer 466 can be formed in the same manner as in the processing steps of FIG. 8F.

Referring to FIG. 9D, the processing steps of FIG. 8G are preformed to migrate vertically-extending portions of cobalt-containing material over the sidewalls of the backside trench 79 into the backside recesses 43. The same anneal process can be employed as in the processing steps of FIG. 8G. Each contiguous portion of the cobalt-containing material formed within a backside recess 43 is herein referred to as a cobalt-containing material portion 46C. A pair of cobalt-containing material portions 46C, which is located in a vertically neighboring pair of backside recesses 43 and physically adjoined to each other through a vertically-extending portion of the cobalt-containing material prior to the anneal, becomes physically disjoined from each other during the anneal. A surface that is not covered by the cobalt-containing material becomes physically exposed in the backside trench 79 during the anneal. The surface that is not covered by the cobalt-containing material can be, for example, a sidewall surface of the backside blocking dielectric layer 52, which can be a surface of aluminum oxide. In one embodiment, the cobalt-containing material does not wet dielectric surfaces such as the surfaces of the backside blocking dielectric layer 52. In this case, the cobalt-containing material can be pulled away from the surfaces of the backside blocking dielectric layer 52 to form convex surfaces. In one embodiment, the cobalt-containing material portions 46C located within the backside recesses 43 can form convex sidewall surfaces during the anneal. Each second exemplary electrically conductive line 46 can include a conductive metallic compound liner 46B and a cobalt-containing material portion 46C. Each convex sidewall of the portions 46C can adjoin a respective overlying horizontal surface and a respective underlying horizontal surface (which can be surfaces of the conductive metallic compound liners 46B or surfaces of the backside blocking dielectric layer 52) at acute angles.

Figure 10C:
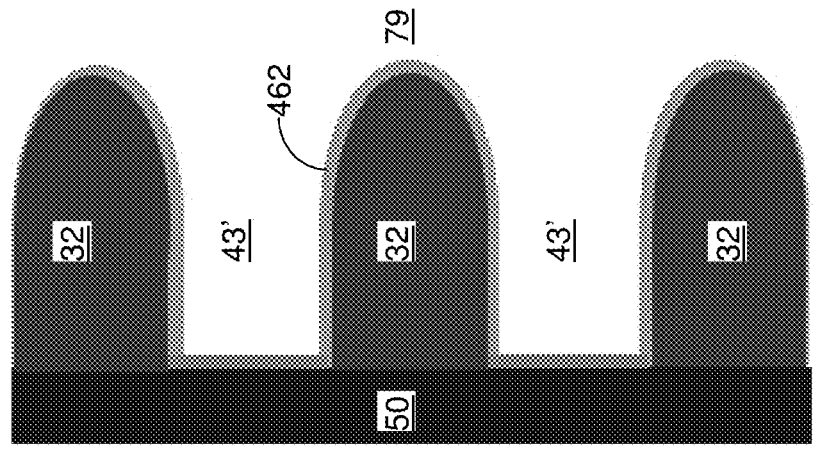
FIGS. 10A-10F are sequential vertical cross-sectional views of a magnified region M in FIG. 7 during formation of third exemplary electrically conductive layers according to a third embodiment of the present disclosure.
Figure 10B:
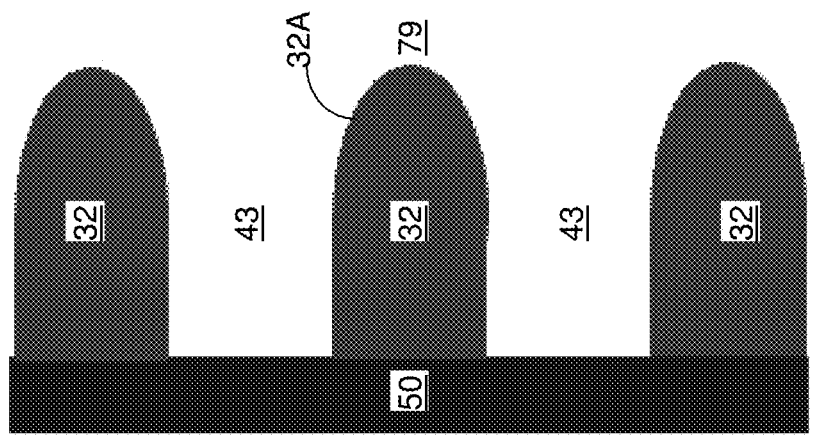
Figure 10A:
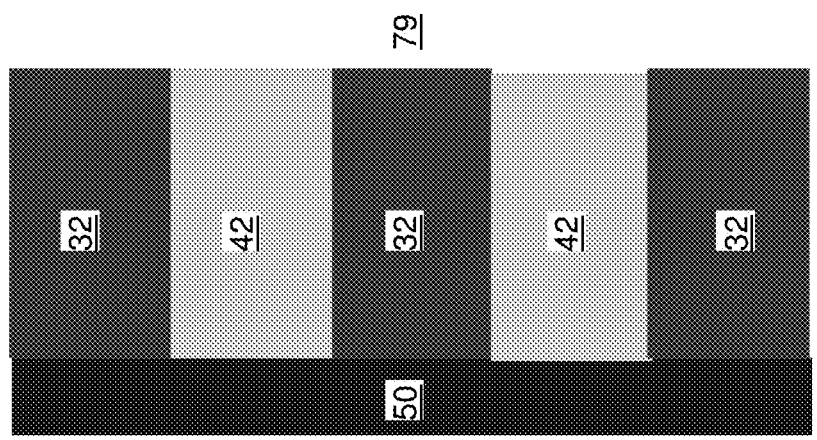

FIGS. 10A-10F illustrate processing steps employed to form third exemplary electrically conductive layers, which are alternative structures for the first and second exemplary conductive layers in which convex surfaces of the insulating layer 32 fins in the trench enhance separation of layer 466 into discrete portions. Referring to FIG. 10A, a vertical cross-sectional view of a magnified region M of FIG. 6A is illustrated, which is prior to removal of the sacrificial material layers 42

Referring to FIG. 10B, the sacrificial material layers 42 can be removed by the selective etch process of FIG. 7 to form the backside recesses 43. Corners of the insulating layers 32 can become rounded to provide convex surfaces 32 in proximity to the backside trench 79. Thus, corner rounding of the insulating layers 32 may occur collaterally as a consequence of the selective etch that removes the second material of the sacrificial material layers 42 selective to the first material of the insulating layers 32. In other words, finite selectivity of the etch process employed to remove the sacrificial material layers 42 selective to the insulating layers 32 can induce corner rounding on the insulating layers 32.

Additionally or alternatively, peripheral portions of the insulating layers 32 can be modified during, or after, formation of the backside recesses 43 to form rounded sidewalls. In this case, non-vertical surfaces of the rounded sidewalls can facilitate migration of a cobalt-containing material during a subsequent anneal process. The modification of the peripheral portions of the insulating layers 32 can be performed by an isotropic etch process, an anisotropic etch process, a thermal anneal of the insulating layers 32, or any combination thereof.

Referring to FIG. 10C, a conductive metallic compound layer 462 can be subsequently deposited in the backside recesses 43 and over the sidewall of the backside trench 79, which are the rounded sidewalls 32A of the insulating layers 32. In one embodiment, the conductive metallic compound layer 462 can have the same composition, and/or the same thickness, as the conductive metallic compound layer 462 of FIG. 8C. The conductive metallic compound layer 462 can be deposited by a conformal deposition process such as chemical vapor deposition (CVD) or atomic layer deposition (ALD). A backside cavity 43', i.e., an unfilled volume, is present within each backside recess 43.

Figure 10F:
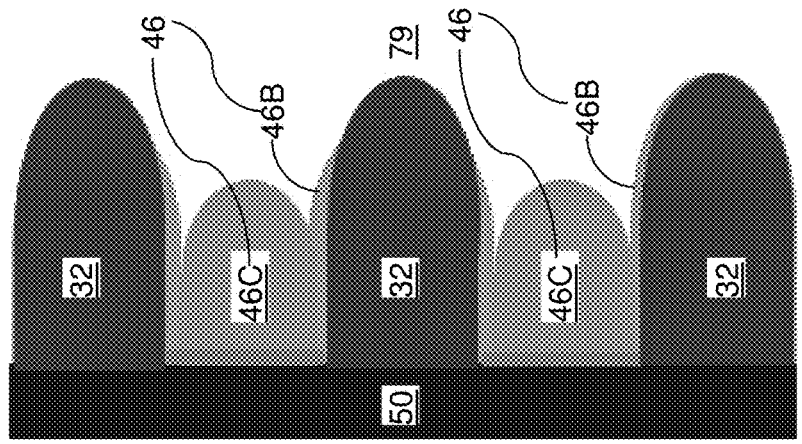
Figure 10E:
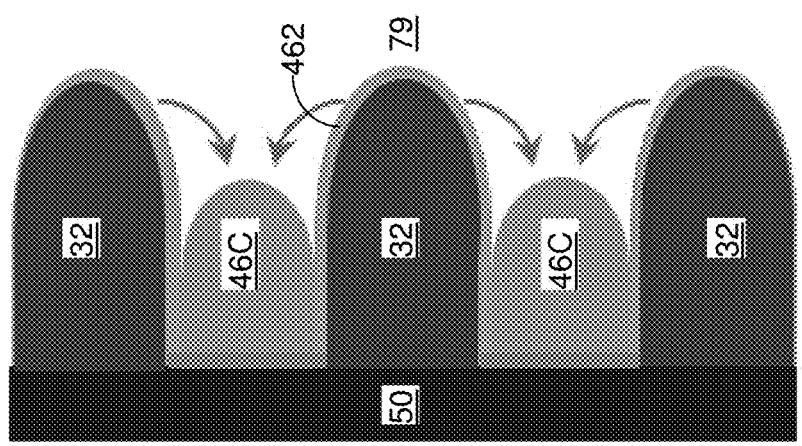
Figure 10D:
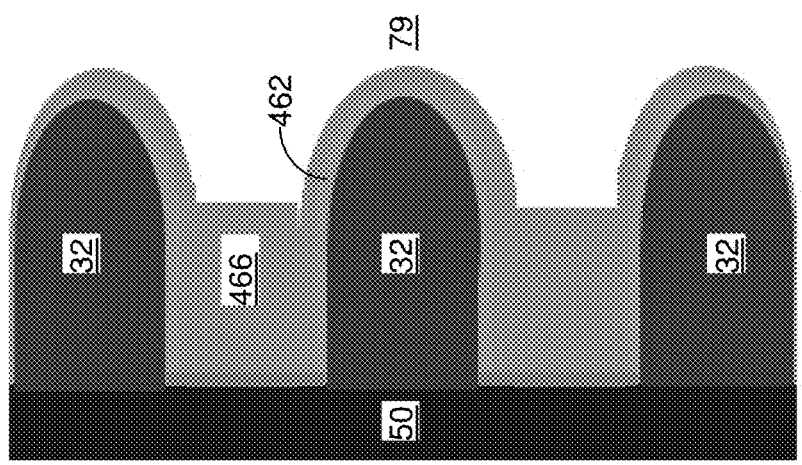

Referring to FIG. 10D, a cobalt-containing material is deposited in the backside recesses 43 and the backside trench 79. Specifically, the cobalt-containing material is deposited in the backside cavities 43' and over the sidewalls of the backside trench 79. In one embodiment, the cobalt-containing material can be deposited directly on the conductive metallic compound layer 462. The deposited cobalt-containing material forms a cobalt-containing material layer 466, which is a continuous material layer. In this embodiment, layer 466 may be a thin continuous layer which does not fully fill the cavities in the backside recesses 43. In this embodiment, the backside blocking dielectric layer 52 may optionally be omitted and a front side blocking dielectric (not shown for clarity) may be deposited into the memory openings prior to the memory film. In this embodiment, layer 462 does not have to be removed from the trench 79 prior to deposition of layer 466.

The cobalt-containing material layer 466 can have the same composition, and/or the same thickness (as measured over a sidewall of the contact trench 79), as the cobalt-containing material layer 466 of FIG. 8F. The cobalt-containing material layer 466 can be formed employing the same processing steps that are employed to form the cobalt-containing material layer 466 of FIG. 8F.

The cobalt-containing material can be conformally deposited by the CVD process or the ALD process. Vertically-extending portions (which can be faceted portions having non-vertical sidewalls) of deposited cobalt-containing material over sidewalls of the backside trench 79 cover a predominant percentage (i.e., a percentage over 50%) of the sidewalls of the backside trench 79, and can cover the entirety of the sidewall of the backside trench 79. Particularly, a vertically-extending portion of the deposited cobalt-containing material can cover a portion of the sidewalls of the backside trench 79 between each vertically neighboring pair of backside recesses 43. As deposited, a vertically-extending portion of the deposited cobalt-containing material can be contiguously adjoined to cobalt-containing material portions located within each vertically neighboring pair of backside recesses 43. In one embodiment, the deposited cobalt-containing material can be amorphous or microcrystalline.

Referring to FIG. 10E, the first exemplary structure, which has non-horizontal (e.g., curved convex dielectric surfaces, such as the sidewalls of the backside blocking dielectric layer 52 or the rounded insulating layers 32) in physical contact with non-horizontal (e.g., vertical or rounded) surfaces of the deposited cobalt-containing material, is annealed at an elevated temperature to induce growth of grain size of the deposited cobalt-containing material. In one embodiment, the anneal can be performed any temperature that can be employed for the anneal process employed at the processing steps of FIG. 8G.

As described above, it is believed that the convex surface facing the trench 79 facilitates cobalt capillary action during and after anneal to taking advantage of surface tension. Surface tension is increased at the convex portions of the insulating layer 32 fins, which is believed to pull the cobalt material inside the recesses 43 more readily. It is believed that strong adhesion between cobalt and titanium nitride in combination with the surface tension of the cobalt-containing material layer 466 caused the cobalt material to be pulled inward to the recesses 43 and to be agglomerated in the recesses 43 to form separate control gates/word lines. Thus, the anneal process causes the cobalt-containing material to move away from the convex surfaces of the conductive metallic compound layer 462 located over convex surfaces 32A of the insulating layer fins, and thus, from the sidewalls of the backside trench 79 into the backside recesses 43. The directions of migration of the cobalt-containing material during the anneal are illustrated with arrows.

Therefore, the vertically-extending portions of cobalt-containing material can be migrated into the backside recesses 43 by the anneal process performed at the elevated temperature, as described above with respect to FIG. 8G. Each contiguous portion of the cobalt-containing material formed within a backside recess 43 is herein referred to as a cobalt-containing material portion 46C. A pair of cobalt-containing material portions 46C, which is located in a vertically neighboring pair of backside recesses 43 and physically adjoined to each other through a vertically-extending portion of the cobalt-containing material prior to the anneal, becomes physically disjoined from each other during the anneal. A surface that is not covered by the cobalt-containing material becomes physically exposed in the backside trench 79 during the anneal. The surface that is not covered by the cobalt-containing material can be, for example, a convex surface of the conductive metallic compound layer 462. In other words, cobalt-containing material can be pulled away from the convex surfaces of the conductive metallic compound layer 462 to form convex surfaces of its own. In one embodiment, the cobalt-containing material portions 46C located within the backside recesses 46 can form convex sidewall surfaces during the anneal.

Referring to FIG. 10F, the conductive metallic compound layer 462 is anisotropically etched after deposition and anneal of the cobalt-containing material, i.e., after formation of the cobalt-containing material portions 46C. The vertically-extending portions of the conductive metallic compound layer 462, which are physically exposed during the anisotropic etch process, are removed from the sidewalls of the backside trench 79 (which comprise convex sidewalls of the insulating layers 32). Each remaining portion of the conductive metallic compound layer 462 constitutes a conductive metallic compound liner 46B. Each third exemplary electrically conductive line 46 can include a conductive metallic compound liner 46B and a cobalt-containing material portion 46C. Each convex sidewall of the portion 46C can adjoin a respective overlying horizontal surface and a respective underlying horizontal surface (which can be surfaces of the conductive metallic compound liners 46B or surfaces of the insulating layers 32) at acute angles.

Figure 11C:
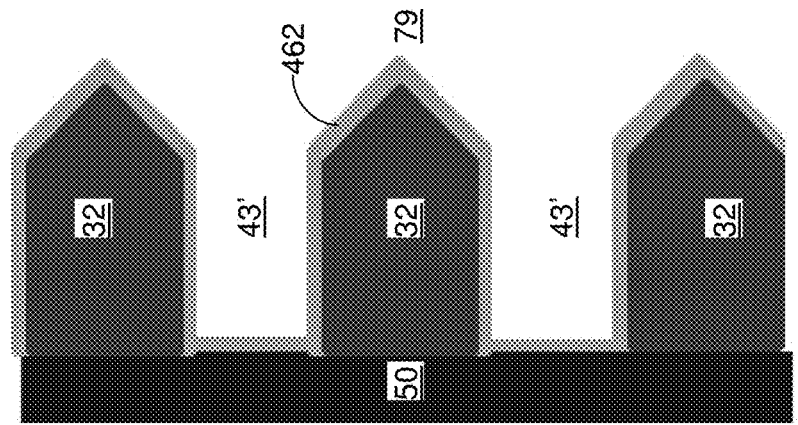
FIGS. 11A-11F are sequential vertical cross-sectional views of a magnified region M in FIG. 7 during formation of fourth exemplary electrically conductive layers according to a fourth embodiment of the present disclosure.
Figure 11B:
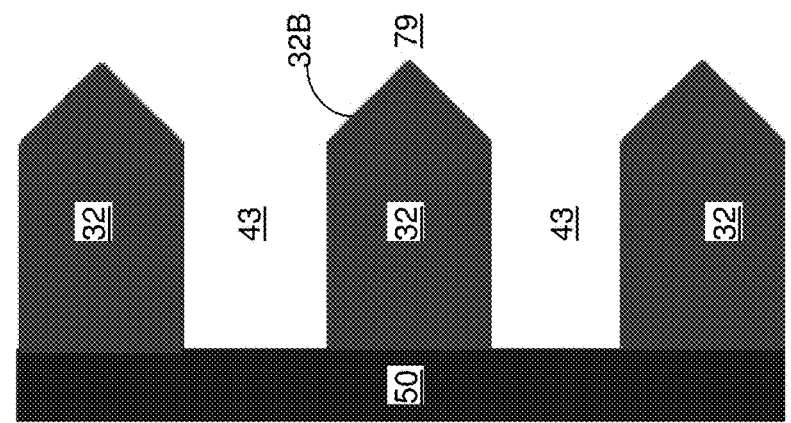
Figure 11A:
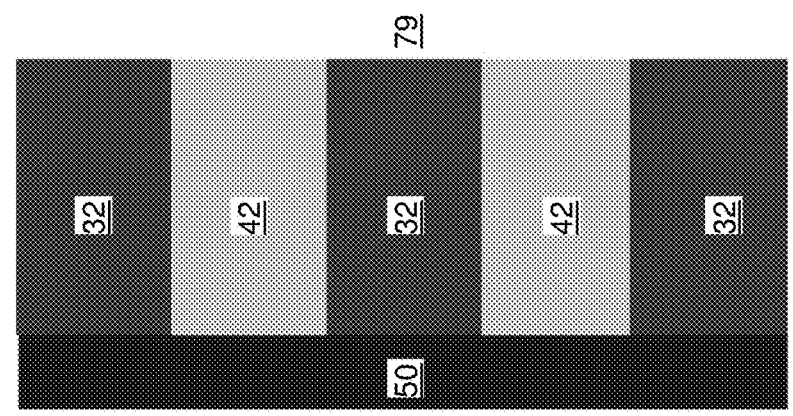

FIGS. 11A-11F illustrate processing steps employed to form fourth exemplary electrically conductive layers, which are alternative structures of the first through third exemplary conductive layers. The structures of this embodiment are similar to those of the prior embodiment, except that the convex surfaces 32B of the insulating layer 32 fins have a planar surface rather than a rounded surface. Referring to FIG. 11A, a vertical cross-sectional view of a magnified region M of FIG. 6A is illustrated, which is prior to removal of the sacrificial material layers 42.

Referring to FIG. 11B, the sacrificial material layers 42 can be removed by the selective etch process of FIG. 7 to form the backside recesses 43. Corners of the insulating layers 32 can become faceted to provide tapered surfaces 32B in proximity to the backside trench 79. As used herein, a tapered surface refers to a substantially planar surface that is not horizontal and not vertical. The tapered surfaces of the insulating layers 32 may occur with, or without, corner rounding illustrated in FIG. 10B. Faceting of the surfaces of the insulating layers 32 may occur collaterally as a consequence of the selective etch that removes the second material of the sacrificial material layers 42 selective to the first material of the insulating layers 32 to form a sharp tip facing the trench 79.

Additionally or alternatively, peripheral portions of the insulating layers 32 can be modified during, or after, formation of the backside recesses 43 to form tapered sidewalls. In this case, non-vertical surfaces of the tapered sidewalls can facilitate migration of a cobalt-containing material during a subsequent anneal process. The modification of the peripheral portions of the insulating layers 32 can be performed by an isotropic etch process, an anisotropic etch process, a thermal anneal of the insulating layers 32, or any combination thereof.

Referring to FIG. 11C, a conductive metallic compound layer 462 can be subsequently deposited in the backside recesses 43 and over the sidewall of the backside trench 79, which are the tapered sidewalls 32B of the insulating layers 32. In one embodiment, the conductive metallic compound layer 462 can have the same composition, and/or the same thickness, as the conductive metallic compound layer 462 of FIG. 8C. The conductive metallic compound layer 462 can be deposited by a conformal deposition process such as chemical vapor deposition (CVD) or atomic layer deposition (ALD). A backside cavity 43', i.e., an unfilled volume, is present within each backside recess 43.

Figure 11F:
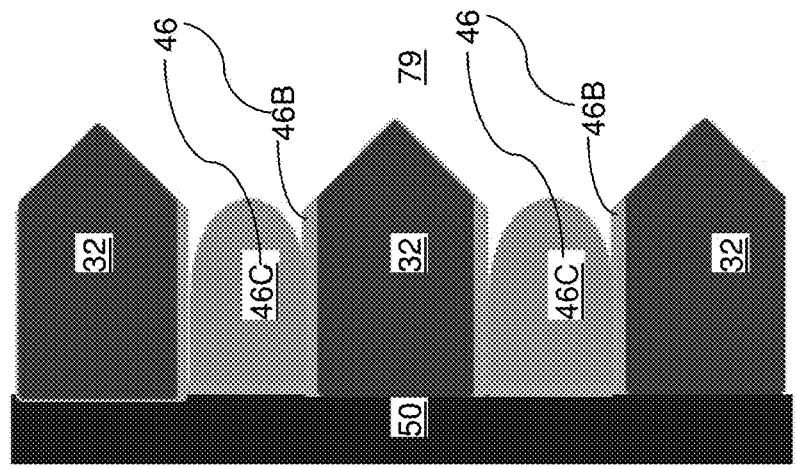
Figure 11E:
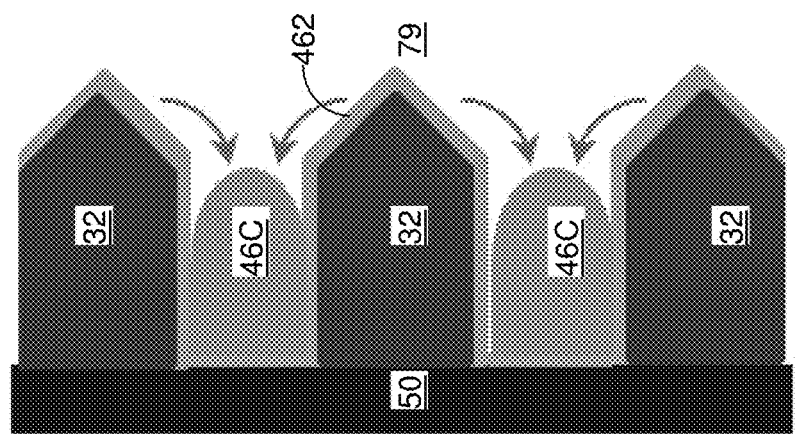
Figure 11D:
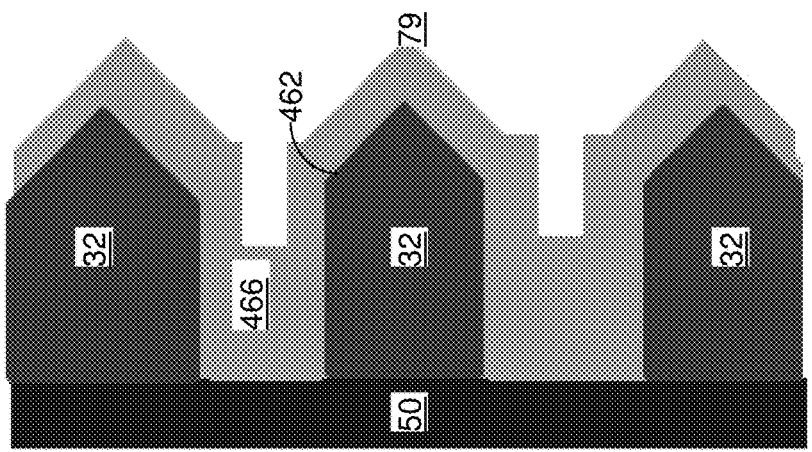

Referring to FIG. 11D, a cobalt-containing material is deposited in the backside recesses 43 and the backside trench 79. Specifically, the cobalt-containing material is deposited in the backside cavities 43' and over the sidewalls of the backside trench 79. The cobalt-containing material can be deposited directly on the conductive metallic compound layer 462. The deposited cobalt-containing material forms a cobalt-containing material layer 466, which is a continuous material layer. Layer 466 may also be a thin conformal layer which partially fills the recesses 43.

The cobalt-containing material layer 466 can have the same composition, and/or the same thickness (as measured over a sidewall of the contact trench 79), as the cobalt-containing material layer 466 of FIG. 8F. The cobalt-containing material layer 466 can be formed employing the same processing steps that are employed to form the cobalt-containing material layer 466 of FIG. 8F.

The cobalt-containing material can be conformally deposited by the CVD process or the ALD process. Vertically-extending portions (which can be tapered portions having non-vertical sidewalls) of deposited cobalt-containing material over sidewalls of the backside trench 79 cover a predominant percentage (i.e., a percentage over 50%) of the sidewalls of the backside trench 79, and can cover the entirety of the sidewall of the backside trench 79. Particularly, a vertically-extending portion of the deposited cobalt-containing material can cover a portion of the sidewalls of the backside trench 79 between each vertically neighboring pair of backside recesses 43. As deposited, a vertically-extending portion of the deposited cobalt-containing material can be contiguously adjoined to cobalt-containing material portions located within each vertically neighboring pair of backside recesses 43. In one embodiment, the deposited cobalt-containing material can be amorphous or microcrystalline.

Referring to FIG. 11E, the first exemplary structure, which has non-horizontal (e.g., tapered dielectric surfaces 32B, such as the sidewalls of the backside blocking dielectric layer 52 or the insulating layers 32) in physical contact with non-horizontal (e.g., vertical or tapered) surfaces of the deposited cobalt-containing material, is annealed at an elevated temperature to induce growth of grain size of the deposited cobalt-containing material. In one embodiment, the anneal can be performed any temperature that can be employed for the anneal process employed at the processing steps of FIG. 8G.

The vertically-extending portions of cobalt-containing material can be migrated into the backside recesses 43 by the anneal process performed at the elevated temperature, as described above. Each contiguous portion of the cobalt-containing material formed within a backside recess 43 is herein referred to as a cobalt-containing material portion 46C. A pair of cobalt-containing material portions 46C, which is located in a vertically neighboring pair of backside recesses 43 and physically adjoined to each other through a vertically-extending portion of the cobalt-containing material (over the faceted surfaces of the insulating layers 32) prior to the anneal, becomes physically disjoined from each other during the anneal. A surface that is not covered by the cobalt-containing material becomes physically exposed in the backside trench 79 during the anneal. The surface that is not covered by the cobalt-containing material can be, for example, a faceted surface of the conductive metallic compound layer 462. In other words, cobalt-containing material can be pulled away from the faceted surfaces of the conductive metallic compound layer 462 to form convex surfaces. In one embodiment, the cobalt-containing material portions 46C located within the backside recesses 46 can form convex sidewall surfaces during the anneal.

Referring to FIG. 11F, the conductive metallic compound layer 462 is anisotropically etched after deposition and anneal of the cobalt-containing material, i.e., after formation of the cobalt-containing material portions 46C. The vertically-extending portions of the conductive metallic compound layer 462, which are physically exposed during the anisotropic etch process, are removed from the sidewalls of the backside trench 79 (which comprise convex sidewalls of the insulating layers 32). Each remaining portion of the conductive metallic compound layer 462 constitutes a conductive metallic compound liner 46B. Each fourth exemplary electrically conductive line 46 can include a conductive metallic compound liner 46B and a cobalt-containing material portion 46C. Each convex sidewall of the portions 46C can adjoin a respective overlying horizontal surface and a respective underlying horizontal surface (which can be surfaces of the conductive metallic compound liners 46B or surfaces of the insulating layers 32) at acute angles.

Figure 12:
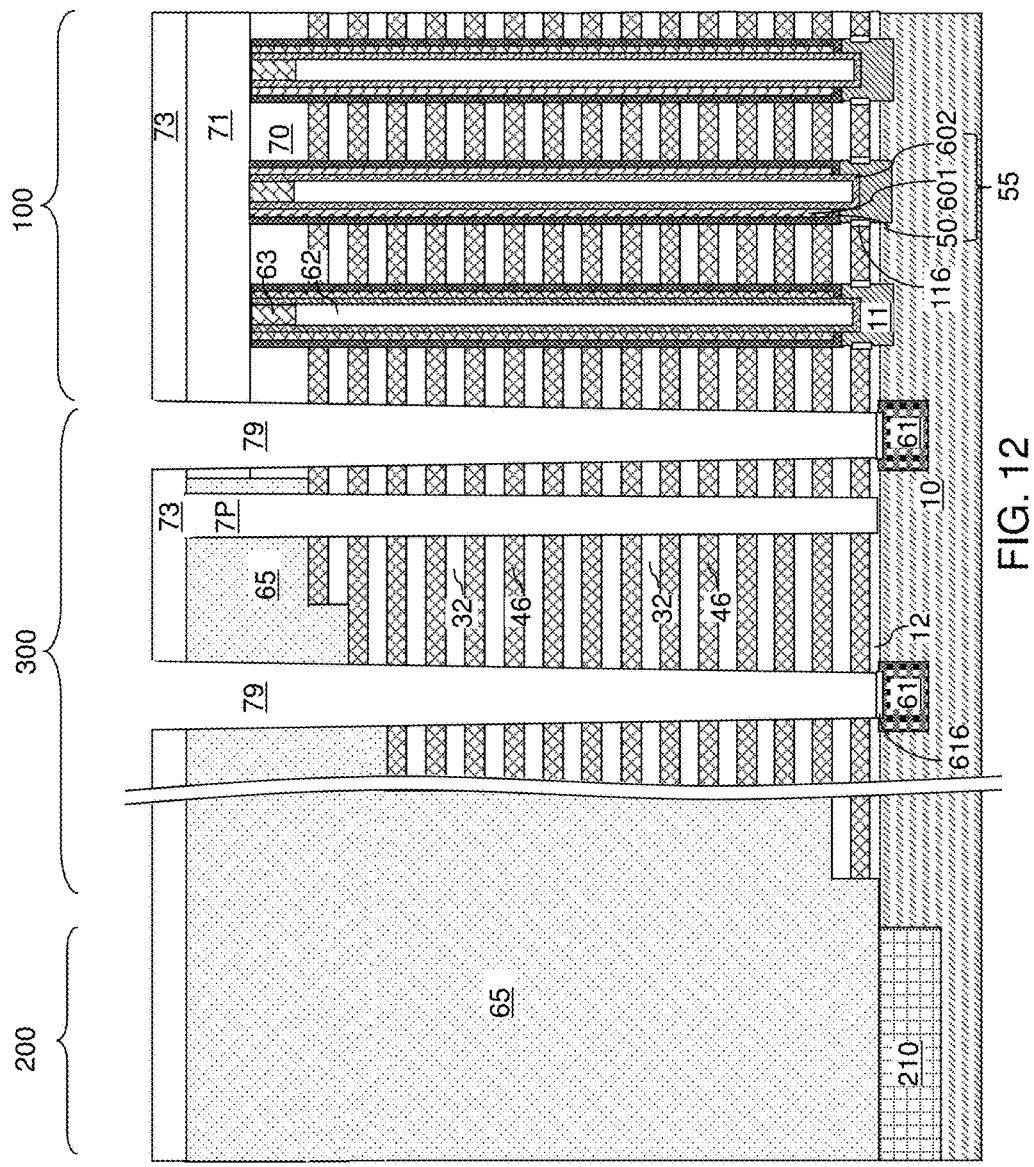
FIG. 12 is a vertical cross-sectional view of the first exemplary structure after formation of electrically conductive lines according to an embodiment of the present disclosure.

Referring to FIG. 12, the first exemplary structure is shown after formation of a plurality of electrically conductive layers 46, which can be a set of first exemplary electrically conductive layers 46 illustrated in FIG. 8G, a set of second exemplary electrically conductive layers 46 illustrated in FIG. 9D, a set of third exemplary electrically conductive layers 46 illustrated in FIG. 10F, or a set of fourth exemplary electrically conductive layers 46 illustrated in FIG. 11F.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

Figure 13A:
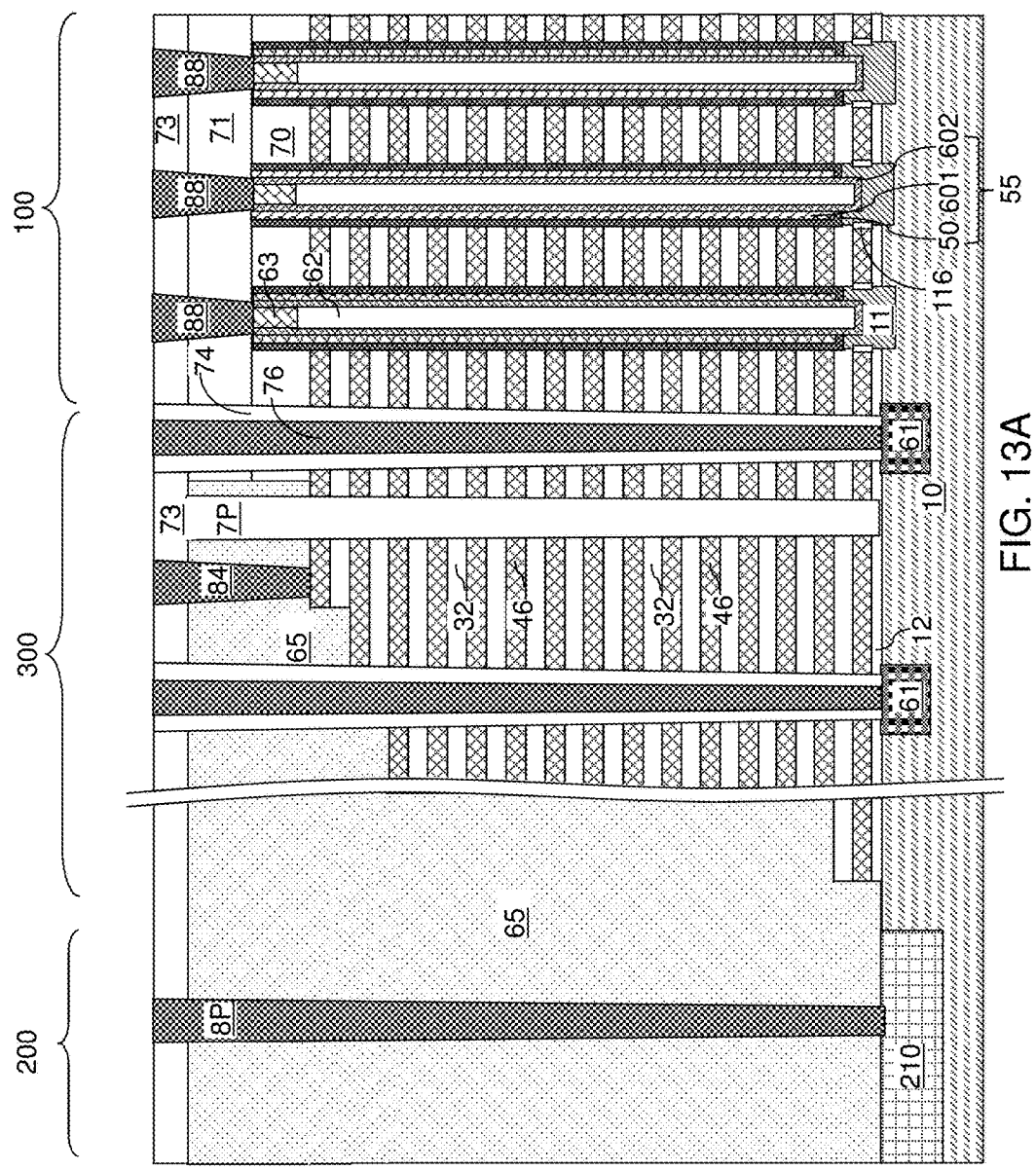
FIG. 13A is a vertical cross-sectional view of the first exemplary structure after formation of various contact via structures according to an embodiment of the present disclosure.
Figure 13B:
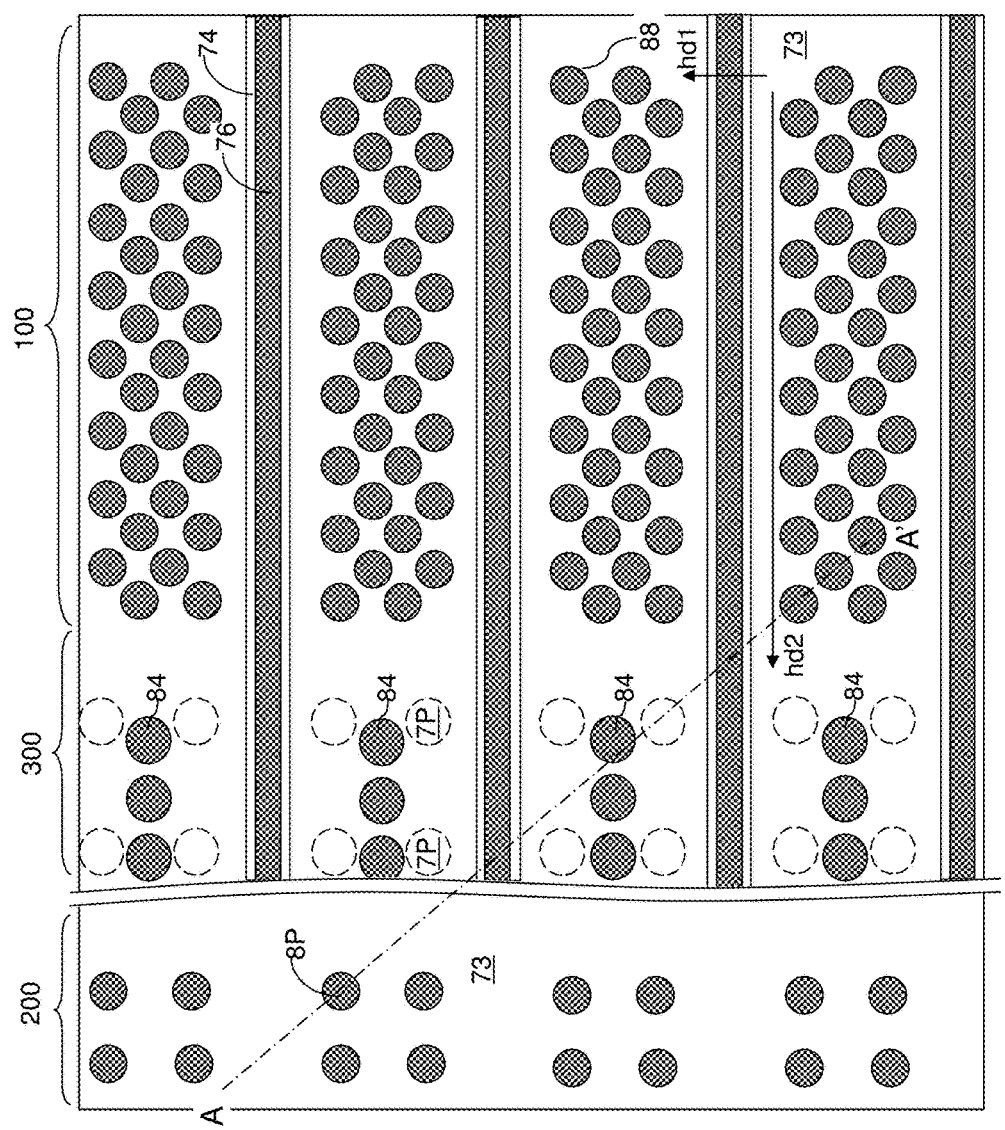
FIG. 13B is a see-through top-down view of the first exemplary structure of FIG. 13A. The vertical plane A-A' is the plane of the vertical cross-sectional view of FIG. 13A.

Referring to FIGS. 13A and 13B, an insulating spacer 74 can be formed on the sidewalls of each backside trench 79 by deposition of a contiguous dielectric material layer and an anisotropic etch of its horizontal portions. Each insulating spacer 74 includes a dielectric material, which can comprise, for example, silicon oxide, silicon nitride, a dielectric metal oxide, a dielectric metal oxynitride, or a combination thereof. The thickness of each insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the first exemplary structure (which can be, for example, the dielectric pillar material layer 73) and in the cavity laterally surrounded by the insulating spacer 74, and is lithographically patterned to form various openings in the device region 100, the peripheral device region 200, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive structure.

In an illustrative example, drain contact via cavities can be formed over each memory stack structure 55 in the device region 100 such that a top surface of a drain region 63 is physically exposed at the bottom of each drain contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices 210 to be contacted by a contact via structure in the peripheral device region.

The various via cavities can be filled with at least one conductive material, which ca be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Drain contact via structures 88 can be formed on the respective drain regions 63. Word line contact via structures 84 can be formed on the respective electrically conductive layers 46. Peripheral device contact via structures 8P can be formed on the respective nodes of the peripheral devices 210. A backside contact via structure 76 can be formed within each cavity laterally surrounded by an insulating spacer 74. Additional metal interconnect structures (not shown) and interlayer dielectric material layers (not) shown can be formed over the first exemplary structure to provide electrical wiring among the various contact via structures.

The first exemplary structure can include a three-dimensional memory device. The three-dimensional memory device can include an alternating stack of insulating layers 32 and electrically conductive layers 46 and located over a semiconductor substrate layer 10, and memory stack structures 55 extending through the alternating stack (32, 46). Each of the electrically conductive layers 46 comprises at least a cobalt-containing material portion 46C. The cobalt-containing material portions 46 have convex sidewalls. In one embodiment, more than 50% of all cobalt-containing material portions 46C can have convex sidewalls. In one embodiment, more than 75% of all cobalt-containing material portions 46C can have convex sidewalls. In one embodiment, more than 90% of all cobalt-containing material portions 46C can have convex sidewalls. In one embodiment, more than 98% of all cobalt-containing material portions 46C can have convex sidewalls. In one embodiment, more than 99% of all cobalt-containing material portions 46C can have convex sidewalls facing away from the memory stack structures 55 and toward the structure 76. In one embodiment, all cobalt-containing material portions 46C can have convex sidewalls.

In one embodiment, an insulating spacer 74 can be located within a backside trench that extends through the alternating stack (32, 46). A contact via structure 76 can be embedded within the insulating spacer 74. The convex sidewalls of the cobalt-containing material portions 46C can contact surfaces of the insulating spacer 74. In one embodiment, each cobalt-containing material portion 46C that has a convex sidewall can have a substantially vertical sidewall at an opposite side of the convex sidewall, i.e., a vertical sidewall that contacts a vertical sidewall of a conductive metallic compound liner 46B or a vertical sidewall of a metal portion 46W.

In one embodiment, each electrically conductive layer 46 can comprise a conductive metallic compound liner 46B contacting a respective cobalt-containing material portion 46C. In one embodiment, the conductive metallic compound liner 46B can contact a vertical sidewall surface, a planar top surface, and a planar bottom surface of the respective cobalt-containing material portion 46C. In one embodiment, each electrically conductive layer 46 can comprise a metal portion 46W contacting a sidewall of a respective conductive metallic compound liner 46B and a vertical sidewall surface, a planar top surface, and a planar bottom surface of the respective cobalt-containing material portion 46C. In one embodiment, the metal portion 46W can comprise tungsten.

In one embodiment, the three-dimensional memory device can include a backside trench 79 that extends through the alternating stack (32, 42), and a backside blocking dielectric layer 52 located on sidewalls of the backside trench 79 and between each neighboring pair of an insulating layer 32 and an electrically conductive layer 46. In one embodiment, the insulating layers 32 can have a convex surface having rounded sidewalls or tapered sidewalls facing the structure 76 in trench 79.

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (e.g., of the semiconductor substrate layer 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the first exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

FIG. 14A illustrates the cobalt layer 466 located in the recesses 43 and in trench 79 after a 400° C. anneal conducted for 5 minutes. Layer 466 fills the entire recesses 43. Vertical portions 466V of layer 466 located in the trench connect adjacent horizontal portions 466H of layer 466 located in the recesses 43. FIG. 14B illustrates the cobalt layer 466 of FIG. 14A after a five minute anneal at 500° C. The vertical portions 466A of layer 466 are gone and only the horizontal portions 466H of layer 466 remain in the respective recesses as portions 46C described above without etching layer 466.

FIG. 14C illustrates a 30 nm thick conformal cobalt layer 466 deposited on aluminum oxide backside blocking dielectric layer 52 located in the trench 79 and on the partially recessed TiN and W portions 46B and 46W, respectively, located in the recesses 43. Vertical portions 466V of layer 466 located in the trench connect adjacent horizontal portions 466H of layer 466 located in the recesses 43. FIG. 14D illustrates the recrystallized cobalt layer 466 of FIG. 14C after a five minute anneal at 500° C. The vertical portions 466A of layer 466 are gone and only the horizontal portions 466H of layer 466 remain in the respective recesses as portions 46C described above. The thickness of layer 466 may be increased such that portions 46C completely fill the recesses 43 without etching layer 466.

Thus, in general, a method of forming a three-dimensional memory device according to various embodiments of the present disclosure includes forming an alternating stack of insulating layers and spacer material layers over a substrate, forming an opening extending through the alternating stack, forming recesses by removing the spacer material layers with respect the insulating layers, depositing a continuous metal layer in the backside recesses and the opening, where a vertically-extending portion of deposited continuous metal layer covers a portion of a sidewall of the opening between a vertically neighboring pair of the recesses, and performing an anneal to separate the continuous metal layer into discrete metal portions. The method also includes forming a tunneling dielectric and a vertical semiconductor channel extending through the alternating stack.

In the prior embodiments, the discrete metal portions comprise control gates (i.e., word lines). However, in the following embodiments, the discrete metal portions may also comprise floating gate structures (i.e., floating gates). In these embodiments, the opening may comprise a memory opening (rather than a backside trench), forming the recesses may comprises forming lateral front side recesses by recessing sidewalls of the spacer material layers in the memory opening with respect to sidewalls of the insulating layers, and forming the tunneling dielectric and the vertical semiconductor channel may comprise sequentially forming a tunneling dielectric layer and a vertical semiconductor channel in the memory opening over the metal floating gate structures. In the embodiments of the present disclosure, the spacer material layers are formed as, or replaced with, electrically conductive layers that function as control gate electrodes.

Thus, according to another aspect of the present disclosure, floating gate electrodes can be formed self-agglomeration of a metallic material. A second exemplary structure is employed hereafter to describe formation of the floating gate electrodes through self-agglomeration of the metallic material within lateral recesses of a memory opening. The second exemplary structure can be derived from the first exemplary structure of FIG. 1. Specifically, the processing sequence after formation of the memory openings 49 can be modified to implement the various embodiments for forming the floating gate electrodes employing self-agglomeration of the metallic material. Different types of memory stack structures may be formed depending on embodiments of the present disclosure.

Figures 15E, 15F:
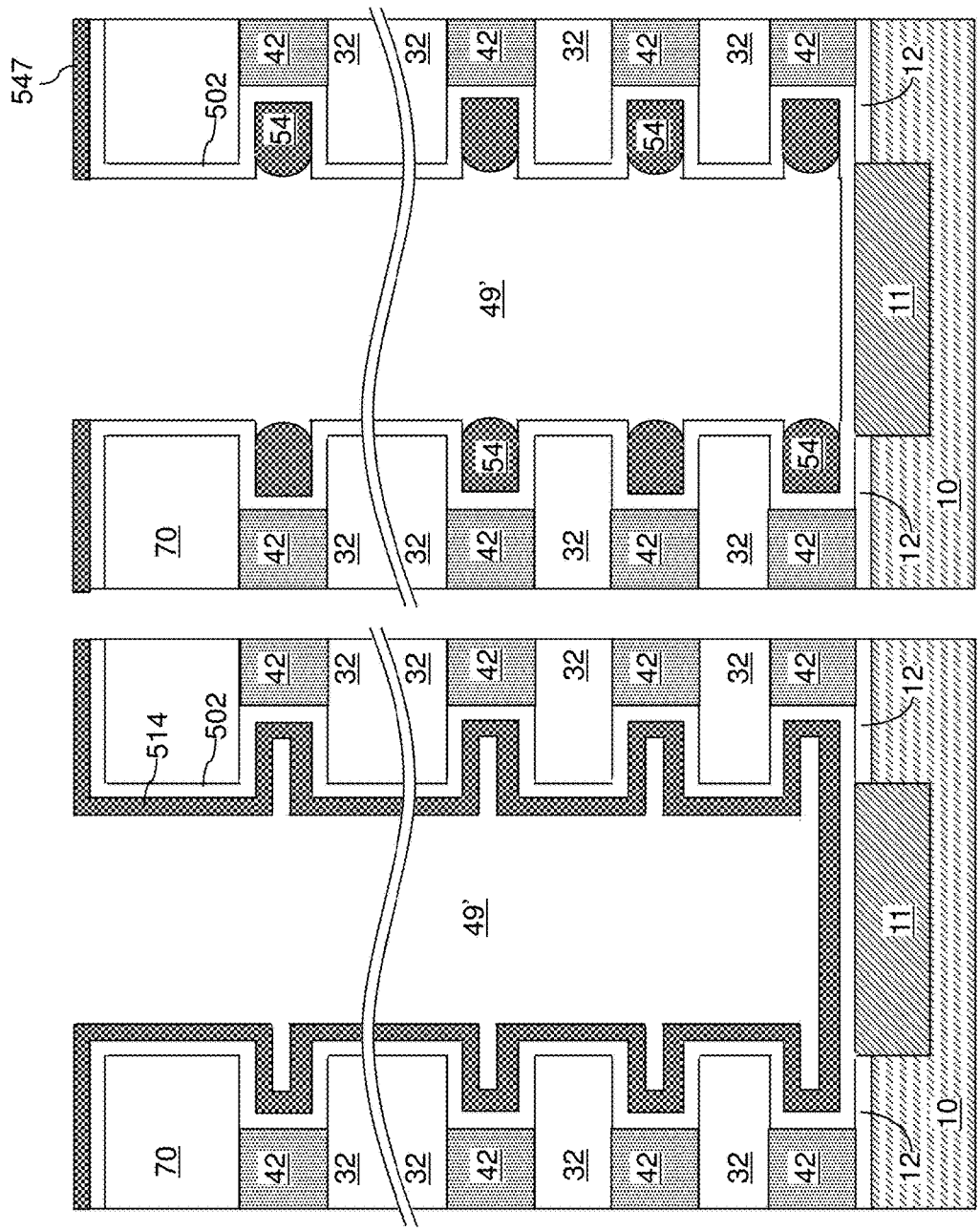

FIGS. 15A-15J illustrate a memory opening 49 during formation of a first exemplary memory stack structure, multiple instances of which can be incorporated into the memory openings of the second exemplary structure according to an embodiment of the present disclosure. Referring to FIG. 15A, a memory opening 49 extending through the alternating stack (32, 42) is illustrated. The memory opening 49 of FIG. 15A can be the same as the memory opening of FIG. 2A. Referring to FIG. 15B, an epitaxial channel portion 11 can be optionally grown from the bottom surface of the memory opening 49, which can have a physically exposed semiconductor surface (such as the semiconductor surface of the substrate semiconductor layer 10). The same processing steps can be employed as the processing steps of FIG. 2B. In one embodiment, the duration of the selective epitaxy process can be selected such that the top surface of the epitaxial channel portion does not contact the sidewall surfaces of the sacrificial material layers 42.

Referring to FIG. 15C, lateral recesses 143 can be formed in the memory opening 49 at each level of the spacer material layers (such as the sacrificial material layers 42) by laterally recessing the sidewalls of the spacer material layers (such as the sacrificial material layers 42) with respect to sidewalls of the insulating layers 32. The lateral recessing of the spacer material layers with respect to the insulating layers 32 can be performed, for example, by an isotropic etch that employs an etchant that etches the material of the spacer material layers selective to the insulating layers 32. In an illustrative example, in case the spacer material layers are sacrificial material layers 42 including silicon nitride and the insulating layers 32 are silicon oxide layers, a wet etch employing hot phosphoric acid may be employed to laterally recess the silicon nitride material of the sacrificial material layers 42 selective to the material of the insulating layers 32. The lateral recess distance, i.e., the lateral distance between a recessed sidewall of a sacrificial material layer 42 and a most proximate sidewall of an insulating layer 32, can be in a range from 5 nm to 60 nm, such as 10 nm to 30 nm, although lesser and greater lateral recess distances can also be employed. While an embodiment in which the spacer material layers comprise sacrificial material layers 42 is employed herein to describe the present disclosure, embodiments are expressly contemplated herein in which the spacer material layers are formed as electrically conductive layers.

Referring to FIG. 15D, a blocking dielectric layer 502 can be formed on physically exposed surfaces of the memory opening 49. The blocking dielectric layer 502 can include a single dielectric material layer or a layer stack of multiple dielectric material layers. The blocking dielectric layer 502 can be deposited on the sidewalls of each memory opening 49 by a conformal deposition method. The blocking dielectric layer 502 can be deposited, for example, by chemical vapor deposition (CVD), atomic layer deposition (ALD), pulsed laser deposition (PLD), liquid source misted chemical deposition, or a combination thereof. The blocking dielectric layer 502 can subsequently function as a dielectric material portion that blocks leakage of stored electrical charges to control gate electrodes.

In one embodiment, the blocking dielectric layer 502 includes a dielectric metal oxide. As used herein, a dielectric metal oxide refers to a dielectric material that includes at least one metallic element and at least oxygen. Alternatively or additionally, the blocking dielectric layer 502 can include silicon oxide, silicon oxynitride, silicon nitride, or a combination thereof. In one embodiment, the blocking dielectric layer 502 can include at least a silicon oxide layer. Alternatively or additionally, the blocking dielectric layer 502 can include at least an aluminum oxide layer. The blocking dielectric layer 502 can be formed by a conformal deposition method such as low pressure chemical vapor deposition, atomic layer deposition, or a combination thereof. The thickness of the blocking dielectric layer 502 can be in a range from 1 nm to 20 nm, although lesser and greater thicknesses can also be employed. The thickness of the blocking dielectric layer 502 can be less than one half of the height of the sacrificial material layers 42 so that an annular lateral cavity that protrudes outward from a cylindrical volume is present at each level of the sacrificial material layers 42. The blocking dielectric layer 502 can continuously extend from a bottommost layer of the alternating stack (32, 42) to a topmost layer of the alternating stack (32, 42), and can be deposited over the insulating cap layer 70. The unfilled volume of the memory opening 49 is herein referred to as a memory cavity 49' and the unfilled volume of the recesses 143 is shown by reference number 143'.

Referring to FIG. 15E, a continuous metal layer 514 can be deposited on the blocking dielectric layer 502. The continuous metal layer 514 can be deposited over sidewalls of the spacer material layers (e.g., the sacrificial material layers 42) and the insulating layers 32. In one embodiment, the continuous metal layer 514 can be deposited as a conformal metal layer having a substantially uniform thickness throughout.

The continuous metal layer 514 includes an electrically conductive material which can be separated into separate portions during a subsequent anneal process, and is herein referred to as a self-agglomerating conductive material, i.e., a conductive material that exhibiting self-agglomeration upon anneal at an elevated temperature. Preferably, the electrically conductive material includes a cobalt-containing material and/or a nickel containing material. Alternatively, other electrically conductive materials may be used which exhibit an agglomerating property upon an anneal. For example, the electrically conductive material may consist essentially of cobalt, nickel, or an alloy of cobalt and nickel.

The self-agglomerating conductive material of the continuous metal layer 514 can be deposited directly on the blocking dielectric layer 502 to extend into the recesses 143'. If the blocking dielectric layer 502 is omitted, then the continuous metal layer 514 is deposited on layers 32 and 42 of the alternating stack. A backside blocking dielectric layer is then formed through the backside recesses as will be described in more detail below. In one embodiment, the self-agglomerating conductive material can have a composition in which at least 20 atomic percent (at %) (and preferably over 50 at %, such as 75-100 at %, such as 80-99 at %) of the atoms are cobalt atoms. The self-agglomerating conductive material can be elemental cobalt (i.e., a material consisting essentially of cobalt atoms, e.g., 100 at % Co) or a cobalt-containing metallic alloy in which the atomic concentration of cobalt is at least 20 at % (and preferably over 50 at %). The cobalt-containing material can be deposited by a chemical vapor deposition (CVD) process or an atomic layer deposition (ALD) process that employs a cobalt-containing precursor gas. In one embodiment, the cobalt-containing precursor gas can be free of fluorine, i.e., does not contain fluorine. Chemical vapor deposition or atomic layer deposition of cobalt employs a cobalt precursor that can be easily vaporized to leave high-purity cobalt on a surface without causing surface damage. In one embodiment, an organometallic compound with relatively high vapor pressures and good thermal stability can be employed as the cobalt precursor gas to deposit cobalt without requiring hydrogen. In a non-limiting example, bis(cyclopentadienyl)cobalt, bis(ethylcyclopentadienyl)cobalt, bis(ethylcyclopentadienyl)cobalt, or bis(pentamethylcyclopentadienyl)cobalt can be employed as a cobalt precursor gas in a CVD or ALD process. Alternatively, different precursor gases (such as $Co_2(CO)_8$) can also be employed for cobalt deposition. The continuous metal layer 514 can form a continuous material layer without any hole therein. In one embodiment, the deposited cobalt-containing material can be amorphous or microcrystalline.

The thickness of the continuous metal layer 514 can be selected such that the lateral recesses are not completely filled by the continuous metal layer 514. Thus, lateral recesses reduced in volume can exist at each level of the sacrificial material layers 42 after deposition of the continuous metal layer 514. In one embodiment, the thickness of the continuous metal layer 514 can be selected such that the total volume of the continuous metal layer 514 in the memory cavity 49' is about the same as the total volume of the recesses 143' exposed in the memory cavity 49'. Another way of phrasing this is that the thickness of the continuous metal layer 514 can be selected such that the total volume of the continuous metal layer 514 at the level of a sacrificial material layer 42 and an adjacent insulating material layer 32 is approximately the same as the total volume of a lateral recess at the level of the sacrificial material layer 42 prior to deposition of the continuous metal layer 514. In an illustrative example, the thickness of the continuous metal layer 514 may be in a range from 2 nm to 10 nm, although lesser and greater thicknesses can also be employed.

Referring to FIG. 15F, an anneal process is performed at an elevated temperature to induce surface diffusion and agglomeration of the material of the continuous metal layer 514 into discrete metal portions within the unfilled volumes of the lateral recesses at each level of the sacrificial material layers 42. The elevated temperature of the anneal process can be selected such that sufficient surface diffusion of the material of the continuous metal layer 514 occurs on the surfaces of the blocking dielectric material layer 502 without melting the metal of the continuous metal layer 514. As discussed above, the material of the continuous metal layer 514 is selected such that the material of the continuous metal layer 514 exhibits spontaneous agglomeration. Without wishing to be bound by any particular theory, it is believed that the tendency of some metals to minimize the surface area through surface tension is believed to be a driving mechanism for spontaneous agglomeration. Metals exhibiting such spontaneous agglomeration include cobalt and nickel. In one embodiment, the anneal process may be performed at an elevated temperature within a range from 600 degrees Celsius to 1,200 degrees Celsius, although higher and lower elevated temperatures may also be employed for the anneal process. In one embodiment, the anneal process may be performed at an elevated temperature within a range from 700 degrees Celsius to 1,000 degrees Celsius. The duration of the anneal may be in a range from 1 second to 2 hours depending on the temperature of the anneal, and can be selected such that sufficient diffusion and agglomeration occur to form discrete metal portions in the lateral recesses.

The material of the continuous metal layer 514 agglomerates into discrete metal portions formed in the lateral recesses at the levels of the sacrificial material layers 42. The discrete metal portions are metal floating gate structures 54 for a vertical memory device (such as a vertical NAND string) to be subsequently formed. Each metal floating gate structure 54 includes discrete portions of the continuous metal layer 514 that are formed by the agglomeration process. In one embodiment, the metal floating gate structures 54 can be formed as annular structures, i.e., ring-shaped structures. In one embodiment, each of the metal floating gate structures 54 can comprise a convex inner sidewall that faces the memory cavity 49', i.e., the unfilled volume of the memory opening 49. In one embodiment, each of the metal floating gate structures 54 can comprise a vertical outer sidewall that contacts a respective vertical sidewall of the blocking dielectric layer 502.

In one embodiment, the continuous metal layer 514 can consist essentially of a single metallic element, and each of the metal floating gate structures 54 can consist essentially of the single metallic element that is provided in the continuous metal layer 514. In one embodiment, the metal floating gate structures 54 can comprise at least one of elemental cobalt portions and elemental nickel portions. A planar metal layer 547 may be formed over the top surface of the insulating cap layer 70. Alternatively, discrete metal portions (not shown) may be formed over the top surface of the insulating cap layer in lieu of the planar metal layer 547 depending on the nature of the agglomeration mechanism that affects the topography of the agglomerated material from the continuous metal layer 514 over the planar top surface of the blocking dielectric layer 502.

Referring to FIG. 15G, a continuous tunneling dielectric layer 506L and a first semiconductor channel layer 601L can be sequentially formed inside memory cavity 49' over the metal floating gate structures 54 (e.g., inside the annular metal floating gate structures 54). Specifically, the continuous tunneling dielectric layer 506L can be formed directly on the concave inner sidewalls of the metal floating gate structures 54 and the physically exposed surfaces of the blocking dielectric layer 502. The continuous tunneling dielectric layer 506L includes a dielectric material through which charge tunneling can be performed under suitable electrical bias conditions. In one embodiment, the processing steps of FIG. 2C can be performed to form the continuous tunneling dielectric layer 506L and the first semiconductor channel layer 601L.

Referring to FIG. 15H, the processing steps of FIG. 2D can be performed to anisotropically etch the horizontal portions of the first semiconductor channel layer 601L and the continuous tunneling dielectric layer 506L. Further, any remaining portion of the continuous metal layer 514 (which may be the planar metal layer 547) can be removed from above the top surface of the insulating cap layer 70. Further, horizontal portions of the blocking dielectric layer 502 can be removed from above the insulating cap layer 70 and at the bottom of the memory cavity 49'. A top surface of an underlying semiconductor surface (which can be a top surface of an epitaxial channel portion 11) can be physically exposed at the bottom of the memory opening (e.g., in the memory cavity 49').

A cylindrical remaining portion of the first semiconductor channel layer 601L constitutes a first semiconductor channel 601. A cylindrical remaining portion of the continuous tunneling dielectric layer 506L constitutes a tunneling dielectric layer 506. A set of the blocking dielectric layer 502, the metal floating gate structures 54, and the tunneling dielectric layer 506 collectively constitutes a memory film 50, which includes a plurality of charge storage regions in the form of the metal floating gate structures 54.

Referring to FIG. 15I, the processing steps of FIGS. 2E and 2F can be performed to form a second semiconductor channel layer 602L and a dielectric core layer 62L.

Referring to FIG. 15I, the processing steps of FIGS. 2G and 2H can be performed to form a dielectric core 62 and a drain region 63 within each memory opening 49. Each remaining portion of the second semiconductor channel layer 602L constitutes a second semiconductor channel 602. Each remaining portion of the dielectric core layer 62L constitutes a dielectric core. An adjoining set of a first semiconductor channel 601 and a second semiconductor channel 602 constitutes a vertical semiconductor channel 60. Each of the memory openings of FIG. 1 can be filled with an instance of a set of a memory film 50, a semiconductor channel 60, a dielectric core 62, and a drain region 63 to provide a second exemplary structure according to an embodiment of the present disclosure.

Each memory stack structure 55 includes a memory film 50 and a semiconductor channel 60. The memory film 50 includes a blocking dielectric layer 502, a plurality of metal floating gate structures 54 located at each level of the sacrificial material layers 42 and having annular shapes, and a tunneling dielectric layer 506. The vertical semiconductor channel 60 can include a first semiconductor channel 601 and a second semiconductor channel 602.

FIGS. 16A-16F illustrates a memory opening during formation of a second exemplary memory stack structure, multiple instances of which can be incorporated into the memory openings of the second exemplary structure according to an embodiment of the present disclosure.

Referring to FIG. 16A, a memory opening is illustrated at a processing step corresponding to the processing step of FIG. 15F, i.e., after the anneal process that forms the metal floating gate structures 54 in FIG. 15F. The structure of FIG. 16A can be formed by decreasing the thickness of the continuous metal layer 514 (which is formed at the processing steps of FIG. 15E) such that the total volume of the continuous metal layer 514 at the level of a sacrificial material layer 42 and an adjacent insulating material layer 32 is approximately in a range from 20% to 80% (such as from 30% to 70%) of the total volume of a lateral recess 143' at the level of the sacrificial material layer 42 prior to deposition of the continuous metal layer 514. In an illustrative example, the thickness of the continuous metal layer 514 as deposited (i.e., prior to the anneal process) may be in a range from 0.5 nm to 8 nm, although lesser and greater thicknesses can also be employed.

Because the material of the continuous metal layer 514 is not sufficient to fill the entire volume of the lateral recesses, the discrete metal portions formed by agglomeration of the material of the continuous metal layer 514 do not fill the entire volume of each lateral recess 143', but occupies only a fraction of the volume of a respective lateral recess. The discrete metal portions formed by agglomeration of the continuous metal layer 514 can be formed as annular metal portions, i.e., metal portions each having a ring shape. The discrete metal portions having the annular shapes are herein referred to as outer annular metal portions 541 to distinguish from additional annular metal portions to be subsequently formed on the inside of the outer annular metal portions 541. In one embodiment, each outer annular metal portion 541 can have a convex inner sidewall, a substantially vertical outer sidewall, an annular planar top surface, and an annular planar bottom surface. In one embodiment, the outer annular metal portions 541 can consist essentially of a metallic element within the continuous metal layer 514. In one embodiment, the outer annular metal portions 541 can consist essentially of cobalt. Alternately, the outer annular metal portions 541 can consist essentially of nickel. In yet another embodiment, the outer annular metal portions 541 can consist essentially of an alloy of cobalt and nickel.

Referring to FIG. 16B, inner annular metal portions 542 can be formed by selective deposition of a metallic material on the surfaces (such as the inner sidewalls of the outer annular metal portions 541) of the outer annular metal portions 541 while suppressing growth from dielectric surfaces (such as the surfaces of the blocking dielectric layer 502). The metallic material deposited by the selective deposition process may be the same as, or different from, the metallic material of the outer annular metal portions 541. In one embodiment, the metallic material deposited by the selective deposition process may be different from the metallic material of the outer annular metal portions 541. For example, if the outer annular metallic portions 541 comprise cobalt or nickel, the metallic material of the inner annular metal portions 542 can include any metallic material that can be deposited on cobalt surfaces or nickel surfaces, such as titanium, tungsten or ruthenium.

In one embodiment, the inner annular metal portions 542 can be formed by chemical vapor deposition (CVD) or atomic layer deposition (ALD) that deposits a metallic material only on metallic surfaces and does not deposit the metallic material on dielectric surfaces. For example, tungsten can be deposited to form the inner annular metal portions 542 in a selective deposition process that employs tungsten hexafluoride (WF$_6$) as a precursor gas, which deposits tungsten only on metal surfaces and does not deposit tungsten on dielectric surfaces. Any other metal deposition process that deposits metal on pre-existing metallic surfaces and does not deposit the metal on dielectric surfaces can also be employed to form the inner annular metal portions 542. Metallic materials that can be selectively formed on metallic surfaces without being deposited on insulating surfaces (and thus, can be employed as the material of the inner annular metal portions 542) include, but are not limited titanium, tungsten or ruthenium.

Each adjoined pair of an outer annular metal portion 541 and an inner annular metal portion 542 constitutes a metal floating gate structure 54. Thus, each of the metal floating gate structures 54 can comprise a pair of an inner annular metal portion 542 and an outer annular metal portion 541. Each metal floating gate structure 54 can be formed as an annular structure. In one embodiment, the inner annular metal portions 542 can include a different metallic material than a metallic element within the outer annular metal portions 541. Each inner annular metal portion 542 can be formed on an inner sidewall of a respective outer annular metal portion 541. In one embodiment, each of the metal floating gate structures 54 can comprise a convex inner sidewall, which is an inner sidewall of the inner annular metal portion 542 therein. In one embodiment, the outer annular metal portions 541 can include at least one of elemental cobalt portions and elemental nickel portions. A second planar metal layer 548 (or additional discrete metal portions) can be formed on the first planar metal layer 547 (or pre-existing discrete metal portions that are provided in lieu of the planar metal layer 547).

Referring to FIG. 16C, the processing steps of FIG. 15G can be performed to form a continuous tunneling dielectric layer 506L and a first semiconductor channel layer 601L inside the metal floating gate structures 54. Specifically, the continuous tunneling dielectric layer 506L can be formed directly on the concave inner sidewalls of the metal floating gate structures 54 and the physically exposed surfaces of the blocking dielectric layer 502. The continuous tunneling dielectric layer 506L includes a dielectric material through which charge tunneling can be performed under suitable electrical bias conditions. In one embodiment, the processing steps of FIG. 2C can be performed to form the continuous tunneling dielectric layer 506L and the first semiconductor channel layer 601L.

Referring to FIG. 16D, the processing steps of FIG. 2D can be performed to anisotropically etch the horizontal portions of the first semiconductor channel layer 601L and the continuous tunneling dielectric layer 506L. Further, any remaining portions of the second planar metal layer 548 and the planar metal layer 547 (or any discrete equivalents thereof over the insulating cap layer 70) can be removed from above the top surface of the insulating cap layer 70 by an isotropic etch or an anisotropic etch. Further, horizontal portions of the blocking dielectric layer 502 can be removed from above the insulating cap layer 70 and at the bottom of the memory cavity 49'. A top surface of an underlying semiconductor surface (which can be a top surface of an epitaxial channel portion 11) can be physically exposed at the bottom of the memory opening 49.

A cylindrical remaining portion of the first semiconductor channel layer 601L constitutes a first semiconductor channel 601. A cylindrical remaining portion of the continuous tunneling dielectric layer 506L constitutes a tunneling dielectric layer 506. A set of the blocking dielectric layer 502, the metal floating gate structures 54, and the tunneling dielectric layer 506 collectively constitutes a memory film 50, which includes a plurality of charge storage regions in the form of the metal floating gate structures 54.

Referring to FIG. 16E, the processing steps of FIGS. 2E and 2F can be performed to form a second semiconductor channel layer 602L and a dielectric core layer 62L.

Referring to FIG. 16F, the processing steps of FIGS. 2G and 2H can be performed to form a dielectric core 62 and a drain region 63 within each memory opening 49. Each remaining portion of the second semiconductor channel layer 602L constitutes a second semiconductor channel 602. Each remaining portion of the dielectric core layer 62L constitutes a dielectric core. An adjoining set of a first semiconductor channel 601 and a second semiconductor channel 602 constitutes a vertical semiconductor channel 60. Each of the memory openings of FIG. 1 can be filled with an instance of a set of a memory film 50, a semiconductor channel 60, a dielectric core 62, and a drain region 63 to provide a second exemplary structure according to an embodiment of the present disclosure.

Within each metal floating gate structure 54, an outer annular metal portion 541 can have a substantially vertical outer sidewall (facing the blocking dielectric layer 502), a convex inner sidewall (facing the tunneling dielectric layer 506), an annular planar top surface, and an annular planar bottom surface, and an inner annular metal portion 542 can have a concave outer sidewall (that contacts the convex inner sidewall of the outer annular metal portion 541), an inner convex inner sidewall, an annular planar top surface, and an annular planar bottom surface. The annular top surfaces of the outer annular metal portion 541 and the inner annular metal portion 542 can be within the same horizontal plane, and the annular bottom surface of the outer annular metal portion 541 and the annular bottom surface of the inner annular metal portion 542 can be within the same horizontal plane.

Each memory stack structure 55 includes a memory film 50 and a semiconductor channel 60. The memory film 50 includes a blocking dielectric layer 502, a plurality of metal floating gate structures 54 located at each level of the sacrificial material layers 42 and having annular shapes, and a tunneling dielectric layer 506. Each metal floating gate structure 54 can include an inner annular metal portion 542 and an outer annular metal portion 541 contacting a concave outer sidewall of the inner annular metal portion 542. The vertical semiconductor channel 60 can include a first semiconductor channel 601 and a second semiconductor channel 602.

FIGS. 17A and 17B illustrates a memory opening during formation of a third exemplary memory stack structure, multiple instances of which can be incorporated into the memory openings of the second exemplary structure according to an embodiment of the present disclosure.

Referring to FIG. 17A, the structure of FIG. 17A can be derived from the structure of FIG. 15E by decreasing the thickness of the continuous metal layer 514 (which is herein referred to as a first continuous metal layer) and by non-selectively depositing an additional continuous metal layer (which is herein referred to as a second continuous metal layer 524) over the first continuous metal layer 514. The materials of the first continuous metal layer 514 and the second continuous metal layer 524 are selected such that the materials of the first and second continuous metal layers (514, 524) exhibit spontaneous agglomeration in a subsequent anneal process. Metals exhibiting such spontaneous agglomeration include cobalt and nickel. For example, the first continuous metal layer 514 can include cobalt or nickel and the second continuous metal layer 524 can include nickel, titanium, tungsten or ruthenium. The second continuous metal layer 524 may comprise a metal which also exhibits the spontaneous agglomeration or it may comprise a metal which does not exhibit spontaneous agglomeration. In case the first and second continuous metal layers (514, 524) have the property of self-agglomeration (i.e., self-segregation into the cavities), then there is no limit to thickness of the second continuous metal layer 524 other than geometric considerations.

If the second continuous metal layer 524 does not exhibit spontaneous agglomeration, then it is separated into separate portions by the spontaneous agglomeration of the first continuous metal layer 514 which draws the second continuous metal layer 524 located on layer 514 into separate portions during the anneal. It is not necessary for the second continuous metal layer 524 to be self-segregating as long as the first continuous metal layer 514 has a self-segregating property. However, there is a maximum limit to the thickness of the second continuous metal layer 524 in case the second continuous metal layer 524 does not include a self-segregating metal. The maximum thickness of the second continuous metal layer 524 depends on the cohesive forces in the second continuous metal layer 524 and the adhesive forces of the material of the second continuous metal layer 524 on the material of the second continuous metal layer 514. For example, if the cohesive forces on the second continuous metal layer 524 are very strong relative to its adhesion on the first continuous metal layer 514, then the second continuous metal layer 524 is less likely to get pulled into the cavity along with the agglomerating material of the first continuous metal layer 514 (material portions of the second continuous metal layer 524 will prefer to stick to other material portions of the second continuous metal layer 524) if the thickness of the second continuous metal layer 524 is too great. Consequently, the maximum allowable thickness of the second continuous metal layer 524 can be relatively small under such conditions. Conversely, if the adhesion of the second continuous metal layer 524 to the first continuous metal layer 514 is strong relative to the cohesive forces within the second continuous metal layer 524, then the second continuous metal layer 524 will be more likely to separate with the first continuous metal layer 514 during the self-agglomeration of the first continuous metal layer 514 even if the thickness of the second continuous metal layer 524 is fairly large. Consequently, the maximum thickness for allowing agglomeration of the second continuous metal layer 524 induced by agglomeration of the material of the first continuous metal layer 514 is higher.

The thicknesses of the first continuous metal layer 514 and the second continuous metal layer 524 can be selected such that the lateral recesses 143″ are not completely filled by the first and second continuous metal layers (514, 524). Thus, lateral recesses reduced in volume can exist at each level of the sacrificial material layers 42 after deposition of the first and second continuous metal layers (514, 524). In one embodiment, the total thickness of the first and second continuous metal layers (514, 524) can be selected such that the total volume of the first and second continuous metal layers (514, 524) at the level of a sacrificial material layer 42 and an adjacent insulating material layer 32 is approximately the same as the total volume of a lateral recess at the level of the sacrificial material layer 42 prior to deposition of the first continuous metal layer 514. In an illustrative example, the total thickness of the first and second continuous metal layers (514, 524) may be in a range from 2 nm to 10 nm, although lesser and greater thicknesses can also be employed. In one embodiment, the thicknesses of the first continuous metal layer 514 and the second continuous metal layer 524 can be selected such that the thickness of the first continuous metal layer 514 is approximately in a range from 20% to 80% (such as from 30% to 70%) of the total thickness of the first and second continuous metal layers (514, 524).

Referring to FIG. 17B, an anneal process is performed at an elevated temperature to induce surface diffusion and agglomeration of the material of the first continuous metal layer 514 into first discrete metal portions, and the material of the second continuous metal layer 524 into second discrete metal portions. Each of the first discrete metal portions can be formed within the unfilled volumes of the lateral recesses at each level of the sacrificial material layers 42 directly on sidewalls of the blocking dielectric layer 502. Each of the second discrete metal portions can be formed at each level of the sacrificial material layers 42 on inner sidewalls of the first discrete metal portions.

The elevated temperature of the anneal process can be selected such that sufficient surface diffusion of the material of the first continuous metal layer 514 occurs on, and over, the surfaces of the blocking dielectric material layer 502 without melting the metallic materials of the first and second continuous metal layers (514, 524). The second continuous metal layer 524 may comprise a metal which also exhibits the spontaneous agglomeration or it may comprise a metal which does not exhibit spontaneous agglomeration, as described above. In one embodiment, the anneal process may be performed at an elevated temperature within a range from 600 degrees Celsius to 1,200 degrees Celsius, although higher and lower elevated temperatures may also be employed for the anneal process. In one embodiment, the anneal process may be performed at an elevated temperature within a range from 700 degrees Celsius to 1,000 degrees Celsius. The duration of the anneal may be in a range from 1 second to 2 hours depending on the temperature of the anneal, and can be selected such that sufficient diffusion and agglomeration occur to form discrete metal portions in the lateral recesses.

The first discrete metal portions formed by agglomeration of the material of the first continuous metal layer 514 can form outer annular metal portions 541, and the second discrete metal portions formed by agglomeration of the material of the second continuous metal layer 524 can form inner annular metal portions 542. In one embodiment, each outer annular metal portion 541 can have a convex inner sidewall, a substantially vertical outer sidewall, an annular planar top surface, and an annular planar bottom surface. In one embodiment, the outer annular metal portions 541 can consist essentially of a metallic element within the first continuous metal layer 514. In one embodiment, the outer annular metal portions 541 can consist essentially of cobalt. Alternately, the outer annular metal portions 541 can consist essentially of nickel. In yet another embodiment, the outer annular metal portions 541 can consist essentially of an alloy of cobalt and nickel.

In one embodiment, the inner annular metal portions 542 can include a different metallic material than a metallic element within the outer annular metal portions 541. Each inner annular metal portion 542 can be formed on an inner sidewall of a respective outer annular metal portion 541. In one embodiment, the outer annular metal portions 541 can include cobalt portions and the inner annular metal portions 542 can include titanium, tungsten or ruthenium portions.

Each adjoined pair of an outer annular metal portion 541 and an inner annular metal portion 542 constitutes a metal floating gate structure 54. Thus, each of the metal floating gate structures 54 can comprise a pair of an inner annular metal portion 542 and an outer annular metal portion 541. Each metal floating gate structure 54 can be formed as an annular structure. Within each metal floating gate structure 54, an outer annular metal portion 541 can have a substantially vertical outer sidewall, a convex inner sidewall, an annular planar top surface, and an annular planar bottom surface, and an inner annular metal portion 542 can have a concave outer sidewall (that contacts the convex inner sidewall of the outer annular metal portion 541), an inner convex inner sidewall, an annular planar top surface, and an annular planar bottom surface. The annular top surfaces of the outer annular metal portion 541 and the inner annular metal portion 542 can be within the same horizontal plane, and the annular bottom surface of the outer annular metal portion 541 and the annular bottom surface of the inner annular metal portion 542 can be within the same horizontal plane.

At least one material portion including the metallic material of the first continuous metal layer 514 may be formed above the insulating cap layer 70 during the anneal process, which may be a first planar metal layer 547 or discrete metallic portions depending on the kinetics of the diffusion process and/or the surface tension of the material of the first continuous material layer 514. At least another material portion including the metallic material of the second continuous metal layer 524 may be formed above the insulating cap layer 70 during the anneal process, which may be a second planar metal layer 548 or additional discrete metallic portions depending on the kinetics of the diffusion process and/or the surface tension of the material of the second continuous material layer 524.

Subsequently, the processing steps of FIGS. 16C-16F can be performed to form a third exemplary memory stack structure. An instance of the third exemplary memory stack structure can be formed within each memory opening 49 of the second exemplary structure. Within each metal floating gate structure 54, an outer annular metal portion 541 can have a substantially vertical outer sidewall, a convex inner sidewall, an annular planar top surface, and an annular planar bottom surface, and an inner annular metal portion 542 can have a concave outer sidewall (that contacts the convex inner sidewall of the outer annular metal portion 541), an inner convex inner sidewall, an annular planar top surface, and an annular planar bottom surface. The annular top surfaces of the outer annular metal portion 541 and the inner annular metal portion 542 can be within the same horizontal plane, and the annular bottom surface of the outer annular metal portion 541 and the annular bottom surface of the inner annular metal portion 542 can be within the same horizontal plane.

Each memory stack structure 55 includes a memory film 50 and a semiconductor channel 60. The memory film 50 includes a blocking dielectric layer 502, a plurality of metal floating gate structures 54 located at each level of the sacrificial material layers 42 and having annular shapes, and a tunneling dielectric layer 506. Each metal floating gate structure 54 can include an inner annular metal portion 542 and an outer annular metal portion 541 contacting a concave outer sidewall of the inner annular metal portion 542. The vertical semiconductor channel 60 can include a first semiconductor channel 601 and a second semiconductor channel 602.

A bilayer stack including a first continuous metal layer 514 and a second continuous metal layer 524 can be used in the illustrated embodiments of the present disclosure to form self-agglomerating floating gate electrodes. One of the benefits of use of the bilayer stack is that the bilayer stack allows tailoring the programming/erase characteristics of the memory cells by adjusting the combined work function. For instance, if a floating gate electrode consists of a Co portion, the work function of such a floating gate electrode may be too low for a given application if higher program speeds are needed. Typically, a floating gate electrode having a low work function results in slower programming of the memory cell. The converse is true for an erase operation. Thus, if the work function of a floating gate electrode is high, programming is easier but erasing is more difficult. If a second metal with a different work function than the first work function is employed, the composite work function can be tuned to any desired value between the two work function values of the two metals by adjusting the relative thicknesses of the two metal layers. Subject to the thickness constraint in case the first continuous metal layer 514 is self-agglomerating and the second continuous metal layer 524 is not self-agglomerating, and subject to the geometric constraints that the lateral recesses be large enough to accommodate agglomerating metal portions therein, the bilayer stack (or a trilayer stack) provides the freedom to tune with work function of the floating gates to a desired value.

Figure 18:
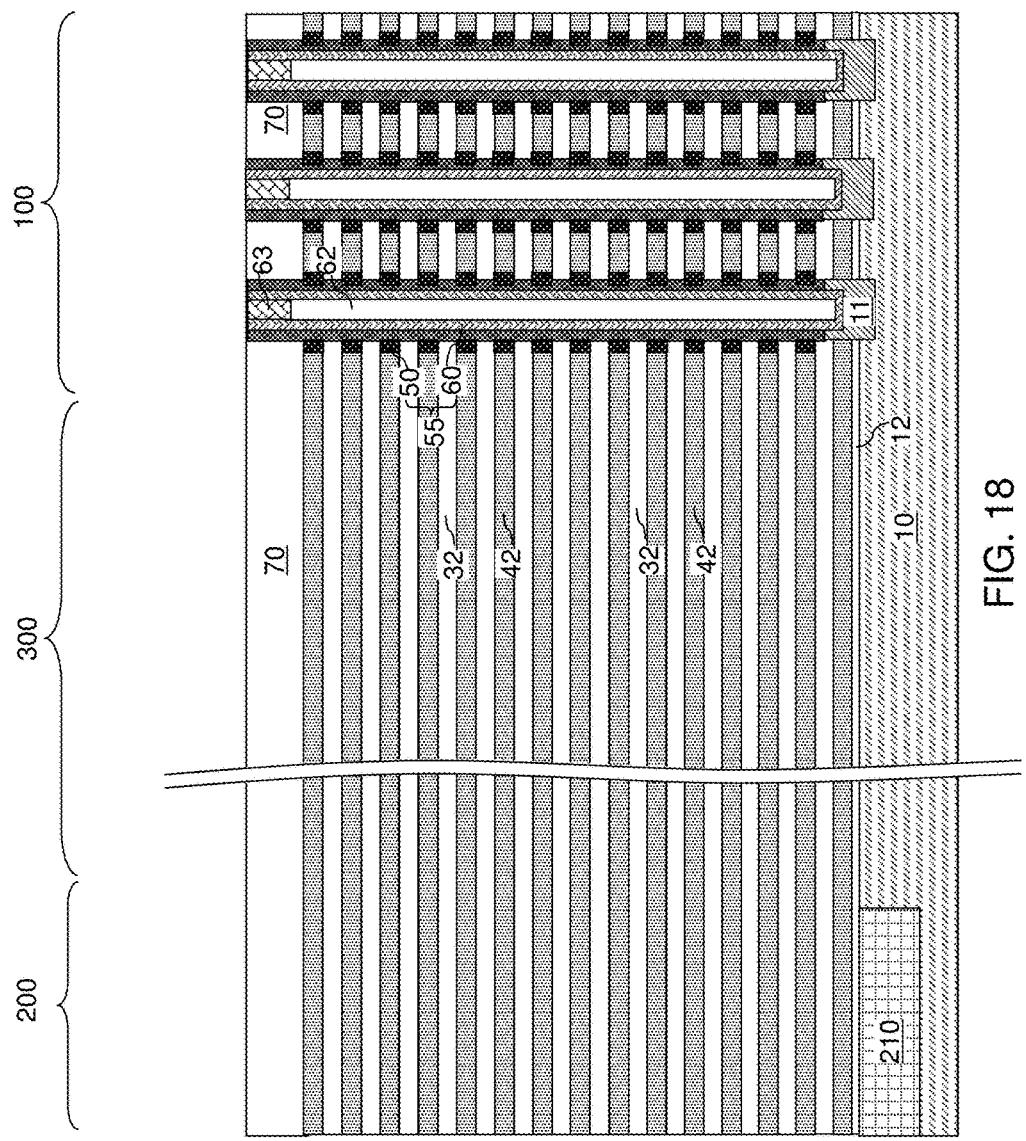
FIG. 18 is a vertical cross-sectional view of the second exemplary structure after formation of first, second, or third exemplary memory stack structures according to an embodiment of the present disclosure.

Referring to FIG. 18, the second exemplary structure is illustrated after formation of memory stack structures 55 in the memory openings 49. The memory stack structures 55 can be any of the first exemplary memory stack structures, the second exemplary memory stack structures, or the third exemplary memory stack structures. Each exemplary memory stack structure 55 includes a vertical semiconductor channel 60; a tunneling dielectric layer 506 laterally surrounding the vertical semiconductor channel 60; and a vertical stack of charge storage regions laterally surrounding the tunneling dielectric layer 506 (as embodied as the metal floating gate electrodes 54). The second exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor substrate layer 10), and a memory opening extending through the stack (32, 42).

Referring to FIG. 19, an optional first contact level dielectric layer 71 can be formed over the semiconductor substrate layer 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, and the alternating stack (32, 42) can be removed from the peripheral device region 200, for example, by a masked etch process. In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the semiconductor substrate layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the semiconductor substrate layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Referring to FIG. 20, dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the device region 100. The dielectric support pillars 7P can be formed, for example, by forming an opening extending through the retro-stepped dielectric material portion 65 and/or through the alternating stack (32, 42) and at least to the top surface of the semiconductor substrate layer 10, and by filling the opening with a dielectric material that is resistant to the etch chemistry to be employed to remove the sacrificial material layers 42.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, for example, after formation of a source contact via structure.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

Figure 21A:
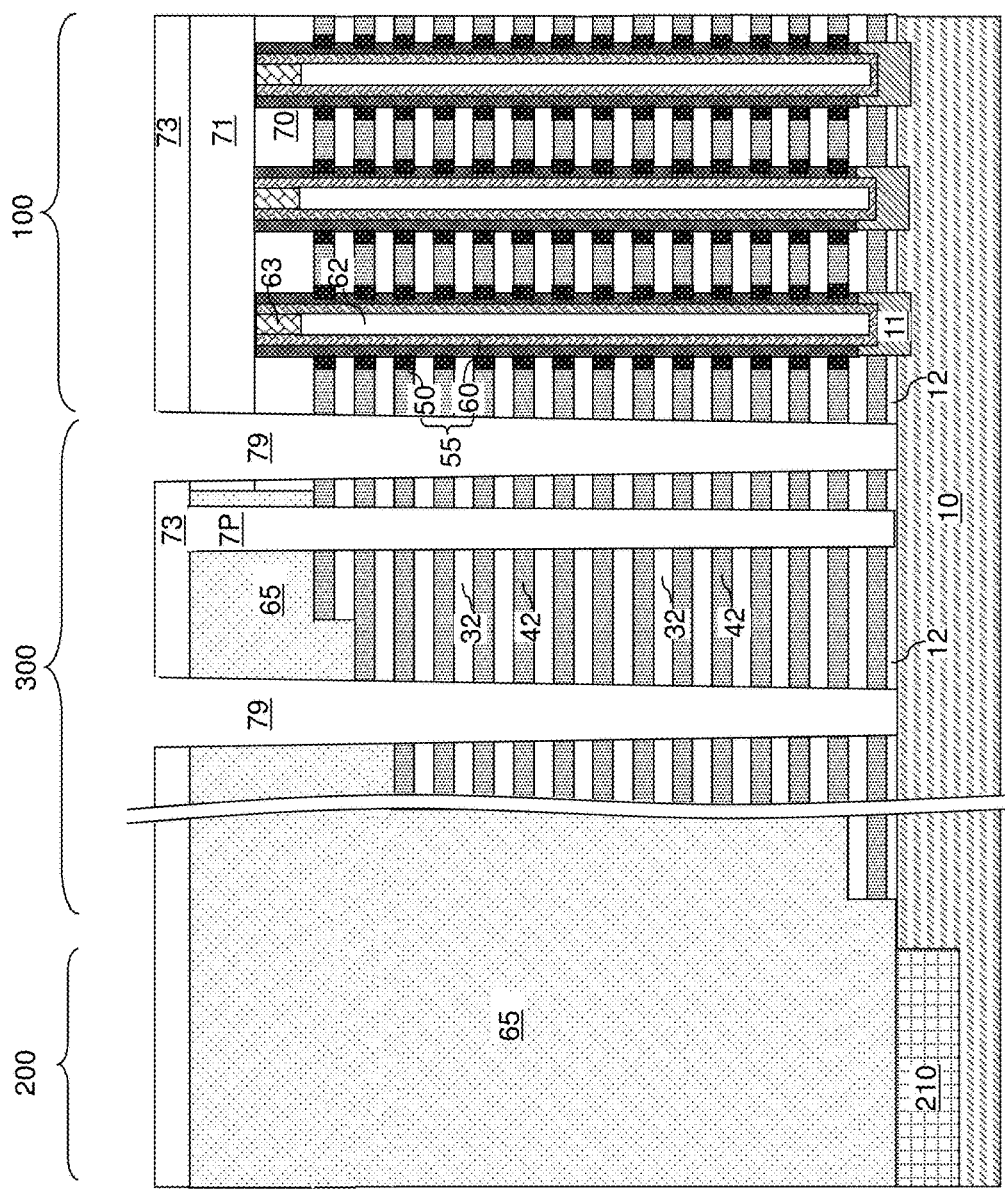
FIG. 21A is a vertical cross-sectional view of the second exemplary structure after formation of backside contact trenches according to an embodiment of the present disclosure.
Figure 21B:
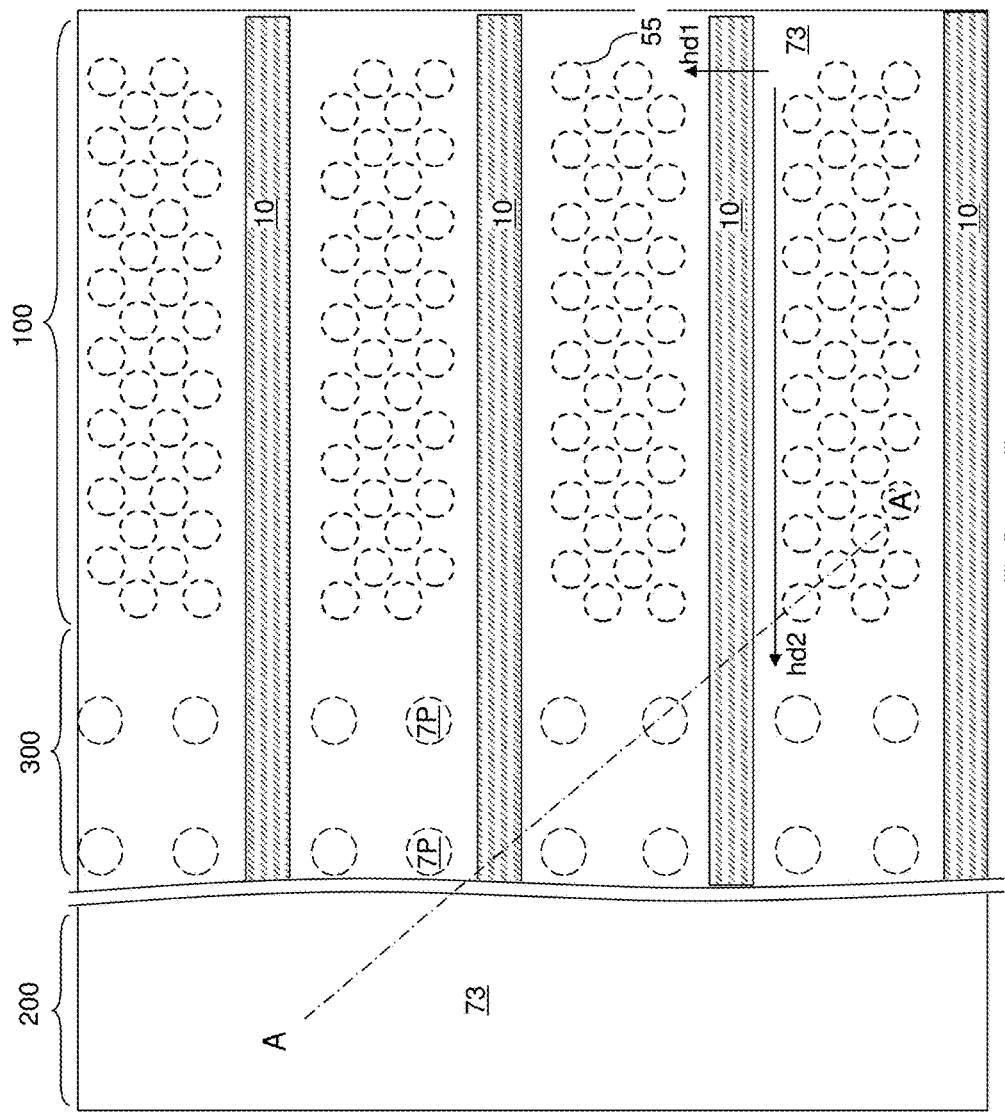
FIG. 21B is a top-down view of the second exemplary structure of FIG. 21A.

Referring to FIGS. 21A and 21B, a photoresist layer (not shown) can be applied over the at least one contact level dielectric layer (71, 73), and can be lithographically patterned to form openings within areas between the memory blocks. In one embodiment, the memory blocks can be laterally spaced from one another along a first horizontal direction hd1 (e.g., bit line direction), and the dimension of each opening in the photoresist layer along the first horizontal direction hd1 can be less than the spacing between neighboring clusters (i.e., sets) of the memory stack structures 55 along the second horizontal direction hd2 (e.g., word line direction). Further, the dimension of each opening in the photoresist layer along a second horizontal direction hd2 (which is parallel to the lengthwise direction of each cluster of memory stack structures 55) can be greater than the extent of each cluster of the memory stack structures 55 along the first horizontal direction hd1.

Backside trenches 79 can be formed between each neighboring pair of clusters of the memory stack structures 55 by transferring the pattern of the openings in the photoresist layer through the at least one contact level dielectric layer (71, 73), the retro-stepped dielectric material portion 65, and the alternating stack (32, 42). A top surface of the semiconductor substrate layer 10 can be physically exposed at the bottom of each backside trench 79. In one embodiment, each backside trench 79 can extend along the second horizontal direction hd2 so that clusters of the memory stack structures 55 are laterally spaced along the first horizontal direction hd1. Each cluster of memory stack structures 55 in conjunction with the portions of the alternating stack (32, 42) that surround the cluster constitutes a memory block. Each memory block is laterally spaced from one another by the backside trenches 79.

Figure 22:
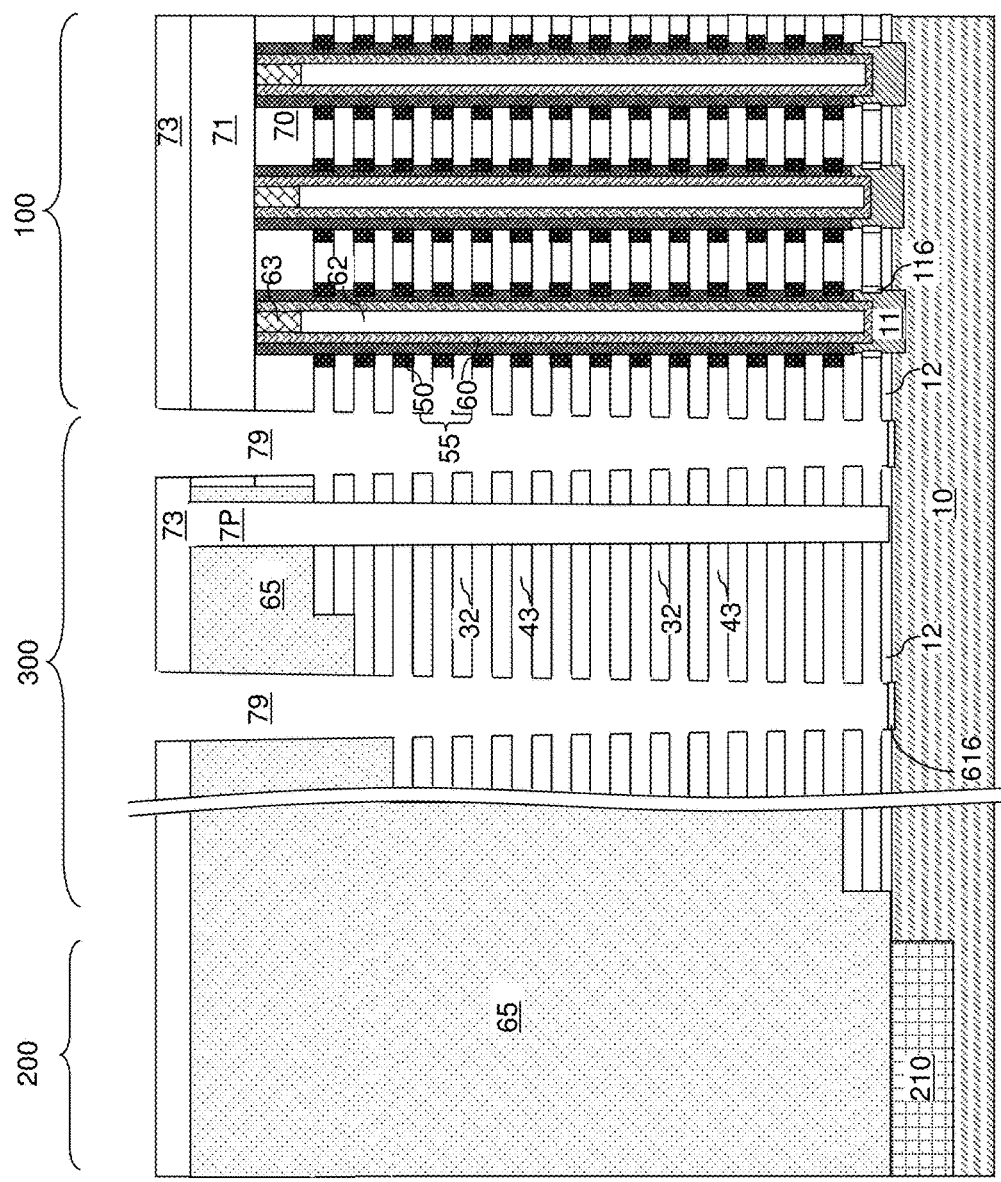
FIG. 22 is a vertical cross-sectional view of the second exemplary structure after formation of backside recesses according to an embodiment of the present disclosure.

Referring to FIG. 22, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the dielectric support pillars 7P, the material of the retro-stepped dielectric material portion 65, the semiconductor material of the semiconductor substrate layer 10, and the material of the outermost layer of the first memory films 50. In one embodiment, the sacrificial material layers 42 can include silicon nitride, and the materials of the insulating layers 32, the dielectric support pillars 7P, and the retro-stepped dielectric material portion 65 can be selected from silicon oxide and dielectric metal oxides.

The etch process that removes the second material selective to the first material and the outermost layer of the first memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the second exemplary structure is immersed within a wet etch tank including phosphoric acid, which etches silicon nitride selective to silicon oxide, silicon, and various other materials employed in the art. The dielectric support pillars 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The first memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (e.g., above the semiconductor substrate layer 10). In this case, each backside recess 43 can define a space for receiving a respective word line of the array of monolithic three-dimensional NAND strings.

Each of the plurality of backside recesses 43 can extend substantially parallel to the top surface of the semiconductor substrate layer 10. A backside recess 43 can be vertically bounded by a top surface of an underlying insulating layer 32 and a bottom surface of an overlying insulating layer 32. In one embodiment, each backside recess 43 can have a uniform height throughout.

Subsequently, physically exposed surface portions of epitaxial channel portions 11 and the substrate semiconductor layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert each physically exposed surface portion of the substrate semiconductor layer 10 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the substrate semiconductor layer 10 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the substrate semiconductor layer 10.

Figure 23:
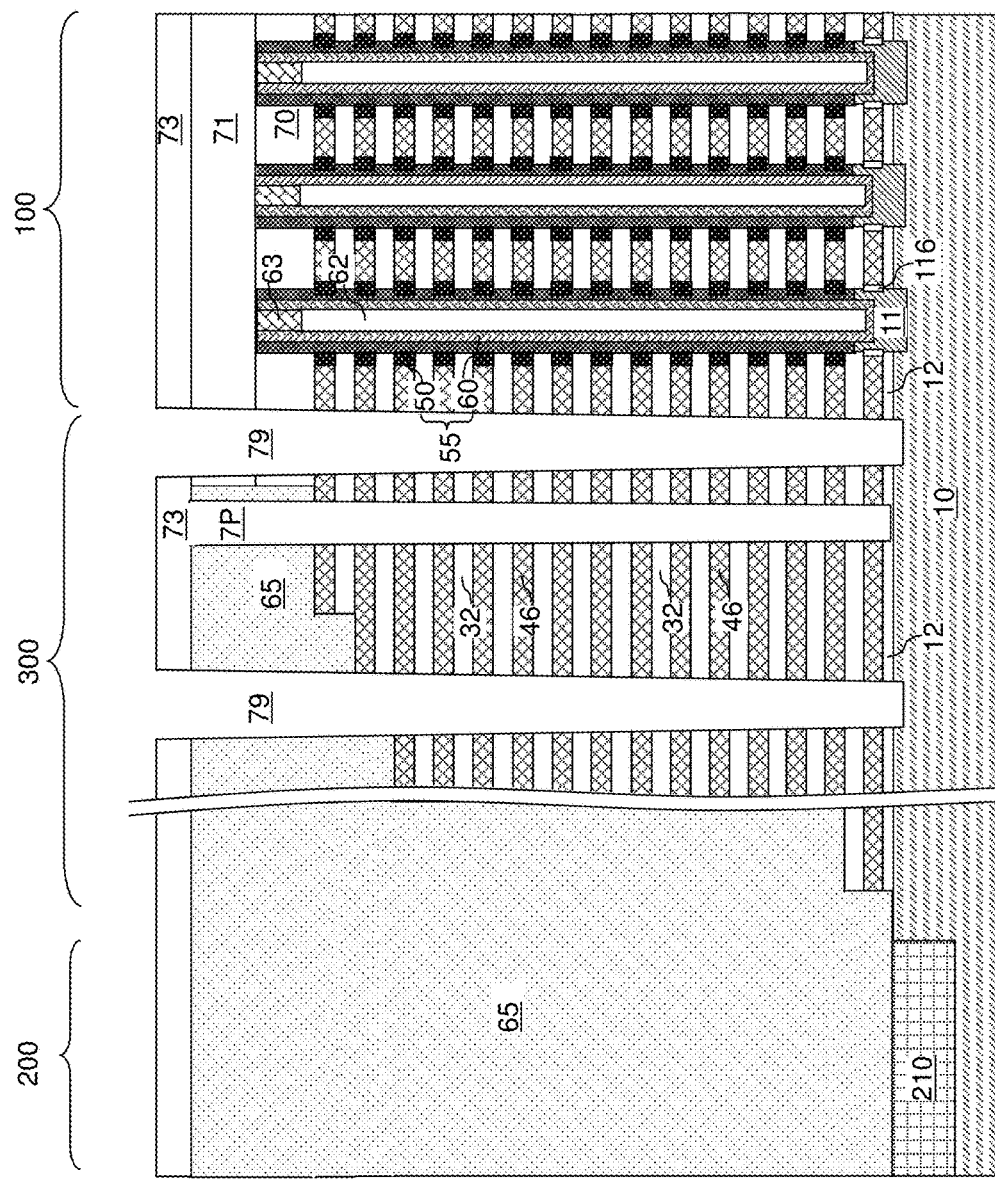
FIG. 23 is a vertical cross-sectional view of the second exemplary structure after formation of electrically conductive layers according to an embodiment of the present disclosure.

Referring to FIG. 23, a backside blocking dielectric layer (not shown) can be optionally formed. The backside blocking dielectric layer, if present, comprises a dielectric material that functions as a control gate dielectric for the control gates to be subsequently formed in the backside recesses 43. In case at least one blocking dielectric is present within each memory stack structure 55, the backside blocking dielectric layer is optional. In case a blocking dielectric is not present in the memory stack structures 55, the backside blocking dielectric layer is present.

At least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, $WF_6$ and $H_2$ can be employed during the deposition process. Alternatively, fluorine-free deposition chemistry may be employed.

Alternatively, the metallic material may be deposited using the method of the first embodiment illustrated in FIG. 8A-8G, 9A-9D, 10A-10F or 11A-11F, using a metal, such as a cobalt, which exhibits the spontaneous agglomeration, to form the control gate electrodes 46.

A plurality of electrically conductive layers 46 can be formed in the plurality of backside recesses 43, and a metallic material layer (not shown) can be formed on the sidewalls of each backside contact trench 79 and over the at least one contact level dielectric layer (71, 73). Thus, each sacrificial material layer 42 can be replaced with an electrically conductive layer 46. A backside cavity is present in the portion of each backside contact trench 79 that is not filled with the optional backside blocking dielectric layer and the metallic material layer.

The deposited metallic material of the metallic material layer is etched back, for example, by an isotropic etch from the sidewalls of each backside contact trench 79 and from above the second contact level dielectric layer 73. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from underneath the backside trench 79 during the last processing step of the anisotropic etch. Each backside trench 79 extends through the alternating stack (32, 46) of the insulating layers 32 and the electrically conductive layers 46 and to the top surface of the substrate 10.

Figure 24:
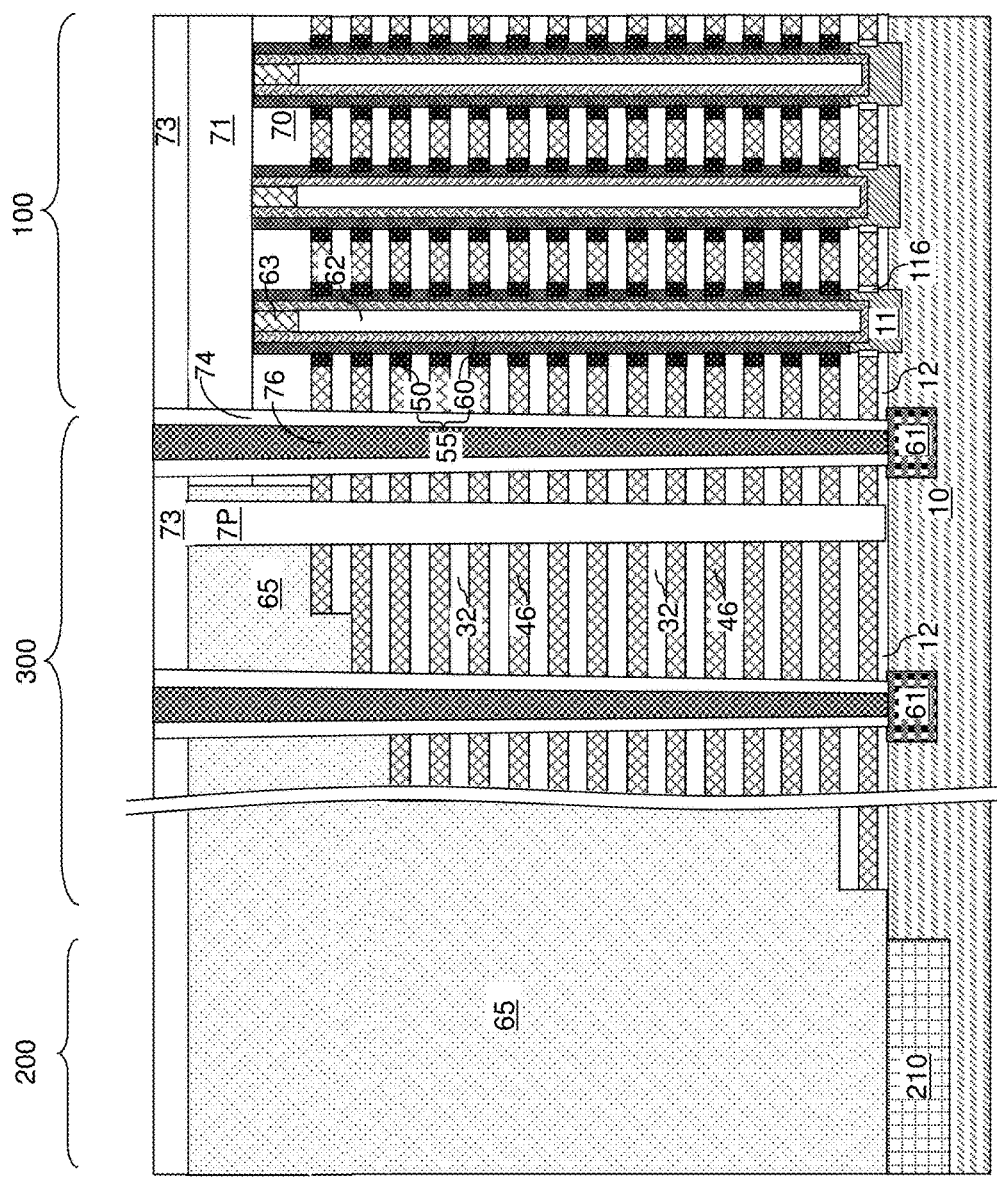
FIG. 24 is a vertical cross-sectional view of the second exemplary structure after formation of insulating spacers and backside contact via structures according to an embodiment of the present disclosure.

Referring to FIG. 24, source regions 61 can be formed in, or on, portions of the semiconductor substrate layer 10 underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa.

An insulating material layer can be formed in each backside contact trench 79 and over the second contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. The thickness of the insulating material layer can be in a range from 1.5 nm to 60 nm, although lesser and greater thicknesses can also be employed.

Subsequently, an anisotropic etch is performed to remove horizontal portions of the insulating material layer and to optionally remove the horizontal portion of the backside blocking dielectric layer from above the second contact level dielectric layer 73. Each remaining portion of the insulating material layer inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and can be formed directly on substantially vertical sidewalls of the insulating layers 32 (or on the backside blocking dielectric layer if present) and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm Each insulating spacer 74 laterally surrounds a cavity, which is herein referred to as a backside cavity. A top surface of a source region 61 (which is a doped semiconductor material portion) can be physically exposed at the bottom of each backside cavity that is provided within an insulating spacer 74.

At least one metallic material can be deposited into each backside cavity. The at least one metallic material can include, for example, a metallic diffusion barrier layer including a conductive metallic nitride and/or a conductive metallic carbide. Further, the at least one metallic material can include a metallic fill material such as an elemental metal (e.g., W, Co, or Al) or an intermetallic alloy of at least two elemental metals. Excess portions of the at least one metallic material can be removed from above the horizontal plane including the top surface of the contact level dielectric layers (71, 73). Each remaining portion of the at least one metallic material in a backside trench constitutes a backside contact via structure 76.

Figure 25A:
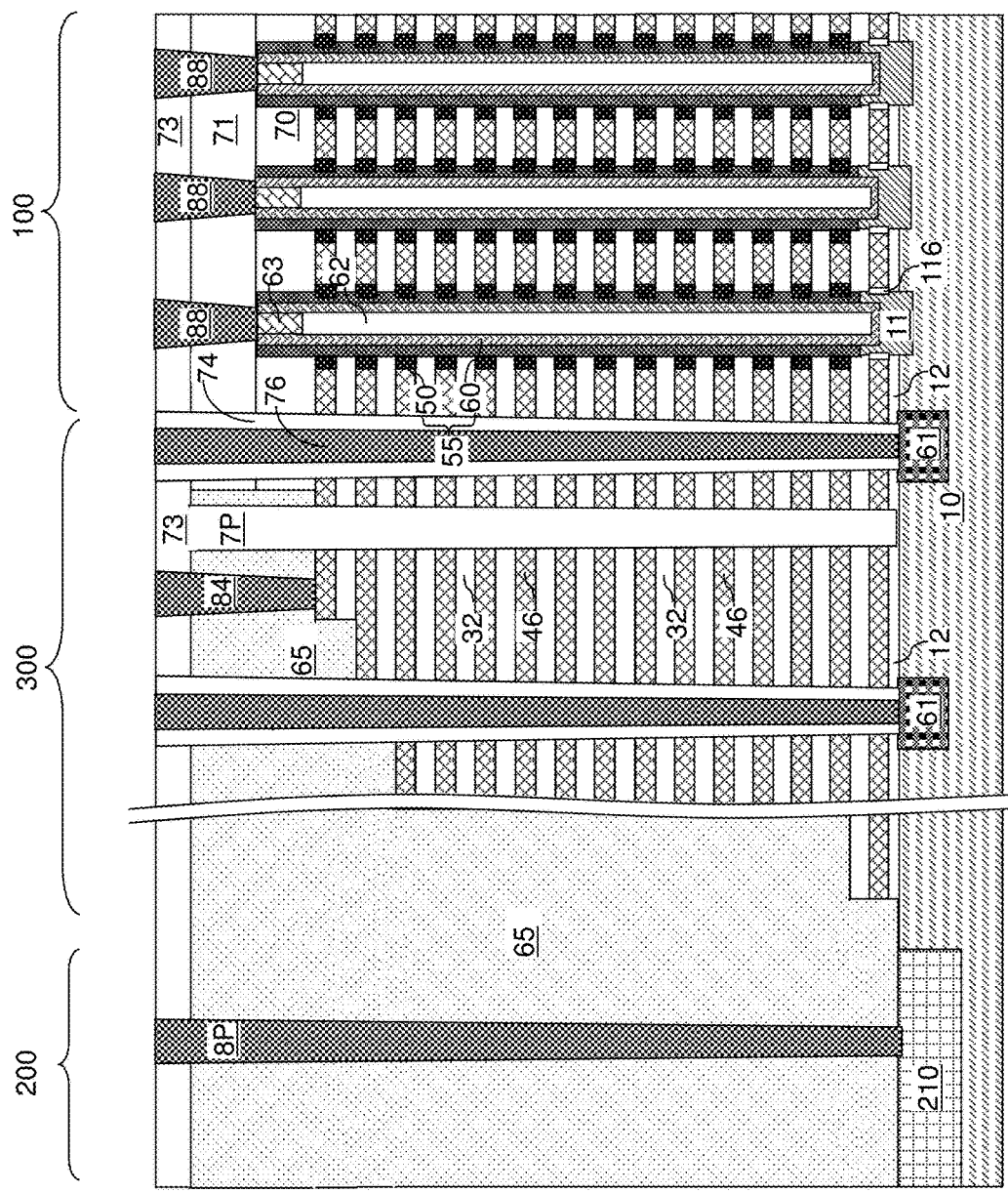
FIG. 25A is a vertical cross-sectional view of the second exemplary structure after formation of additional contact via structures according to an embodiment of the present disclosure.
Figure 25B:
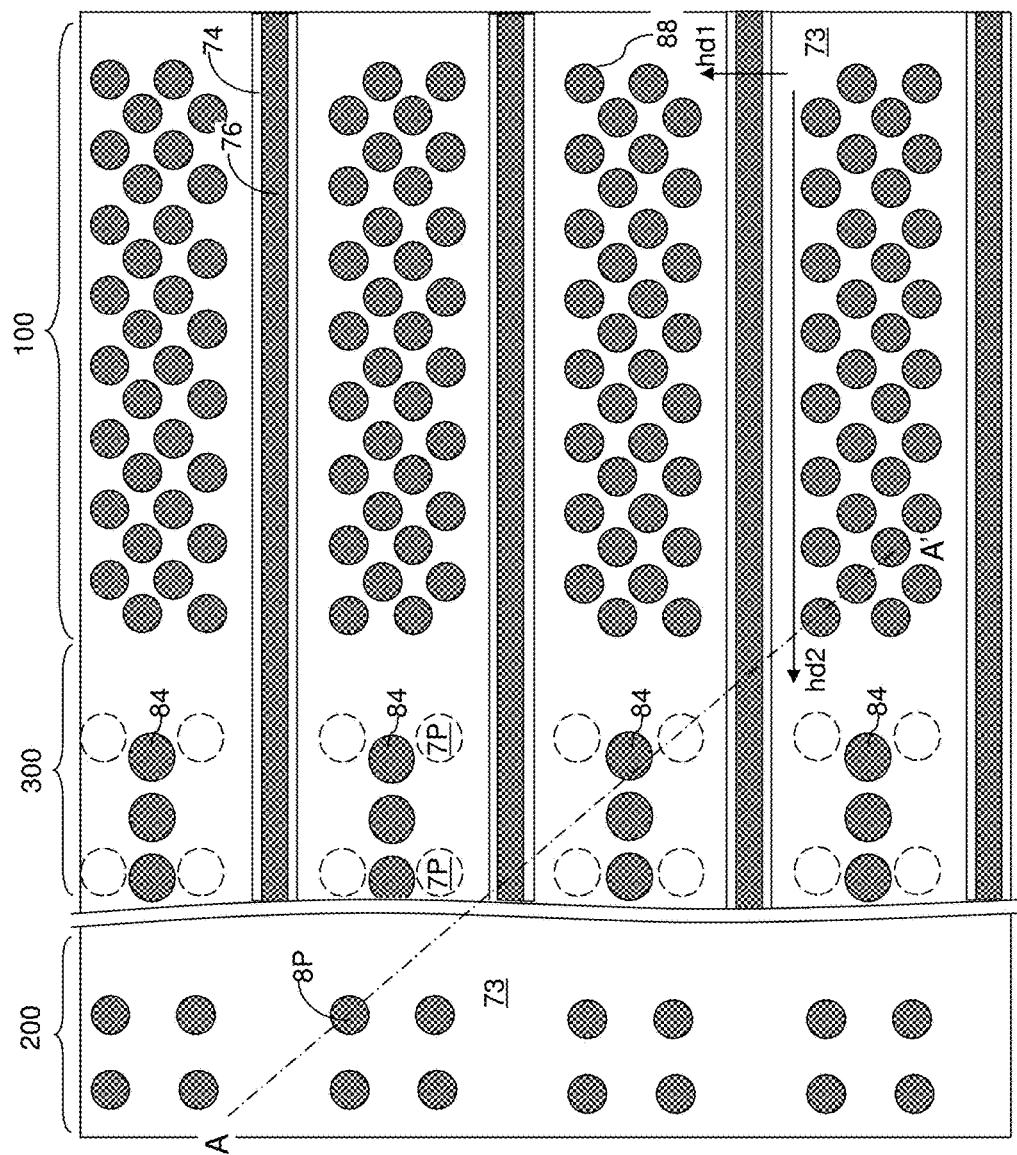
FIG. 25B is a top-down view of the second exemplary structure of FIG. 25A.

Referring to FIGS. 25A and 25B, a photoresist layer (not shown) can be applied over the topmost layer of the second exemplary structure (which can be, for example, the second contact level dielectric layer 73), and is lithographically patterned to form various openings in the device region 100, the peripheral device region 200, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive structure.

In an illustrative example, drain contact via cavities can be formed over each memory stack structure 55 in the device region 100 such that a top surface of a drain region 63 is physically exposed at the bottom of each drain contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices 210 to be contacted by a contact via structure in the peripheral device region.

The various via cavities can be filled with at least one conductive material, which can be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Drain contact via structures 88 can be formed on the respective drain regions 63. Word line contact via structures 84 can be formed on the respective electrically conductive layers 46. Peripheral device contact via structures 8P can be formed on the respective nodes of the peripheral devices 210. Additional metal interconnect structures (not shown) and interlayer dielectric material layers (not) shown can be formed over the second exemplary structure to provide electrical wiring among the various contact via structures.

While the present disclosure is described employing embodiments in which the spacer material layers are formed as sacrificial material layers 42, the spacer material layers may be formed as electrically conductive layers 46. In this case, the processing steps for replacing the sacrificial material layers 42 with the electrically conductive layers 46 are not necessary.

The various embodiments of the second exemplary structure can include a three-dimensional memory device. The three-dimensional device can include an alternating stack of insulating layers 32 and electrically conductive layers 46 located over a substrate 10; a memory opening 49 vertically extending through the alternating stack and comprising lateral protrusions at levels of the electrically conductive layers 46; a blocking dielectric layer 502 contacting a sidewall of the memory opening; metal floating gate structures 54 located inside the blocking dielectric layer 502 within volumes of the lateral protrusions of the memory opening and including a respective convex inner sidewall; a tunneling dielectric layer 506 contacting vertical inner sidewall portions of the blocking dielectric layer 502 and located inside the metal floating gate structures 54; and a vertical semiconductor channel 60 contacting an inner sidewall of the tunneling dielectric layer 506.

In one embodiment, each convex sidewall of the metal floating gate structures 54 can contact a respective concave sidewall of the tunneling dielectric layer 506. In one embodiment, the metal floating gate structures 54 can have respective vertical outer sidewalls that contact inner sidewalls of the blocking dielectric layer 502. In one embodiment, the metal floating gate structures 54 can be annular structures laterally surrounding the tunneling dielectric layer 506 and the vertical semiconductor channel 60. In one embodiment, the blocking dielectric layer 502 can continuously extend from the bottommost layer of the alternating stack (32, 46) to the topmost layer of the alternating stack (32, 46).

In one embodiment, each of the metal floating gate structures 54 can consist essentially of a single metallic element. For example, the metal floating gate structures 54 illustrated in FIG. 15J may consist essentially of cobalt or nickel.

In some embodiments, each of the metal floating gate structures 54 can comprise an outer annular metal portion 541 having a respective vertical outer sidewall and a respective inner convex sidewall, and an inner annular metal portion 542 having a respective outer concave sidewall. In this case, an inner convex sidewall of the inner annular metal portion 542 can constitute the inner convex sidewall of the respective metal floating gate structure 54.

In one embodiment, the monolithic three-dimensional memory structure comprises a monolithic three-dimensional NAND memory device. The first and second electrically conductive layers can comprise, or can be electrically connected to, a respective word line of the monolithic three-dimensional NAND memory device. The substrate 10 can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprises a plurality of semiconductor channels. At least one end portion of each of the plurality of semiconductor channels extends substantially perpendicular to a top surface of the substrate. The array of monolithic three-dimensional NAND strings can comprises a plurality of charge storage elements. Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level. The electrically conductive layers in the stack can be in electrical contact with the plurality of control gate electrode and can extend from the device region to a contact region including the plurality of electrically conductive via connections. The substrate can comprise a silicon substrate containing a driver circuit for the NAND device.

The second exemplary structure can be manufactured without etching any metallic material that is deposited for the metal floating gate structures. Instead, surface diffusion and self-agglomeration of the deposited metallic material are employed to induce formation of the metal floating gate structures in the lateral recesses at each level of the electrically conductive layers, which include word lines of the vertical NAND device. By avoiding an etch process during formation of the metal floating gate structures, collateral damage on the blocking dielectric layer can be avoided, and the processing cost for manufacture of the floating gate electrodes can be reduced.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
    forming an alternating stack of insulating layers and spacer material layers over a substrate;
    forming an opening extending through the alternating stack;
    forming recesses by recessing sidewalls of the spacer material layers with respect to sidewalls of the insulating layers around the opening;
    depositing a continuous metal layer in the recesses and the opening, wherein the continuous metal layer includes an electrically conductive material that exhibits a stronger cohesion than adhesion to an underlying material on which the electrically conductive material is deposited, and wherein a vertically-extending portion of deposited continuous metal layer covers a portion of a sidewall of the opening between a vertically neighboring pair of the recesses;
    separating the continuous metal layer into discrete metal portions by performing an anneal that induces self-agglomeration; and
    forming a tunneling dielectric and a vertical semiconductor channel extending through remaining portions of the alternating stack and over the discrete metal portions.

2. The method of claim 1, wherein:
    the opening comprises a memory opening;
    the discrete metal portions comprise metal floating gate structures;
    forming the tunneling dielectric and the vertical semiconductor channel comprises sequentially forming a tunneling dielectric layer and a vertical semiconductor channel in the memory opening over the metal floating gate structures; and
    the spacer material layers are formed as, or replaced with, electrically conductive layers that function as control gate electrodes.

3. The method of claim 2, further comprising forming a blocking dielectric layer on physically exposed surfaces of the memory opening, wherein the continuous metal layer is deposited on the blocking dielectric layer.

4. The method of claim 3, wherein each of the metal floating gate structures comprises a vertical outer sidewall that contacts a respective vertical sidewall of the blocking dielectric layer.

5. The method of claim 3, wherein:
    the continuous metal layer is deposited as a conformal metal layer having a substantially uniform thickness throughout; and
    the blocking dielectric layer continuously extends from a bottommost layer of the alternating stack to a topmost layer of the alternating stack.

6. The method of claim 1, wherein the continuous metal layer comprises at least one of nickel and cobalt, and wherein the anneal process is performed at an elevated temperature within a range from 600 degrees Celsius to 1,200 degrees Celsius.

7. The method of claim 2, wherein the metal floating gate structures are formed as annular structures.

8. The method of claim 2, wherein each of the metal floating gate structures comprises a convex inner sidewall on which the tunneling dielectric layer is formed.

9. The method of claim 8, wherein each of the metal floating gate structures consist essentially of a single metallic element in the continuous metal layer.

10. The method of claim 8, wherein:
    the discrete metal portions constitute outer annular metal portions consisting essentially of a metallic element within the continuous metal layer; and
    the method further comprises forming inner annular metal portions comprising a different metallic material than the metallic element within the continuous metal layer on inner sidewalls of the outer annular metal portions, wherein each of the metal floating gate structures comprises a pair of an inner annular metal portion and an outer annular metal portion.

11. The method of claim 10, wherein the inner annular metal portions are formed by selective deposition of the different metallic material on surfaces of the outer annular metal portions while suppressing growth from dielectric surfaces.

12. The method of claim 10, wherein the inner annular metal portions are formed by:
    depositing an additional continuous metal layer over the continuous metal layer; and
    annealing the additional continuous metal layer with the continuous metal layer employing the anneal process, wherein the anneal process induces diffusion and agglomeration of the additional continuous metal layer into the inner annular metal portions.

13. The method of claim 10, wherein the outer annular metal portions consist essentially of cobalt, and the inner annular metal portions comprise titanium, tungsten or ruthenium.

14. The method of claim 2, wherein:
    the structure comprises a vertical NAND device located in a device region;
    the electrically conductive layers comprise, or are electrically connected to a respective word line of the vertical NAND device;
    the device region comprises:
        a plurality of semiconductor channels, wherein at least one end portion of each of the plurality of semiconductor channels extends substantially perpendicular to a top surface of the substrate;
        a plurality of charge storage regions, each charge storage region located adjacent to a respective one of the plurality of semiconductor channels; and
        a plurality of control gate electrodes having a strip shape extending substantially parallel to the top surface of the substrate;
    the plurality of control gate electrodes comprise at least a first control gate electrode located in a first device level and a second control gate electrode located in a second device level;
    the electrically conductive layers in the stack are in electrical contact with the plurality of control gate electrode and extend from the device region to a contact region including the plurality of electrically conductive via connections; and
    the substrate comprises a silicon substrate containing a driver circuit for the NAND device.

* * * * *